US006025122A

United States Patent [19]

Sakai et al.

[11] Patent Number: 6,025,122

[45] Date of Patent: Feb. 15, 2000

[54] HEAT-DEVELOPABLE PHOTOGRAPHIC MATERIALS

[75] Inventors: Minoru Sakai; Shigeo Hirano; Katsuyuki Watanabe, all of Kanagawa, Japan

[73] Assignee: Fuji Photo Film Co., Ltd., Kanagawa, Japan

[21] Appl. No.: 09/053,652

[22] Filed: Apr. 2, 1998

[30] Foreign Application Priority Data

| | | | |
|---|---|---|---|
| Apr. 2, 1997 | [JP] | Japan | 9-084221 |
| Jun. 27, 1997 | [JP] | Japan | 9-171750 |
| Jul. 11, 1997 | [JP] | Japan | 9-202410 |

[51] Int. Cl.$^7$ .......... G03C 1/498

[52] U.S. Cl. .......... 430/619; 430/264; 430/611; 430/617

[58] Field of Search .......... 430/619, 611, 430/617, 264

[56] References Cited

U.S. PATENT DOCUMENTS

| | | | |
|---|---|---|---|
| 4,307,187 | 12/1981 | Ikenoue et al. . | |
| 5,558,983 | 9/1996 | Simpson et al. | 430/619 |
| 5,716,775 | 2/1998 | Uehara et al. | 430/611 |

FOREIGN PATENT DOCUMENTS

| | | |
|---|---|---|
| 0654703A1 | 5/1995 | European Pat. Off. . |
| 0807850A1 | 11/1997 | European Pat. Off. . |
| 0608294A | 3/1994 | Japan . |

*Primary Examiner*—Thorl Chea
*Attorney, Agent, or Firm*—Birch, Stewart, Kolasch & Birch, LLP

[57] ABSTRACT

A heat developable photographic material comprising a reducible silver salt, a reducing agent, a contrast enhancer, and a binder further contains a thiosulfonic acid ester compound and/or a thiosulfonic acid compound. The material exhibits ultrahigh contrast and low fog and is minimized in the variation of photographic characteristics with heat development conditions.

13 Claims, No Drawings

HEAT-DEVELOPABLE PHOTOGRAPHIC MATERIALS

This invention relates to heat developable photographic materials. More particularly, while heat developable photographic materials include thermographic photosensitive materials containing silver halide as a photocatalyst and heat-sensitive materials utilizing simple thermal reaction, this invention relates to the thermographic photosensitive (photothermographic, hereinafter) materials, especially ultrahigh contrast photothermographic materials which are improved in thermal development stability in that photographic sensitivity changes and fog due to variations of developing temperature and time during thermal development are minimized, finding an application as printing plates.

BACKGROUND OF THE INVENTION

In the printing field, image forming systems exhibiting photographic characteristics including ultrahigh contrast (especially gamma values of 10 or higher) are available in order to improve the reproduction of continuous tone images or halftone images or the reproduction of line images. From the standpoints of environmental protection and space saving, it is strongly desired to reduce the amount of waste solution. Recent research efforts achieved noticeable reduction of waste solution. In systems using processing solutions of chemicals, it is impossible to eliminate the waste solution. Accordingly, the printing field waits for the practical implement of the thermographic system which is simple and ecologically safe since it eliminates the use of processing solutions of chemicals.

There have been proposed image forming processes using photothermographic materials entailing a developing step by heat treatment. Such materials are disclosed, for example, in JP-B 4924/1968 and 6582/1969, JP-A 6074/1971, 97523/1973, and 2781/1995, and U.S. Pat. No. 5,468,603. These photothermographic materials, however, are not suited for the manufacture of printing plates because of low gamma or soft gradation.

In the printing field, photographic characteristics ensuring ultrahigh contrast are desired as described above. The desired ultrahigh contrast is accomplished using hydrazine derivatives as disclosed in U.S. Pat. No. 5,496,695. Where hydrazine derivatives are used, however, stable images are not obtainable since the sensitivity largely changes due to changes of temperature and time of heat development. An improvement in this regard is desired.

Fog by heat development is also a crucial problem. A number of proposals have been made for reducing the fog of thermographic silver halide photosensitive materials. For example, U.S. Pat. No. 3,589,903 discloses mercury salts. There are also known carboxylic acids such as benzoic acid and phthalic acid from U.S. Pat. No. 4,152,160; benzoylbenzene acid compounds from U.S. Pat. No. 4,784,939; indan and tetralin carboxylic acids from U.S. Pat. No. 4,569,906; dicarboxylic acids from U.S. Pat. No. 4,820,617; heteroaromatic carboxylic acids from U.S. Pat. No. 4,626,500; halogenated compounds from U.S. Pat. Nos. 4,546,075, 4,756,999, 4,452,885, 3,874,946 and 3,955,982; halogen molecules or heterocycles associated with halogen atoms from U.S. Pat. No. 5,028,523; palladium compounds from U.S. Pat. No. 4,103,312 and GB 1,502,670; iron group metals from U.S. Pat. No. 4,128,428; substituted triazoles from U.S. Pat. Nos. 4,123,374, 4,129,557 and 4,125,430; sulfur compounds from U.S. Pat. Nos. 4,213,784, 4,245,033 and JP-A 26019/1976; thiouracils from U.S. Pat. No. 4,002,479; sulfinic acids from JP-A 123331/1975; metal salts of thiosulfonic acid from U.S. Pat. Nos. 4,125,403, 4,152,160 and 4,307,187; combinations of metal salts of thiosulfonic acid with sulfinic acid from JP-A 20923/1978 and 19825/1978; and thiosulfonates from JP-B 50810/1987, JP-A 209797/1995 and 43760/1997. None of these patents describe whether or not these compounds are effective for suppressing changes under different heat development conditions of the sensitivity of ultrahigh contrast photosensitive material systems using ultrahigh contrast enhancers.

For example, U.S. Pat. Nos. 4,125,403, 4,152,160, 4,307,187, and JP-A 20923/1978 and 19825/1978 disclose that thiosulfonic acid salts are used in photothermographic materials for preventing fog during heat development or fog generated during shelf storage. None of these patents describe whether or not these antifoggants are effective for suppressing changes under different heat development conditions of the sensitivity of photothermographic material systems using ultrahigh contrast enhancers. EP 762196A discloses a photothermographic material using a hydrazine derivative as a ultrahigh contrast enhancer and describes in Examples to use a thiosulfonic acid salt as an antifoggant. Since the thiosulfonic acid salt is added in a small amount relative to silver, it is not effective for improving sensitivity changes due to changes of heat development temperature and time.

JP-A 82944/1994 discloses a photographic silver halide material to be developed with a liquid developer, comprising a hydrazine derivative and a metal salt or ester of thiosulfonic acid. It is described that the addition of the thiosulfonic acid salt or ester is effective for improving the stability of photographic characteristics of the photosensitive material during shelf storage. It is described nowhere whether or not the thiosulfonic acid salt or ester is effective in photothermographic systems.

SUMMARY OF THE INVENTION

Therefore, an object of the present invention is to provide a heat developable photographic material, typically ultrahigh contrast photothermographic material, which is improved in thermal development stability in that photographic performance changes and fog due to variations of developing temperature and time during thermal development are minimized and which is suitable for use as printing plates.

The present invention provides a heat developable photographic material comprising a reducible silver salt, a reducing agent, a contrast enhancer, and a binder. The photographic material further contains at least one compound selected from thiosulfonic acid ester compounds of the following general formula (1) and thiosulfonic acid compounds of the following general formula (2). The thiosulfonic acid compound of formula (2) should be contained in an amount of 0.2 mmol to 200 mmol per mol of silver.

$$R^1—S—SO_2—R^2 \qquad (1)$$

Each of $R^1$ and $R^2$ is an aliphatic hydrocarbon group, aryl group, alkoxycarbonyl group, aryloxycarbonyl group or heterocyclic group. Preferably, at least one of $R^1$ and $R^2$ is a heterocyclic group, and more preferably, $R^1$ is a heterocyclic group.

$$Z^1—SO_2SM^1 \qquad (2)$$

$Z^1$ is an aliphatic hydrocarbon group, aryl group or heterocyclic group, and $M^1$ is a cation.

In one preferred embodiment, the heat developable photographic material contains at least one thiosulfonic acid ester compound of the general formula (1).

In another preferred embodiment, the heat developable photographic material contains at least one thiosulfonic acid compound of the general formula (2) in an amount of 0.2 mmol to 200 mmol per mol of silver.

Typically, the heat developable photographic material further contains a photosensitive silver halide as a photocatalyst whereby a ultrahigh contrast photothermographic material is provided.

DETAILED DESCRIPTION OF THE INVENTION

The heat developable photographic material of the invention is preferably a ultrahigh contrast photothermographic material comprising a photosensitive silver halide and a contrast enhancer, suitable for use as printing plates. The heat developable photographic material of the invention is characterized by the inclusion of at least one compound selected from thiosulfonic acid ester compounds of formula (1) and thiosulfonic acid compounds of formula (2). With the compounds of formula (1) or (2) incorporated, the photographic material can produce through heat development ultrahigh contrast images which are stable in that photographic performance changes and fog due to variations of developing temperature and time during thermal development are minimized. In the case of the thiosulfonic acid compound of formula (2), it must be contained in an amount of 0.2 mmol to 200 mmol per mol of silver. Less than 0.2 mmol of the compound of formula (2) is ineffective for restraining fog or enhancing contrast and allows photographic performance to largely change with changes of thermal development conditions.

Formula (1)

First, the compounds of the general formula (1) are described in detail.

$$R^1—S—SO_2—R^2 \quad (1)$$

In formula (1), each of $R^1$ and $R^2$ is an aliphatic hydrocarbon group, an aryl group, an alkoxycarbonyl group, an aryloxycarbonyl group or a heterocyclic group.

The aliphatic hydrocarbon groups represented by $R^1$ and $R^2$ in formula (1) include normal, branched or cyclic alkyl groups preferably having 1 to 20 carbon atoms, more preferably 1 to 16 carbon atoms, most preferably 1 to 12 carbon atoms, alkenyl groups preferably having 2 to 20 carbon atoms, more preferably 2 to 16 carbon atoms, most preferably 2 to 12 carbon atoms, and alkynyl groups preferably having 2 to 20 carbon atoms, more preferably 2 to 16 carbon atoms, most preferably 2 to 12 carbon atoms, while they may have substituents.

Examples of the substituent include aryl groups preferably having 6 to 30 carbon atoms, more preferably 6 to 20 carbon atoms, most preferably 6 to 12 carbon atoms, such as phenyl, p-methylphenyl and naphthyl; amino groups preferably having 0 to 20 carbon atoms, more preferably 0 to 10 carbon atoms, most preferably 0 to 6 carbon atoms, such as amino, methylamino, dimethylamino, diethylamino, and dibenzylamino; alkoxy groups preferably having 1 to 20 carbon atoms, more preferably 1 to 12 carbon atoms, most preferably 1 to 8 carbon atoms, such as methoxy, ethoxy, and butoxy; aryloxy groups preferably having 6 to 20 carbon atoms, more preferably 6 to 16 carbon atoms, most preferably 6 to 12 carbon atoms, such as phenyloxy and 2-naphthyloxy; acyl groups preferably having 1 to 20 carbon atoms, more preferably 1 to 16 carbon atoms, most preferably 1 to 12 carbon atoms, such as acetyl, benzoyl, formyl, and pivaloyl; alkoxycarbonyl groups preferably having 2 to 20 carbon atoms, more preferably 2 to 16 carbon atoms, most preferably 2 to 12 carbon atoms, such as methoxycarbonyl and ethoxycarbonyl; aryloxycarbonyl groups preferably having 7 to 20 carbon atoms, more preferably 7 to 16 carbon atoms, most preferably 7 to 10 carbon atoms, such as phenoxycarbonyl; acyloxy groups preferably having 1 to 20 carbon atoms, more preferably 2 to 16 carbon atoms, most preferably 2 to 10 carbon atoms, such as acetoxy and benzoyloxy; acylamino groups preferably having 1 to 20 carbon atoms, more preferably 2 to 16 carbon atoms, most preferably 2 to 10 carbon atoms, such as acetylamino and benzoylamino; alkoxycarbonylamino groups preferably having 2 to 20 carbon atoms, more preferably 2 to 16 carbon atoms, most preferably 2 to 12 carbon atoms, such as methoxycarbonylamino; aryloxycarbonylamino groups preferably having 7 to 20 carbon atoms, more preferably 7 to 16 carbon atoms, most preferably 7 to 12 carbon atoms, such as phenyloxycarbonylamino; sulfonylamino groups preferably having 1 to 20 carbon atoms, more preferably 1 to 16 carbon atoms, most preferably 1 to 12 carbon atoms, such as methanesulfonylamino and benzenesulfonylamino; sulfamoyl groups preferably having 0 to 20 carbon atoms, more preferably 0 to 16 carbon atoms, most preferably 0 to 12 carbon atoms, such as sulfamoyl, methylsulfamoyl, dimethylsulfamoyl and phenylsulfamoyl; carbamoyl groups preferably having 0 to 20 carbon atoms, more preferably 0 to 16 carbon atoms, most preferably 0 to 12 carbon atoms, such as carbamoyl, dlethylcarbamoyl and phenylcarbamoyl; ureido groups preferably having 1 to 20 carbon atoms, more preferably 1 to 16 carbon atoms, most preferably 1 to 12 carbon atoms, such as ureido, methylureido and phenylureido; alkylthio groups preferably having 1 to 20 carbon atoms, more preferably 1 to 16 carbon atoms, most preferably 1 to 12 carbon atoms, such as methylthio and ethylthio; arylthio groups preferably having 6 to 20 carbon atoms, more preferably 6 to 16 carbon atoms, most preferably 6 to 12 carbon atoms, such as phenylthio; sulfonyl groups preferably having 1 to 20 carbon atoms, more preferably 1 to 16 carbon atoms, most preferably 1 to 12 carbon atoms, such as mesyl and tosyl; sulfinyl groups preferably having 1 to 20 carbon atoms, more preferably 1 to 16 carbon atoms, most preferably 1 to 12 carbon atoms, such as methanesulfinyl and benzenesulfinyl; phosphoramido groups preferably having 1 to 20 carbon atoms, more preferably 1 to 16 carbon atoms, most preferably 1 to 12 carbon atoms, such as diethylphosphoramido and phenylphosphoramido; hydroxy groups, mercapto groups, halogen atoms (e.g., fluorine, chlorine, bromine and iodine atoms), cyano groups, sulfo groups, carboxy groups, nitro groups, hydroxamic groups, sulfino groups, hydrazino groups, sulfonylthio groups, thiosulfonyl groups, and heterocyclic groups (e.g., imidazolyl, pyridyl, furyl, piperidyl and morpholyl). These substituents in turn may have substituents. Where two or more substituents are attached, they may be identical or different.

Preferred examples of the substituents on the aliphatic hydrocarbon groups represented by $R^1$ and $R^2$ are aryl, alkoxy, heterocyclic, cyano, acyl, alkoxycarbonyl, sulfamoyl, carbamoyl, sulfonyl and nitro groups, with the heterocyclic, cyano, acyl, sulfonyl and nitro groups being especially preferred.

Preferred aliphatic hydrocarbon groups represented by $R^1$ and $R^2$ are alkyl groups, more preferably chain alkyl groups.

The aryl groups represented by $R^1$ and $R^2$ in formula (1) are preferably monocyclic or fused ring aryl groups having 6 to 30 carbon atoms, more preferably monocyclic or fused ring aryl groups having 6 to 20 carbon atoms, such as phenyl and naphthyl, especially phenyl. The aryl groups represented by $R^1$ and $R^2$ may have substituents. Examples of the substituents are those described as the substituents on the aliphatic hydrocarbon groups represented by $R^1$ and $R^2$ as well as alkyl groups preferably having 1 to 20 carbon atoms, more preferably 1 to 12 carbon atoms, most preferably 1 to 8 carbon atoms, such as methyl, ethyl, isopropyl, tert-butyl, n-octyl, tert-amyl and cyclohexyl; alkenyl groups preferably having 2 to 20 carbon atoms, more preferably 2 to 12 carbon atoms, most preferably 2 to 8 carbon atoms, such as vinyl, allyl, 2-butenyl and 3-pentenyl; and alkynyl groups preferably having 2 to 20 carbon atoms, more preferably 2 to 12 carbon atoms, most preferably 2 to 8 carbon atoms, such as propargyl and 3-pentynyl.

Preferred examples of the substituents on the aryl groups represented by $R^1$ and $R^2$ are alkyl, aryl, alkoxy, aryloxy, acyl, alkoxycarbonyl, acyloxy, acylamino, alkoxycarbonylamino, aryloxycarbonylamino, sulfonylamino, sulfamoylamino, carbamoylamino, ureido, alkylthio, arylthio, sulfonyl, sulfinyl, sulfonylthio, thiosulfonyl, phosphoramido, halogen, cyano, and heterocyclic groups. More preferred substituents are alkyl, alkoxy, aryloxy, acyl, alkoxycarbonyl, acyloxy, acylamino, alkoxycarbonylamino, aryloxycarbonylamino, sulfonylamino, carbamoyl, ureido, alkylthio, arylthio, sulfonyl, sulfinyl, phosphoramido, and heterocyclic groups. Further preferred substituents are alkyl, alkoxy, aryloxy, acylamino, sulfonylamino, sulfamoyl, carbamoyl, ureido, phosphoramido, and heterocyclic groups. Most preferred substituents are alkyl, alkoxy, aryloxy, acylamino, sulfonylamino, sulfamoyl, carbamoyl, and ureido groups.

The alkoxycarbonyl groups represented by $R^1$ and $R^2$ are preferably those having 2 to 20 carbon atoms, more preferably 2 to 16 carbon atoms, most preferably 2 to 12 carbon atoms, such as methoxycarbonyl and ethoxycarbonyl.

The aryloxycarbonyl groups represented by $R^1$ and $R^2$ are preferably those having 7 to 20 carbon atoms, more preferably 7 to 16 carbon atoms, most preferably 7 to 10 carbon atoms, such as phenyloxycarbonyl.

The heterocyclic groups represented by $R^1$ and $R^2$ are 3- to 10-membered, saturated or unsaturated heterocycles having at least one hetero atom selected from nitrogen, oxygen and sulfur atoms. They may be monocyclic or form a fused ring with another ring. Preferred heterocyclic groups are 5- or 6-membered heterocyclic groups containing nitrogen, more preferably 5- or 6-membered aromatic rings containing 1 to 4 nitrogen atoms.

Examples of the heterocyclic group include thienyl, furyl, pyranyl, 2H-pyrrolyl, pyrrolyl, imidazolyl, pyrazolyl, isothiazolyl, isooxazolyl, thiazolyl, oxazolyl, 1,2,3-triazolyl, 1,2,4-triazolyl, 1,3,4-oxadiazolyl, 1,3,4-thiadiazolyl, pyridyl, pyrazinyl, pyrimidinyl, pyridazinyl, 3H-indolyl, indolyl, 1H-indazolyl, purinyl, 4H-quinolizinyl, isoquinolyl, quinolyl, phthalazinyl, naphthylizinyl, quinoxalinyl, quinazolinyl, cinnolinyl, pteridinyl, carbazolyl, β-carbonylyl, phenanthridinyl, acridinyl, perimidinyl, phenanthrolinyl, phenazinyl, phenarsazinyl, phenothiazinyl, furazanyl, phenoxazinyl, isochromanyl, chromanyl, pyrrolidinyl, pyrrolinyl, imidazolidinyl, imidazolynyl, pyrazolidinyl, pyrazolinyl, piperidyl, piperazinyl, indolinyl, isoindolinyl, quinuclidinyl, morpholinyl, tetrazolyl, benzimidazolyl, benzoxazolyl, benzothiazolyl, benzotriazolyl, triazinyl, uracil, and triazopyrimidinyl.

Preferred examples include pyrrolyl, imidazolyl, pyrazolyl, thiazolyl, oxazolyl, 1,2,3-triazolyl, 1,2,4-triazolyl, 1,3,4-oxadiazolyl, 1,3,4-thiadiazolyl, pyridyl, pyrazinyl, pyrimidinyl, pyridazinyl, indolyl, 1H-indazolyl, purinyl, 4H-quinolizinyl, isoquinolyl, quinolyl, phthalazinyl, naphthylizinyl, quinoxalinyl, quinazolinyl, cinnolinyl, pteridinyl, tetrazolyl, benzimidazolyl, benzoxazolyl, benzothiazolyl, benzotriazolyl, triazinyl, uracil, and triazopyrimidinyl.

More preferred examples include imidazolyl, pyrazolyl, thiazolyl, oxazolyl, 1,2,3-triazolyl, 1,2,4-triazolyl, 1,3,4-oxadiazolyl, 1,3,4-thiadiazolyl, pyridyl, pyrazinyl, pyrimidinyl, pyridazinyl, indolyl, 1H-indazolyl, purinyl, quinolyl, phthalazinyl, naphthylizinyl, quinoxalinyl, quinazolinyl, cinnolinyl, pteridinyl, tetrazolyl, benzimidazolyl, benzoxazolyl, benzothiazolyl, benzotriazolyl, triazinyl, uracil, and triazopyrimidinyl.

Most preferred examples include imidazolyl, thiazolyl, oxazolyl, 1,2,3-triazolyl, 1,2,4-triazolyl, 1,3,4-oxadiazolyl, 1,3,4-thiadiazolyl, pyridyl, quinolyl, tetrazolyl, benzimidazolyl, benzoxazolyl, benzothiazolyl, benzotriazolyl, triazinyl, uracil, and triazopyrimidinyl.

The heterocyclic groups represented by $R^1$ and $R^2$ may have substituents. Examples of the substituents are those described as the substituents on the aliphatic hydrocarbon groups represented by $R^1$ and $R^2$ as well as alkyl groups preferably having 1 to 20 carbon atoms, more preferably 1 to 12 carbon atoms, most preferably 1 to 8 carbon atoms, such as methyl, ethyl, isopropyl, tert-butyl, n-octyl, tert-amyl and cyclohexyl; alkenyl groups preferably having 2 to 20 carbon atoms, more preferably 2 to 12 carbon atoms, most preferably 2 to 8 carbon atoms, such as vinyl, allyl, 2-butenyl and 3-pentenyl; and alkynyl groups preferably having 2 to 20 carbon atoms, more preferably 2 to 12 carbon atoms, most preferably 2 to 8 carbon atoms, such as propargyl and 3-pentynyl.

Preferred examples of the substituents on the heterocyclic groups represented by $R^1$ and $R^2$ are alkyl, aryl, alkoxy, aryloxy, acyl, alkoxycarbonyl, acyloxy, acylamino, sulfonylamino, sulfamoylamino, carbamoyl, ureido, alkylthio, arylthio, sulfonyl, sulfinyl, sulfonylthio, halogen, cyano, nitro, and heterocyclic groups. More preferred substituents are alkyl, aryl, alkoxy, acyl, alkoxycarbonyl, acyloxy, acylamino, sulfonylamino, sulfamoyl, sulfonylthio, carbamoyl, ureido, and heterocyclic groups. Further preferred substituents are alkyl, aryl, alkoxy, acyl, aryloxy, acylamino, sulfonylamino, sulfamoyl, carbamoyl, ureido, phosphoramido, and heterocyclic groups. Most preferred substituents are alkyl, alkoxy, aryloxy, acylamino, sulfonylamino, sulfamoyl, sulfonylthio, carbamoyl, ureido, and heterocyclic groups.

Preferred among the compounds of formula (1) are compounds of the following general formula (1-a).

$$R^{11}—S—SO_2—R^{21} \quad (1\text{-a})$$

In formula (1-a), $R^{11}$ is a heterocyclic group which has the same meaning as the heterocyclic group represented by $R^1$ in formula (1), with the preferred range being the same. $R^{21}$ is an alkyl, aryl or heterocyclic group which has the same meaning as the alkyl, aryl or heterocyclic group represented by $R^2$ in formula (1), with the preferred range being the same.

More preferred among the compounds of formula (1-a) are compounds of the following general formula (1-b).

$$R^{12}—S—SO_2—R^{22} \quad (1\text{-b})$$

In formula (1-b), $R^{22}$ is as defined for $R^{21}$ in formula (1-a), with the preferred range being the same. $R^{12}$ is a heterocyclic group of the following general formula (h).

(h)

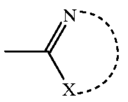

In formula (h), X is a group of atoms necessary to form a 5- or 6-membered heterocyclic ring. This heterocyclic group may be monocyclic or form a fused ring with another ring. And, this heterocyclic group may have a substituent. Exemplary substituents may be the same as the above exemplified substituents on the heterocyclic groups represented by $R^1$ and $R^2$ in formula (1). Preferred heterocyclic groups are, for example, imidazolyl, pyridyl, quinolyl, thiazolyl, oxazolyl, thiadiazolyl, triazolyl, tetrazolyl, benzimidazolyl, benzthiazolyl, and benzoxazolyl groups.

The heterocyclic group represented by $R^{12}$ may have a substituent, examples of which may be the same as the above exemplified substituents on the heterocyclic groups represented by $R^1$ and $R^2$ in formula (1).
Illustrative, non-limiting, examples of the compound of formula (1) are given below.
I-1
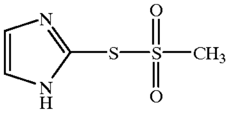
I-2
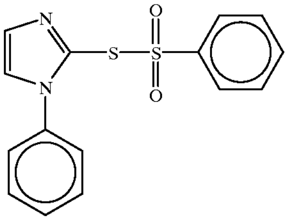
I-3
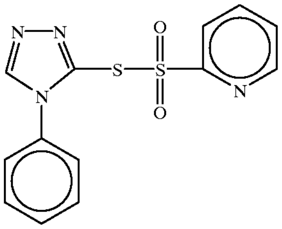
I-4
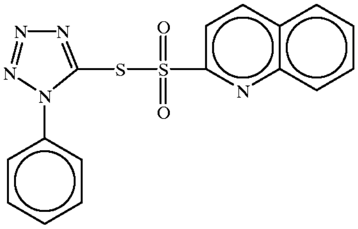
I-5
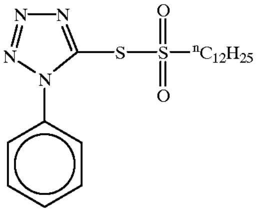
I-6
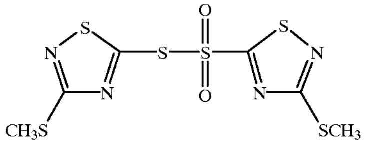
I-7
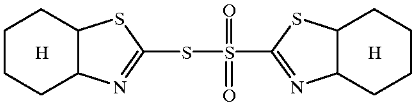
I-8
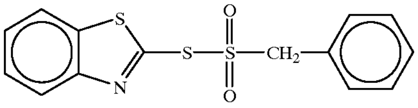
-continued
I-9
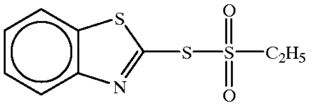
I-10
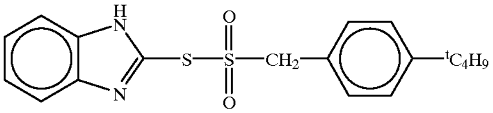
I-11
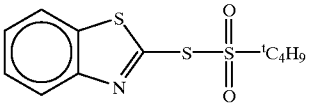
I-12
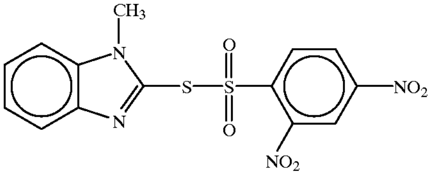
I-13
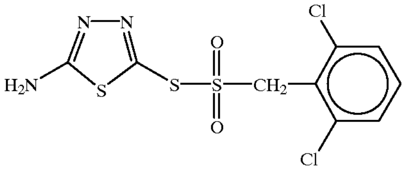
I-14
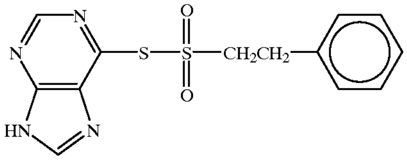
I-15
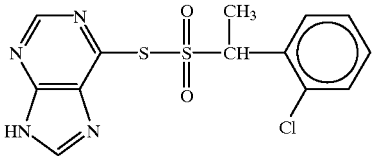
I-16
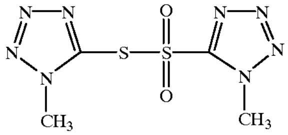
I-17
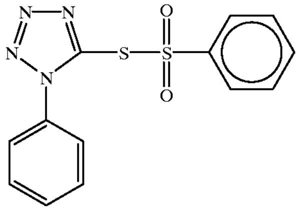
I-18
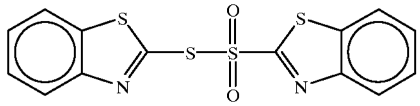

-continued
I-19
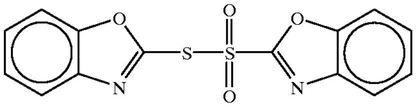
I-20
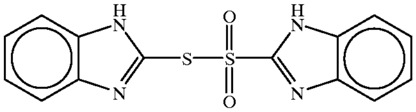
I-21
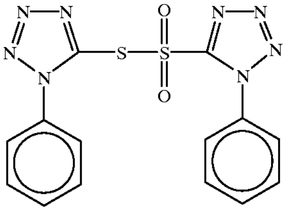
I-22
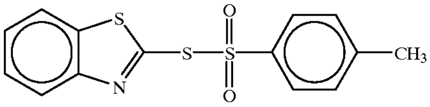
I-23
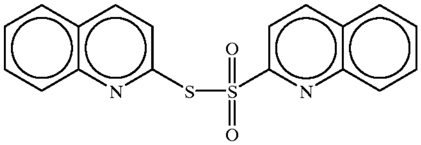
I-24
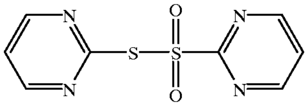
I-25
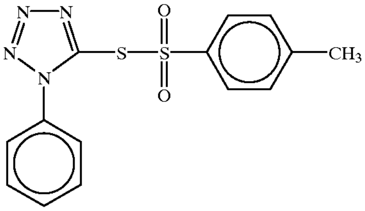
I-26
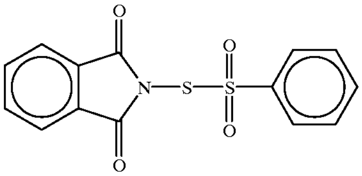
I-27
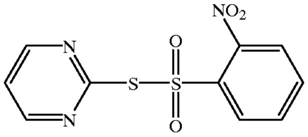
-continued
I-28
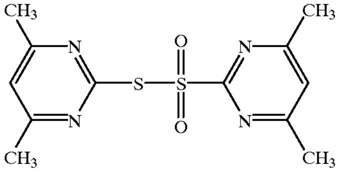
I-29
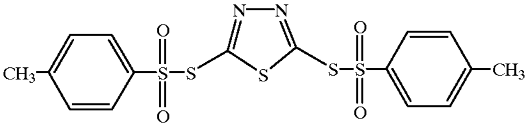
I-30
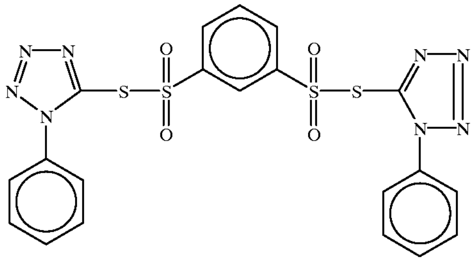
I-31
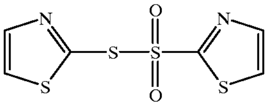
I-32
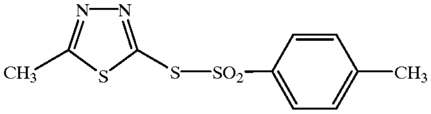
I-33
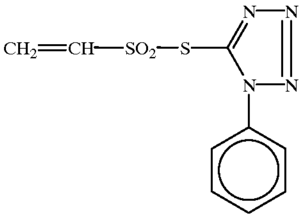
I-34
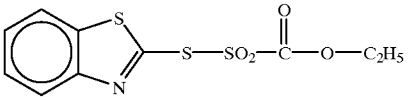
I-35
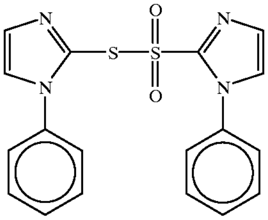
I-36
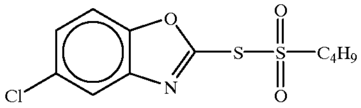

-continued
I-37
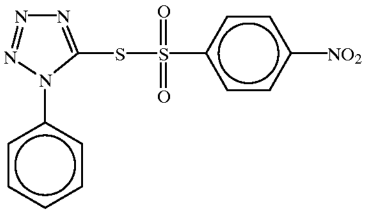
I-38
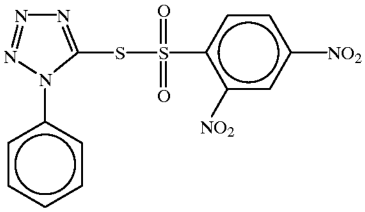
I-39
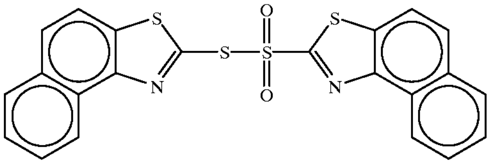
I-40
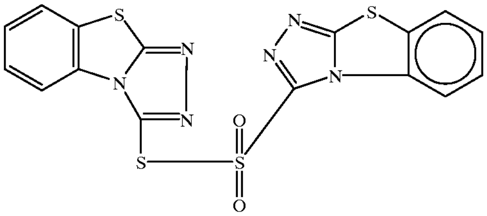
I-41
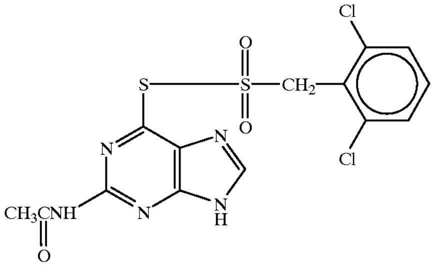
I-42
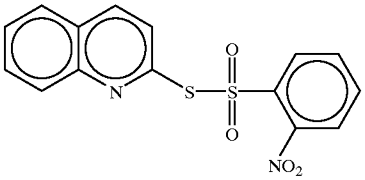
I-43
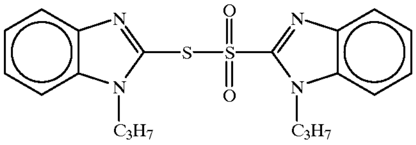
-continued
I-44
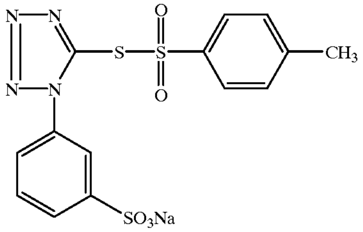
I-45
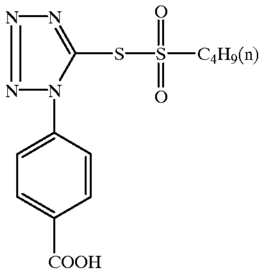
I-46
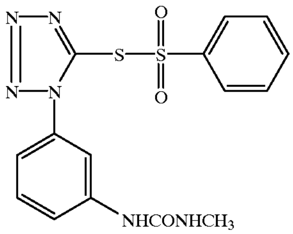
I-47
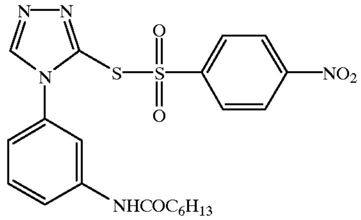
I-48
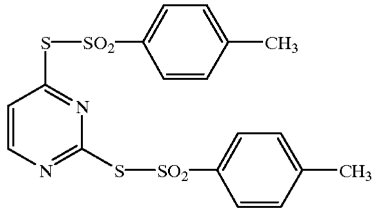
I-49
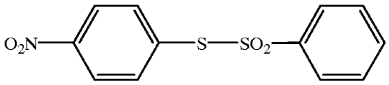
I-50
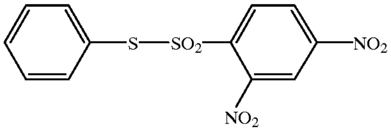
The compounds of formula (1) are commercially available or can be synthesized by various methods complying with the methods described, for example, in "New Experimental Chemistry Series," Vol. 14, pp. 1801–1803, edited by the Japanese Chemical Society, including disproportionation reaction of sulfinic acid, oxidation of disulfide, reaction of sulfonyl halide with thiolate, reaction of disulfide with sulfinic acid salt, and reaction of sulfinic acid salt with sulfenyl halide.

Formula (2)

The compounds of the general formula (2) used herein are described in detail.

$$Z^1\text{—}SO_2SM^1 \quad (2)$$

In formula (2), $Z^1$ is an aliphatic hydrocarbon group, aryl group or heterocyclic group, and $M^1$ is a cation, The aliphatic hydrocarbon groups represented by $Z^1$ in formula (2) include normal, branched or cyclic alkyl groups preferably having 1 to 20 carbon atoms, more preferably 1 to 12 carbon atoms, most preferably 1 to 8 carbon atoms, such as methyl, ethyl, n-propyl, isopropyl, n-butyl, isobutyl, sec-butyl, tert-butyl, n-octyl, isoamyl (or pentyl), tert-amyl, hexyl, dodecyl, octadecyl, and cyclohexyl; alkenyl groups preferably having 2 to 20 carbon atoms, more preferably 2 to 12 carbon atoms, most preferably 2 to 8 carbon atoms, such as vinyl, allyl, 2-butenyl and 3-pentenyl; and alkynyl groups preferably having 2 to 20 carbon atoms, more preferably 2 to 12 carbon atoms, most preferably 2 to 8 carbon atoms, such as propargyl and 3-pentynyl, while they may have substituents.

Examples of the substituent include aryl groups preferably having 6 to 30 carbon atoms, more preferably 6 to 20 carbon atoms, most preferably 6 to 12 carbon atoms, such as phenyl, p-methylphenyl and naphthyl; amino groups preferably having 0 to 20 carbon atoms, more preferably 0 to 10 carbon atoms, most preferably 0 to 6 carbon atoms, such as amino, methylamino, dimethylamino, diethylamino, and dibenzylamino; alkoxy groups preferably having 1 to 20 carbon atoms, more preferably 1 to 12 carbon atoms, most preferably 1 to 8 carbon atoms, such as methoxy, ethoxy, and butoxy; aryloxy groups preferably having 6 to 20 carbon atoms, more preferably 6 to 16 carbon atoms, most preferably 6 to 12 carbon atoms, such as phenyloxy and 2-naphthyloxy; acyl groups preferably having 1 to 20 carbon atoms, more preferably 1 to 16 carbon atoms, most preferably 1 to 12 carbon atoms, such as acetyl, benzoyl, formyl, and pivaloyl; alkoxycarbonyl groups preferably having 2 to 20 carbon atoms, more preferably 2 to 16 carbon atoms, most preferably 2 to 12 carbon atoms, such as methoxycarbonyl and ethoxycarbonyl; aryloxycarbonyl groups preferably having 7 to 20 carbon atoms, more preferably 7 to 16 carbon atoms, most preferably 7 to 10 carbon atoms, such as phenoxycarbonyl; acyloxy groups preferably having 1 to 20 carbon atoms, more preferably 2 to 16 carbon atoms, most preferably 2 to 10 carbon atoms, such as acetoxy and benzoyloxy; acylamino groups preferably having 1 to 20 carbon atoms, more preferably 2 to 16 carbon atoms, most preferably 2 to 10 carbon atoms, such as acetylamino, valerylamino and benzoylamino; alkoxycarbonylamino groups preferably having 2 to 20 carbon atoms, more preferably 2 to 16 carbon atoms, most preferably 2 to 12 carbon atoms, such as methoxycarbonylamino; aryloxycarbonylamino groups preferably having 7 to 20 carbon atoms, more preferably 7 to 16 carbon atoms, most preferably 7 to 12 carbon atoms, such as phenyloxycarbonylamino; sulfonylamino groups preferably having 1 to 20 carbon atoms, more preferably 1 to 16 carbon atoms, most preferably 1 to 12 carbon atoms, such as methanesulfonylamino and benzenesulfonylamino; sulfamoyl groups preferably having 0 to 20 carbon atoms, more preferably 0 to 16 carbon atoms, most preferably 0 to 12 carbon atoms, such as sulfamoyl, methylsulfamoyl, dimethylsulfamoyl and phenylsulfamoyl; carbamoyl groups preferably having 0 to 20 carbon atoms, more preferably 0 to 16 carbon atoms, most preferably 0 to 12 carbon atoms, such as carbamoyl, diethylcarbamoyl and phenylcarbamoyl; ureido groups preferably having 1 to 20 carbon atoms, more preferably 1 to 16 carbon atoms, most preferably 1 to 12 carbon atoms, such as ureido, methylureido and phenylureido; alkylthio groups preferably having 1 to 20 carbon atoms, more preferably 1 to 16 carbon atoms, most preferably 1 to 12 carbon atoms, such as methylthio and ethylthio; arylthio groups preferably having 6 to 20 carbon atoms, more preferably 6 to 16 carbon atoms, most preferably 6 to 12 carbon atoms, such as phenylthio; sulfonyl groups preferably having 1 to 20 carbon atoms, more preferably 1 to 16 carbon atoms, most preferably 1 to 12 carbon atoms, such as mesyl and tosyl; sulfinyl groups preferably having 1 to 20 carbon atoms, more preferably 1 to 16 carbon atoms, most preferably 1 to 12 carbon atoms, such as methanesulfinyl and benzenesulfinyl; phosphoramido groups preferably having 1 to 20 carbon atoms, more preferably 1 to 16 carbon atoms, most preferably 1 to 12 carbon atoms, such as diethylphosphoramido and phenylphosphoramido; hydroxy groups, mercapto groups, halogen atoms (e.g., fluorine, chlorine, bromine and iodine atoms), cyano groups, sulfo groups, carboxy groups, nitro groups, hydroxamic groups, sulfino groups, hydrazino groups, sulfonylthio groups, thiosulfonyl groups, heterocyclic (e.g., imidazolyl, pyridyl, furyl, piperidyl, morpholinyl and morpholino), and disulfide groups. Of these groups, those capable of forming salts may form salts. These substituents in turn may have substituents. Where two or more substituents are attached, they may be identical or different.

Preferred examples of the substituents on the aliphatic hydrocarbon groups represented by $Z^1$ are aryl, alkoxy, heterocyclic, cyano, acyl, alkoxycarbonyl, sulfamoyl, carbamoyl, sulfonyl, nitro, halogen, carboxy and amino groups, with the aryl, heterocyclic, cyano, alkoxy and sulfonyl groups being especially preferred.

Preferred aliphatic hydrocarbon groups represented by $Z^1$ are alkyl-groups, more preferably chain alkyl groups.

The aryl groups represented by $Z^1$ in formula (2) are preferably monocyclic or fused ring aryl groups having 6 to 30 carbon atoms, more preferably monocyclic or fused ring aryl groups having 6 to 20 carbon atoms, such as phenyl and naphthyl, especially phenyl. The aryl groups represented by $Z^1$ may have substituents. Examples of the substituents are those described as the substituents on the aliphatic hydrocarbon groups represented by $Z^1$ as well as alkyl groups preferably having 1 to 20 carbon atoms, more preferably 1 to 12 carbon atoms, most preferably 1 to 8 carbon atoms, such as methyl, ethyl, isopropyl, n-butyl, tert-butyl, n-octyl, tert-amyl and cyclohexyl; alkenyl groups preferably having 2 to 20 carbon atoms, more preferably 2 to 12 carbon atoms, most preferably 2 to 8 carbon atoms, such as vinyl, allyl, 2-butenyl and 3-pentenyl; and alkynyl groups preferably having 2 to 20 carbon atoms, more preferably 2 to 12 carbon atoms, most preferably 2 to 8 carbon atoms, such as propargyl and 3-pentynyl.

Preferred examples of the substituents on the aryl groups represented by $Z^1$ are alkyl, aryl, alkoxy, aryloxy, acyl, alkoxycarbonyl, acyloxy, acylamino, alkoxycarbonylamino, aryloxycarbonylamino, sulfonylamino, sulfamoylamino, carbamoylamino, ureido, alkylthio, arylthio, sulfonyl, sulfinyl, sulfonylthio, thiosulfonyl, phosphoramido, halogen, cyano, carboxy, and heterocyclic groups. More preferred substituents are alkyl, alkoxy, aryloxy, acyl, alkoxycarbonyl, acyloxy, acylamino, alkoxycarbonylamino, aryloxycarbonylamino, sulfonylamino, carbamoyl, ureido, alkylthio, arylthio, sulfonyl, sulfinyl, phosphoramido, and heterocyclic groups. Further preferred substituents are alkyl, alkoxy, aryloxy, acylamino, sulfonylamino, sulfamoyl, carbamoyl, ureido, phosphoramido, carboxy, and heterocyclic groups. Most preferred substituents are alkyl, alkoxy, aryloxy, acylamino, sulfonylamino, sulfamoyl, carbamoyl, ureido, and carboxy groups.

The heterocyclic groups represented by $Z^1$ are 3- to 10-membered saturated or unsaturated heterocycles having at least one hetero atom selected from nitrogen, oxygen and sulfur atoms. They may be monocyclic or form a fused ring with another ring.

Examples of the heterocyclic group include thienyl, furyl, pyranyl, 2H-pyrrolyl, pyrrolyl, imidazolyl, pyrazolyl, isothiazolyl, isooxazolyl, thiazolyl, oxazolyl, 1,2,3-triazolyl, 1,2,4-triazolyl, 1,3,4-oxadiazolyl, 1,3,4-thiadiazolyl, pyridyl, pyrazinyl, pyrimidinyl, pyridazinyl, 3H-indolyl, indolyl, 1H-indazolyl, purinyl, 4H-quinolizinyl, isoquinolyl, quinolyl, phthalazinyl, naphthylizinyl, quinoxalinyl, quinazolinyl, cinnolinyl, pteridinyl, carbazolyl, β-carbonylyl, phenanthridinyl, acridinyl, perimidinyl, phenanthrolinyl, phenazinyl, phenarsazinyl, phenothiazinyl, furazanyl, phenoxazinyl, isochromanyl, chromanyl, pyrrolidinyl, pyrrolinyl, imidazolidinyl, imidazolynyl, pyrazolidinyl, pyrazolinyl, piperidyl, piperazinyl, indolinyl, isoindolinyl, quinuclidinyl, morpholinyl, tetrazolyl, benzimidazolyl, benzoxazolyl, benzothiazolyl, benzotriazolyl, triazinyl, uracil, and triazopyrimidinyl.

Preferred examples include pyrrolyl, imidazolyl, pyrazolyl, thiazolyl, oxazolyl, 1,2,3-triazolyl, 1,2,4-triazolyl, 1,3,4-oxadiazolyl, 1,3,4-thiadiazolyl, pyridyl, pyrazinyl, pyrimidinyl, pyridazinyl, indolyl, 1H-indazolyl, purinyl, 4H-quinolizinyl, isoquinolyl, quinolyl, phthalazinyl, naphthylizinyl, quinoxalinyl, quinazolinyl, cinnolinyl, pteridinyl, tetrazolyl, benzimidazolyl, benzoxazolyl, benzothiazolyl, benzotriazolyl, triazinyl, uracil, and triazopyrimidinyl.

More preferred examples include imidazolyl, pyrazolyl, thiazolyl, oxazolyl, 1,2,3-triazolyl, 1,2,4-triazolyl, 1,3,4-oxadiazolyl, 1,3,4-thiadiazolyl, pyridyl, pyrazinyl, pyrimidinyl, pyridazinyl, indolyl, 1H-indazolyl, purinyl, quinolyl, phthalazinyl, naphthylizinyl, quinoxalinyl, quinazolinyl, cinnolinyl, pteridinyl, tetrazolyl, benzimidazolyl, benzoxazolyl, benzothiazolyl, benzotriazolyl, triazinyl, and triazopyrimidinyl.

The heterocyclic groups represented by $Z^1$ may have substituents. Examples of the substituents are those described as the substituents on the aliphatic hydrocarbon groups represented by $Z^1$ as well as alkyl groups preferably having 1 to 20 carbon atoms, more preferably 1 to 12 carbon atoms, most preferably 1 to 8 carbon atoms, such as methyl, ethyl, isopropyl, tert-butyl, n-octyl, tert-amyl, cyclohexyl; alkenyl groups preferably having 2 to 20 carbon atoms, more preferably 2 to 12 carbon atoms, most preferably 2 to 8 carbon atoms, such as vinyl, allyl, 2-butenyl and 3-pentenyl; and alkynyl groups preferably having 2 to 20 carbon atoms, more preferably 2 to 12 carbon atoms, most preferably 2 to 8 carbon atoms, such as propargyl and 3-pentynyl.

Preferred examples of the substituents on the heterocyclic groups represented by $Z^1$ are alkyl, aryl, alkoxy, aryloxy, acyl, alkoxycarbonyl, acyloxy, acylamino, sulfonylamino, sulfamoylamino, carbamoyl, ureido, phosphoramido, alkylthio, arylthio, sulfonyl, sulfinyl, sulfonylthio, halogen, cyano, nitro, and heterocyclic groups. More preferred substituents are alkyl, aryl, alkoxy, acyl, alkoxycarbonyl, acyloxy, acylamino, sulfonylamino, sulfamoyl, sulfonylthio, carbamoyl, ureido, and heterocyclic groups. Further preferred substituents are alkyl, aryl, alkoxy, acyl, aryloxy, acylamino, sulfonylamino, sulfamoyl, carbamoyl, ureido, phosphoramido, and heterocyclic groups. Most preferred substituents are alkyl, alkoxy, aryloxy, acylamino, sulfonylamino, sulfamoyl, sulfonylthio, carbamoyl, ureido, and heterocyclic groups.

$M^1$ stands for a cation such as a hydrogen ion, alkali metal ion (such as Na or K ion), or substituted or unsubstituted ammonium ion.

Illustrative, non-limiting, examples of the compound of formula (2) are given below.

(T-1)

$CH_3SO_2SNa$ (T-2)

$C_2H_5SO_2SNa$ (T-3)

$HOOC—CH_2—CH_2—SO_2SK$ (T-4)

$(n)C_4H_9SO_2SNa$ (T-5)

$NC—CH_2—CH_2—CH_2—SO_2SNa$ (T-6)

$(n)C_8H_{17}SO_2SNa$ (T-7)

$(n)C_{12}H_{25}SO_2SNa$ (T-7)

$Cl—CH_2—(CH_2)_4—SO_2SK$ (T-7)

$(n)C_{12}H_{25}SO_2SNa$ (T-8)

$Cl—CH_2—(CH_2)_4—SO_2SK$ (T-9)

$(n)C_{18}H_{37}SO_2SNa$ (T-10)

$(n)C_4H_9SO_2SK$ (T-11)

$(n)C_8H_{17}SO_2SK$ (T-12)

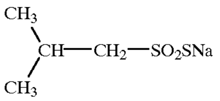

(T-13)

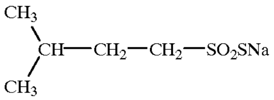

(T-14)

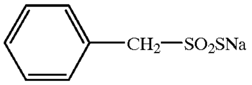

(T-15)

$(n)C_8H_{17}SO_2S^-$ $(n)(C_4H_9)_4N^+$ (T-16)

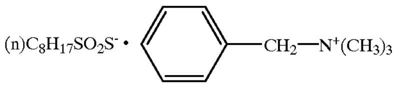

(T-17)

$H_2N—CH_2—CH_2—SO_2SH$ (T-18)

$CH_3O—CH_2—CH_2—SO_2SNa$ (T-19)

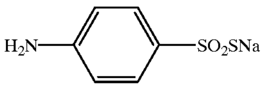

-continued
(T-20)
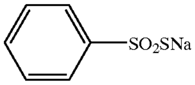
(T-21)
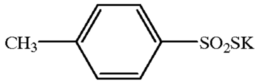
(T-22)
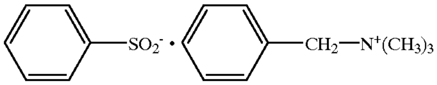
(T-23)
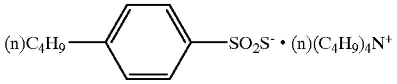
(T-24)
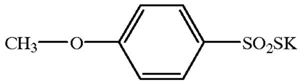
(T-25)
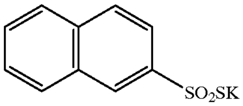
(T-26)
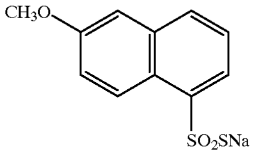
(T-27)
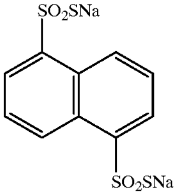
(T-28)
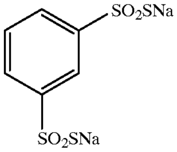
(T-29)
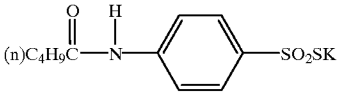
-continued
(T-30)
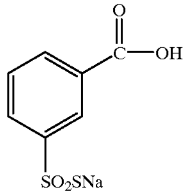
(T-31)
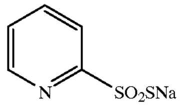
(T-32)
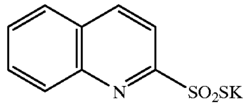
(T-33)
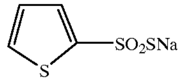
(T-34)
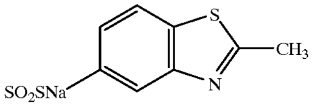
(T-35)
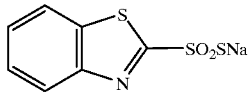
(T-36)
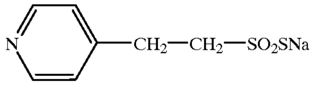
(T-37)
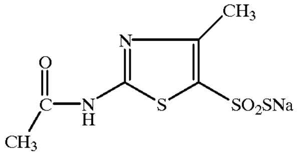
(T-38)
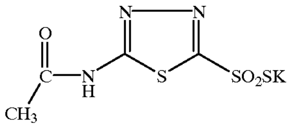
(T-39)
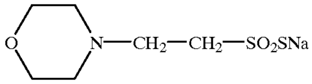
(T-40)
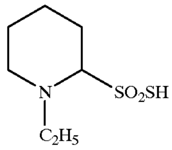

The compounds of formula (2) are commercially available or can be synthesized by well-known methods. For example, they are synthesized by reaction of sulfonyl halides with alkali sulfides or reaction of sulfinic acid salts with sulfur.

The compounds of formula (1) or (2) may be used by dissolving in water or suitable organic solvents, for example, alcohols (e.g., methanol, ethanol, propanol, fluorinated alcohols), ketones (e.g., acetone and methyl ethyl ketone), dimethylformamide, dimethyl sulfoxide and methyl cellosolve.

Also, a well-known emulsifying dispersion method is used for dissolving the compound of formula (1) or (2) with the aid of an oil such as dibutyl phthalate, tricresyl phosphate, glyceryl triacetate or diethyl phthalate or an auxiliary solvent such as ethyl acetate or cyclohexanone whereby an emulsified dispersion is mechanically prepared. Alternatively, a method known as a solid dispersion method is used for dispersing the compound in powder form in water in a ball mill, colloidal mill, sand grinder mill, Manton Gaulin, micro-fluidizer or ultrasonic mixer.

The compounds of formula (1) or (2) may be added to a silver halide emulsion layer (which is an image forming layer) on a support or another layer on the same side as the silver halide emulsion layer, preferably the silver halide emulsion layer or a layer disposed adjacent thereto.

The thiosulfonic acid ester compound of formula (1) is preferably added in an amount of $1\times10^{-5}$ to $5\times10^{-1}$ mol, more preferably $5\times10^{-5}$ to $1\times10^{-1}$ mol, most preferably $1\times10^{-4}$ to $5\times10^{-2}$ mol per mol of silver.

The thiosulfonic acid compound of formula (2) is added in an amount of 0.2 to 200 mmol, preferably 0.3 to 100 mmol, more preferably 0.5 to 30 mmol per mol of silver.

Contrast Enhancer

In the heat developable photographic material of the invention, a ultrahigh contrast enhancer is used so that the material may form ultrahigh contrast images. The ultrahigh contrast enhancers which can be used herein include hydrazine derivatives as described in U.S. Pat. Nos. 5,464,738, 5,496,695, 6,512,411, 5,536,622, Japanese Patent Application Nos. 228627/1995, 215822/1996, 130842/1996, 156378/1996, 148113/1996, 148111/1996, 148116/1996 (the last three correspond to U.S. Ser. No. 08/857,459 filed May 16, 1997); compounds having a quaternary nitrogen atom as described in Japanese Patent Application No. 83566/1996; acrylonitrile compounds as described in U.S. Pat. No. 5,545,515; hetero-substituted acrylonitrile compounds as described in U.S. Pat. No. 5,635,339; malondialdehyde compounds as described in U.S. Pat. No. 5,654,130; and isooxazole compounds as described in U.S. Pat. No. 5,705,324.

Exemplary compounds are 1 to 10 in U.S. Pat. No. 5,464,738; H-1 to H-28 in U.S. Pat. No. 5,496,695; I-1 to I-86 in Japanese Patent Application No. 215822/1996; H-1 to H-62 in Japanese Patent Application No. 130842/1996; I-1 to I-21 in Japanese Patent Application.No. 148113/1996; 1 to 50 in Japanese Patent Application No. 148111/1996; 1 to 40 in Japanese Patent Application No. 148116/1996; P-1 to P-26 and T-1 to T-18 in Japanese Patent Application No. 83566/1996; CN-1 to CN-13 in U.S. Pat. No. 5,545,515; HET-01 and HET-02 in U.S. Pat. No. 5,635,339; MA-01 to MA-07 in U.S. Pat. No. 5,654,130; and IS-01 to IS-04 in U.S. Pat. No. 5,705,324.

The synthesis methods, addition methods and addition amounts of these contrast enhancers are in accord with the descriptions of the above-referenced patents.

For the purpose of providing ultrahigh contrast to the photographic material of the invention, any of the above-described contrast enhancers may be used insofar as it can achieve the purpose. Often hydrazine derivatives are advantageously used.

Any of hydrazine derivatives may be used insofar as it can achieve the purpose. Preferred are hydrazine derivatives of the following general formula (H):

(H)

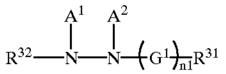

In formula (H), $R^{32}$ is an aliphatic, aromatic or heterocyclic group. $R^{31}$ is a hydrogen atom or a block group. $G^1$ is a group represented by —CO—, —COCO—, —C(=S)—, —$SO_2$—, —SO— or —PO($R^{33}$)— or an iminomethylene group. $R^{33}$ is a group selected from the same range as defined for $R^{31}$ and may be identical with or different from $R^{31}$. $A^1$ and $A^2$ are both hydrogen atoms, or one of $A^1$ and $A^2$ is a hydrogen atom and the other is a substituted or unsubstituted alkylsulfonyl group, substituted or unsubstituted arylsulfonyl group or substituted or unsubstituted acyl group. Letter n1 is equal to 0 or 1. $R^{31}$ is an aliphatic, aromatic or heterocyclic group when n1=0.

In formula (H), the aliphatic groups represented by $R^{32}$ are preferably substituted or unsubstituted, normal, branched or cyclic alkyl, alkenyl and alkynyl groups having 1 to 30 carbon atoms.

In formula (H), the aromatic groups represented by $R^{32}$ are monocyclic or fused-ring aryl groups such as phenyl groups derived from benzene and naphthalene rings. The heterocyclic groups represented by $R^{32}$ are monocyclic or fused-ring, saturated or unsaturated, aromatic or non-aromatic heterocyclic groups. Examples of the heterocycle in these groups include pyridine, pyrimidine, imidazole, pyrazole, quinoline, isoquinoline, benzimidazole, thiazole, benzothiazole, piperidine, triazine, morpholine, and piperazine rings.

Aryl and alkyl groups are the most preferred groups of $R^{32}$.

The groups represented by $R^{32}$ may have substituents. Exemplary substituents include halogen atoms (e.g., fluorine, chlorine, bromine and iodine atoms), alkyl groups (inclusive of aralkyl, cycloalkyl and active methine groups), alkenyl groups, alkynyl groups, aryl groups, heterocyclic groups, heterocyclic groups containing a quaternized nitrogen atom (e.g., pyridinio), acyl groups, alkoxycarbonyl groups, aryloxycarbonyl groups, carbamoyl groups, carboxy groups or salts thereof, sulfonylcarbamoyl groups, acylcarbamoyl groups, sulfamoylcarbamoyl groups, carbazolyl groups, oxalyl groups, oxamoyl groups, cyano groups, thiocarbamoyl groups, hydroxy groups, alkoxy groups (inclusive of groups containing recurring ethylenoxy or propylenoxy units), aryloxy groups, heterocyclic oxy groups, acyloxy groups, (alkoxy or aryloxy)carbonyloxy groups, carbamoyloxy groups, sulfonyloxy groups, amino groups, (alkyl, aryl or heterocyclic) amino groups, N-substituted nitrogenous heterocyclic groups, acylamino groups, sulfonamide groups, ureido groups, thioureido groups, imide groups, (alkoxy or aryloxy)carbonylamino groups, sulfamoylamino groups, semicarbazide groups, thiosemicarbazide groups, hydrazino groups, quaternary ammonio groups, oxamoylamino groups, (alkyl or aryl) sulfonylureido groups, acylureido groups, acylsulfamoylamino groups, nitro groups, mercapto groups, (alkyl, aryl or heterocyclic) thio groups, (alkyl or aryl)sulfonyl groups, (alkyl or aryl)sulfinyl groups, sulfo groups or salts thereof, sulfamoyl groups, acylsulfamoyl groups, sulfonylsulfamoyl groups or salts thereof, and groups containing a phosphoramido or phosphate ester structure. These substituents in turn may be further substituted with such a substituent.

Where $R^{32}$ is an aromatic or heterocyclic group, preferred substituents that $R^{32}$ may have include alkyl (inclusive of active methylene), aralkyl, heterocyclic, substituted amino, acylamino, sulfonamide, ureido, sulfamoylamino, imide, thioureido, phosphoramide, hydroxy, alkoxy, aryloxy, acyloxy, acyl, alkoxycarbonyl, aryloxycarbonyl, carbamoyl, carboxy (inclusive of salts thereof), (alkyl, aryl or heterocyclic) thio, sulfo (inclusive of salts thereof), sulfamoyl, halogen, cyano, and nitro groups.

Where $R^{32}$ is an aliphatic group, preferred substituents include alkyl, aryl, heterocyclic, amino, acylamino, sulfonamide, ureido, sulfamoylamino, imide, thioureido, phosphoramide, hydroxy, alkoxy, aryloxy, acyloxy, acyl, alkoxycarbonyl, aryloxycarbonyl, carbamoyl, carboxy (inclusive of salts thereof), (alkyl, aryl or heterocyclic) thio, sulfo (inclusive of salts thereof), sulfamoyl, halogen, cyano, and nitro groups.

In formula (H), $R^{31}$ is hydrogen or a block group. Examples of the block group include aliphatic groups (e.g., alkyl, alkenyl and alkynyl groups), aromatic groups (monocyclic or fused ring aryl groups), heterocyclic groups, alkoxy, aryloxy, amino and hydrazino groups.

The alkyl groups represented by $R^{31}$ are preferably substituted or unsubstituted alkyl groups having 1 to 10 carbon atoms, for example, methyl, ethyl, trifluoromethyl, difluoromethyl, 2-carboxytetrafluoroethyl, pyridiniomethyl, difluoromethoxymethyl, difluorocarboxymethyl, 3-hydroxypropyl, 3-methanesulfonamidopropyl, phenylsulfonylmethyl, o-hydroxybenzyl, methoxymethyl, phenoxymethyl, 4-ethylphenoxymethyl, phenylthiomethyl, t-butyl, dicyanomethyl, diphenylmethyl, triphenylmethyl, methoxycarbonyldiphenylmethyl, cyanodiphenylmethyl, and methylthiodiphenylmethyl groups. The alkenyl groups are preferably those having 1 to 10 carbon atoms, for example, vinyl, 2-ethoxycarbonylvinyl, and 2-trifluoro-2-methoxycarbonylvinyl groups. The alkynyl groups are preferably those having 1 to 10 carbon atoms, for example, ethynyl and 2-methoxycarbonylethynyl groups. The aryl groups are preferably monocyclic or fused ring aryl groups, especially those containing a benzene ring, for example, phenyl, perfluorophenyl, 3,5-dichlorophenyl, 2-methanesulfonamidophenyl, 2-carbamoylphenyl, 4,5-dicyanophenyl, 2-hydroxymethylphenyl, 2,6-dichloro-4-cyanophenyl, and 2-chloro-5-octylsulfamoylphenyl groups.

The heterocyclic groups represented by $R^{31}$ are preferably 5- and 6-membered, saturated or unsaturated, monocyclic or fused ring, heterocyclic groups containing at least one hetero atom selected from nitrogen, oxygen and sulfur atoms, for example, morpholino, piperidino (N-substituted), imidazolyl, indazolyl (e.g., 4-nitroindazolyl), pyrazolyl, triazolyl, benzimidazolyl, tetrazolyl, pyridyl, pyridinio (e.g., N-methyl-3-pyridinio), quinolinio and quinolyl groups.

The alkoxy groups are preferably those having 1 to 8 carbon atoms, for example, methoxy, 2-hydroxyethoxy, benzyloxy, and t-butoxy groups. The aryloxy groups are preferably substituted or unsubstituted phenoxy groups. The amino groups are preferably unsubstituted amino, alkylamino having 1 to 10 carbon atoms, arylamino, and saturated or unsaturated heterocyclic amino groups (inclusive of nitrogenous heterocyclic amino groups containing a quaternized nitrogen atom). Examples of the amino group include 2,2,6,6-tetramethylpiperidin-4-ylamino, propylamino, 2-hydroxyethylamino, anilino, o-hydroxyanilino, 5-benzotriazolylamino, and N-benzyl-3-pyridinioamino groups. The hydrazino groups are preferably substituted or unsubstituted hydrazino groups and substituted or unsubstituted phenylhydrazino groups (e.g., 4-benzenesulfonamidophenylhydrazino).

The groups represented by $R^{31}$ may be substituted ones, with examples of the substituent being as exemplified for the substituent on $R^{32}$.

In formula (H), $R^{31}$ may be such a group as to induce cyclization reaction to cleave a $G^1$—$R^{31}$ moiety from the remaining molecule to generate a cyclic structure containing the atoms of the —$G^1$—$R^{31}$ moiety. Such examples are described in JP-A 29751/1988, for example.

The hydrazine derivative of formula (H) may have incorporated therein a group capable of adsorbing to silver halide. Such adsorptive groups include alkylthio, arylthio, thiourea, thioamide, mercapto heterocyclic and triazole groups as described in U.S. Pat. Nos. 4,385,108 and 4,459,347, JP-A 195233/1984, 200231/1984, 201045/1984, 201046/1984, 201047/1984, 201048/1984, 201049/1984, 170733/1986, 270744/1986, 948/1987, 234244/1988, 234245/1988, and 234246/1988. These adsorptive groups to silver halide may take the form of precursors. Such precursors are exemplified by the groups described in JP-A 285344/1990.

$R^{31}$ and $R^{32}$ in formula (H) may have incorporated therein a ballast group or polymer commonly used in immobile photographic additives such as couplers. The ballast group is a group having at least 8 carbon atoms and relatively inert with respect to photographic properties. It may be selected from, for example, alkyl, aralkyl, alkoxy, phenyl, alkylphenyl, phenoxy, and alkylphenoxy groups. The polymer is exemplified in JP-A 100530/1989, for example.

$R^{31}$ or $R^{32}$ in formula (H) may have a plurality of hydrazino groups as substituents. In this case, the compounds of formula (H) are polymeric with respect to hydrazino group. Exemplary polymeric compounds are described in JP-A 86134/1989, 16938/1992, 197091/1993, WO 95-32452 and 95-32453, Japanese Patent Application Nos. 351132/1995, 351269/1995, 351168/1995, 351287/1995, and 351279/1995.

$R^{31}$ or $R^{32}$ in formula (H) may contain a cationic group (e.g., a group containing a quaternary ammonio group and a nitrogenous heterocyclic group containing a quaternized nitrogen atom), a group containing recurring ethylenoxy or propylenoxy units, an (alkyl, aryl or heterocyclic) thio group, or a group which is dissociable with a base (e.g., carboxy, sulfo, acylsulfamoyl, and carbamoylsulfamoyl). Exemplary compounds containing such a group are described in, for example, in JP-A 234471/1995, 333466/1993, 19032/1994, 19031/1994, 45761/1993, 259240/1991, 5610/1995, and 244348/1995, U.S. Pat. Nos. 4,994,365 and 4,988,604, and German Patent No. 4006032.

In formula (H), each of $A^1$ and $A^2$ is a hydrogen atom, a substituted or unsubstituted alkyl- or arylsulfonyl group having up to 20 carbon atoms (preferably a phenylsulfonyl group or a phenylsulfonyl group substituted such that the sum of Hammette's substituent constants may be −0.5 or more), or a substituted or unsubstituted acyl group having up to 20 carbon atoms (preferably a benzoyl group, a benzoyl group substituted such that the sum of Hammette's substituent constants may be −0.5 or more, or a linear, branched or cyclic, substituted or unsubstituted, aliphatic acyl group wherein the substituent is selected from a halogen atom, ether group, sulfonamide group, carbonamide group, hydroxyl group, carboxy group and sulfo group). Most preferably, both $A^1$ and $A^2$ are hydrogen atoms.

Described below are the hydrazine derivatives which are especially preferably in the practice of the invention.

$R^{32}$ is preferably a phenyl group or a substituted alkyl group of 1 to 3 carbon atoms.

Where $R^{32}$ is a phenyl group, it may have a substituent, preferred examples of which include nitro, alkoxy, alkyl, acylamino, ureido, sulfonamide, thioureido, carbamoyl, sulfamoyl, carboxy (or salt), sulfo (or salt), and alkoxycarbonyl groups and chlorine atoms.

Where $R^{32}$ is a substituted phenyl group, it is preferred that the substituent have at least one further substituent attached thereto directly or through a linkage. Such a further substituent is selected from a ballast group, adsorptive group to silver halide, group containing a quaternary ammonio group, nitrogenous heterocyclic group containing a quaternary nitrogen atom, group containing recurring ethylenoxy units, (alkyl, aryl or heterocyclic) thio group, nitro group, alkoxy group, acylamino group, sulfonamide group, dissociable group (e.g., carboxy, sulfo, acylsulfamoyl or carbamoylsulfamoyl), and hydrazino group (represented by —NHNH—$G^1$—$R^{31}$) capable of forming a polymer.

Where $R^{32}$ is a substituted alkyl group of 1 to 3 carbon atoms, it is more preferably a substituted methyl group, further preferably a di- or tri-substituted methyl group. Examples of the substituent include methyl groups, phenyl groups, cyano groups, (alkyl, aryl or heterocyclic) thio groups, alkoxy groups, aryloxy groups, chlorine atoms, heterocyclic groups, alkoxycarbonyl groups, aryloxycarbonyl groups, carbamoyl groups, sulfamoyl groups, amino groups, acylamino groups, and sulfonamide groups, with substituted or unsubstituted phenyl groups being especially preferred.

Preferred illustrative examples of the substituted methyl group represented by $R^{32}$ include t-butyl, dicyanomethyl, dicyanophenylmethyl, triphenylmethyl (or trityl), diphenylmethyl, methoxycarbonyldiphenylmethyl, cyanodiphenylmethyl, methylthiodiphenylmethyl, cyclopropyldiphenylmethyl groups, with the trityl group being most preferred.

In formula (H), $R^{32}$ is most preferably a substituted phenyl group.

In formula (H), n1 is equal to 0 or 1. When n1=0, $R^{31}$ is an aliphatic, aromatic or heterocyclic group. When n1=0, $R^{31}$ is more preferably a phenyl group or a substituted alkyl group of 1 to 3 carbon atoms, which fall in the same range as the above-described range of $R^{32}$. It is preferred that n1 be equal to 1.

Where $R^{32}$ is a phenyl group and $G^1$ is —CO—, the group represented by $R^{31}$ is preferably selected from hydrogen atoms, alkyl groups, alkenyl groups, alkynyl groups, aryl groups and heterocyclic groups, more preferably from hydrogen atoms, alkyl groups and aryl groups, most preferably from hydrogen atoms and alkyl groups. The alkyl group represented by $R^{31}$ may have a substituent which is preferably selected from halogen atoms, alkoxy groups, aryloxy groups, alkylthio groups, arylthio groups and carboxy groups.

Where $R^{32}$ is a substituted methyl group and $G^1$ is —CO—, the group represented by $R^{31}$ is preferably selected from hydrogen atoms, alkyl groups, aryl groups, heterocyclic groups, alkoxy groups, amino groups (e.g., unsubstituted amino, alkylamino, arylamino and heterocyclic amino), more preferably from hydrogen, alkyl, aryl, heterocyclic, alkoxy, alkylamino, arylamino and heterocyclic amino groups.

Where $G^1$ is —COCO—, $R^{31}$ is preferably selected, independent of the identity of $R^{32}$, from alkoxy, aryloxy and amino groups, more preferably from substituted amino groups, such as alkylamino, arylamino and saturated or unsaturated heterocyclic amino groups.

Where $G^1$ is —$SO_2$—, $R^{31}$ is preferably selected, independent of the identity of $R^{32}$, from alkyl, aryl and substituted amino groups.

In formula (H), $G^1$ is preferably —CO— or —COCO—, especially —CO—.

Illustrative, non-limiting, examples of the compound of formula (H) are given below.

TABLE 1

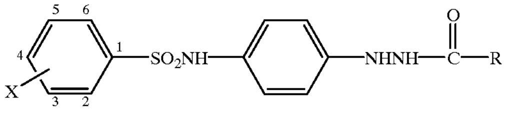

| | | R= | | | |
|---|---|---|---|---|---|
| | X= | —H | —$C_2F_4$—COOH (or —$C_2F_4$—$COO^{\ominus}K^{\oplus}$) | 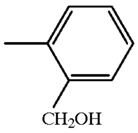 | 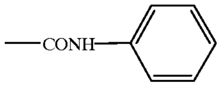 |
| 1 | 3-NHCO—$C_9H_{19}$(n) | 1a | 1b | 1c | 1d |
| 2 | 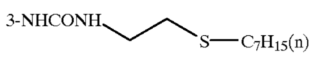 | 2a | 2c | 2d | 2d |
| 3 | 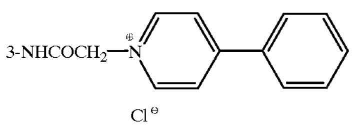 | 3a | 3b | 3c | 3d |
| 4 | 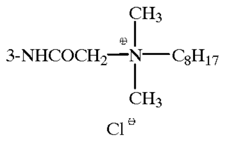 | 41 | 4b | 4c | 4d |

TABLE 1-continued
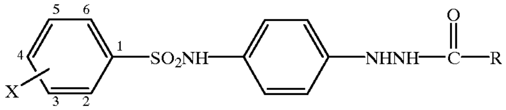
| | X= | R= —H | $-C_2F_4-COOH$ (or $-C_2F_4-COO^{\ominus}K^{\oplus}$) | 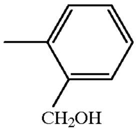 | 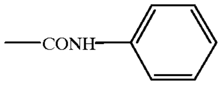 |
|---|---|---|---|---|---|
| 5 | 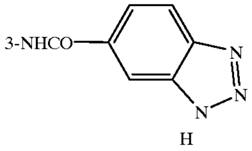 | 5a | 5b | 5c | 5d |
| 6 | 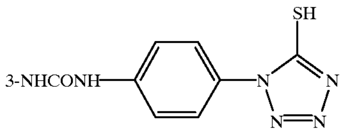 | 6a | 6b | 6c | 6d |
| 7 | $2,4-(CH_3)_2-3-SC_2H_4-(OC_2H_4)_4-OC_8H_{17}$ | 7a | 7b | 7c | 7d |
TABLE 2
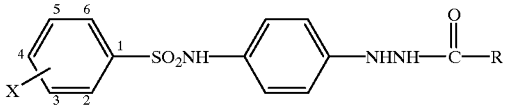
| | X= | R= —H | $-CF_2H$ | 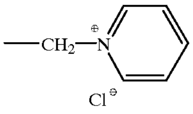 | 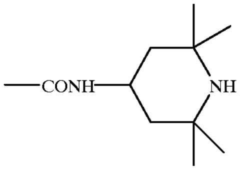 |
|---|---|---|---|---|---|
| 8 | 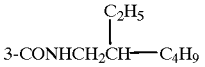 | 8a | 8e | 8f | 8g |
| 9 | $6-OCH_3-3-C_5H_{11}(t)$ | 9a | 9e | 9f | 9g |
| 10 | 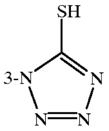 | 10a | 10e | 10f | 10g |

TABLE 2-continued
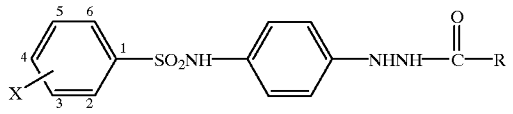
| | R= | | | |
|---|---|---|---|---|
| X= | —H | $—CF_2H$ | 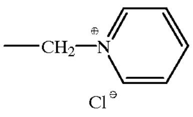 | 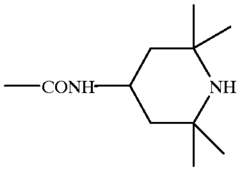 |
| 11 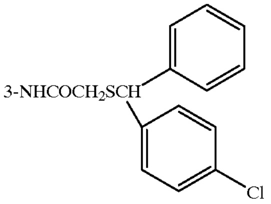 | 11a | 11e | 11f | 11g |
| 12 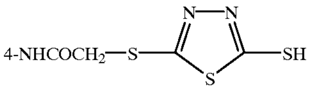 | 12a | 12e | 12f | 12g |
| 13 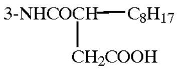 | 13a | 13e | 13f | 13g |
| 14 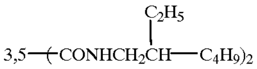 | 14a | 14e | 14f | 14g |
TABLE 3
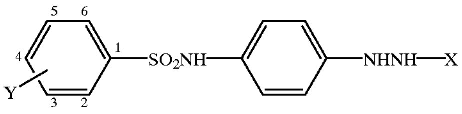
| | X= | | | |
|---|---|---|---|---|
| Y= | —CHO | $—COCF_3$ | $—SO_2CH_3$ | 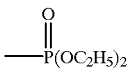 |
| 15 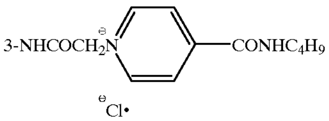 | 15a | 15h | 15i | 15j |

TABLE 3-continued
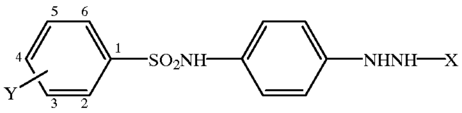
| Y= | X= —CHO | —COCF$_3$ | —SO$_2$CH$_3$ | 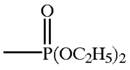 |
|---|---|---|---|---|
| 16 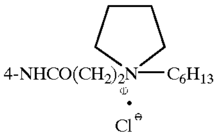 | 16a | 16h | 16i | 16j |
| 17 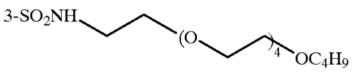 | 17a | 17h | 17i | 17j |
| 18 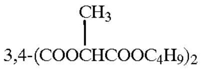 | 18a | 18h | 18i | 18j |
| 19 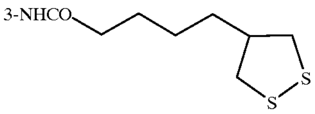 | 19a | 19h | 19i | 19j |
| 20 3-NHSO$_2$NH—C$_8$H$_{17}$ | 20a | 20h | 20i | 20j |
| 21 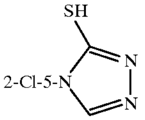 | 21a | 21h | 21i | 21j |
TABLE 4
| | R= —H | —CF$_3$ |
|---|---|---|
| 22 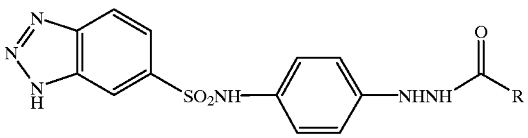 | 22a | 22h |

TABLE 4-continued
| | | | |
|---|---|---|---|
| 23 | 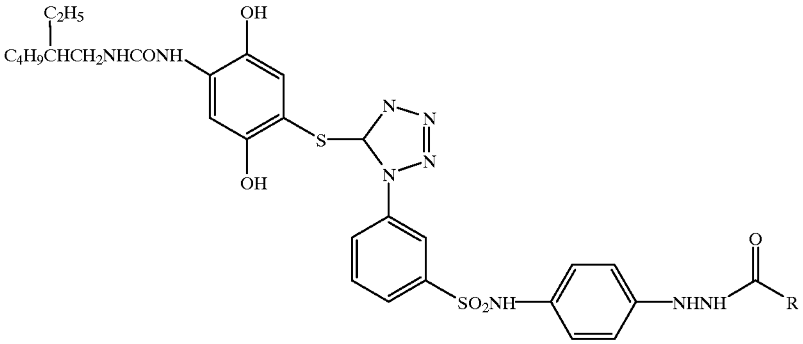 | 23a | 23h |
| 24 | 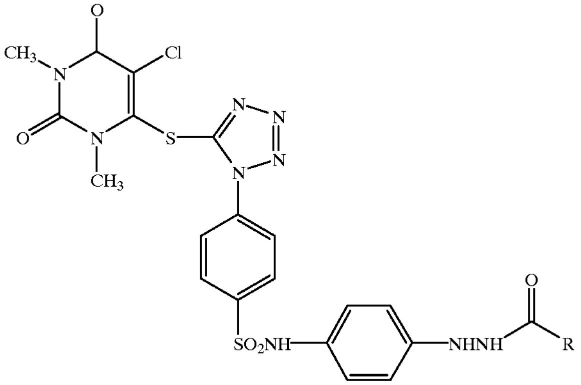 | 24a | 24h |
| 25 | 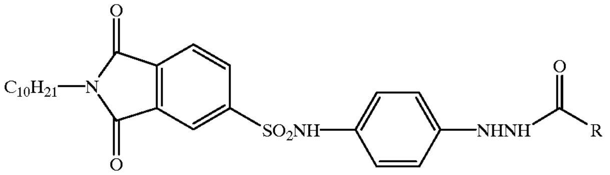 | 25a | 25h |
| 26 | 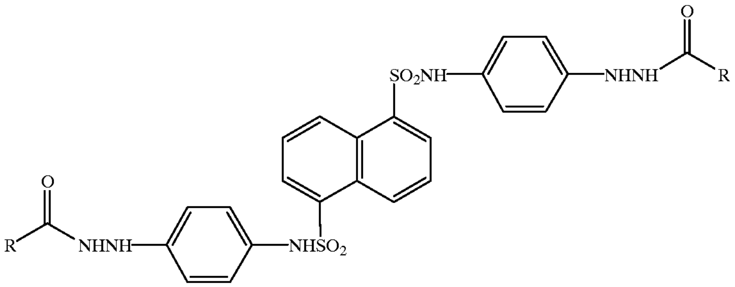 | 26a | 26h |
| 27 | 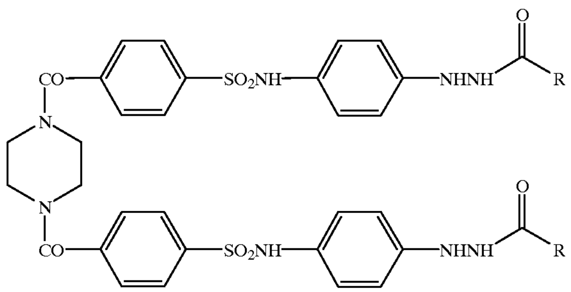 | 27a | 27h |

TABLE 4-continued
| | | | |
|---|---|---|---|
| 28 | 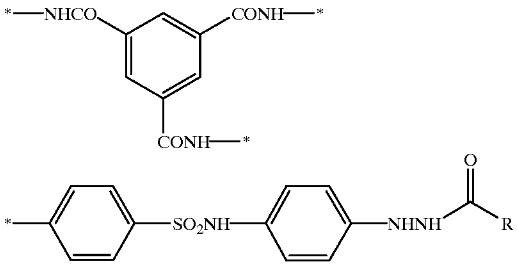 | 28a | 28h |
| | R= | |
|---|---|---|
| | 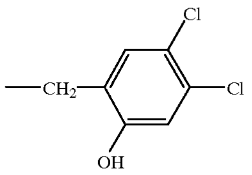 | 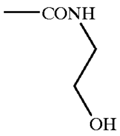 |
| 22 | 22k | 22l |
| 23 | 23k | 23l |
| 24 | 24k | 24l |
| 25 | 25k | 25l |
| 26 | 26k | 26l |
| 27 | 27k | 27l |
| 28 | 28k | 28l |
TABLE 5
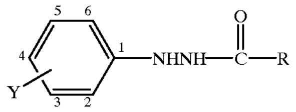
| | Y= | R= | | | |
|---|---|---|---|---|---|
| | | —H | $—CH_2OCH_3$ | 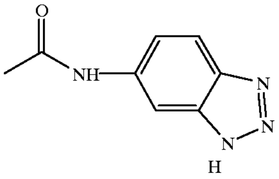 | 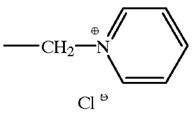 |
| 29 | 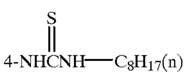 | 29a | 29m | 29n | 29f |
| 30 | 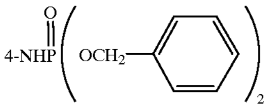 | 30a | 30m | 30n | 30f |
| 31 | 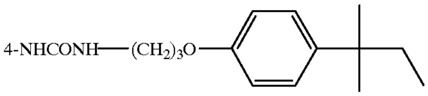 | 31a | 31m | 31n | 31f |

TABLE 5-continued
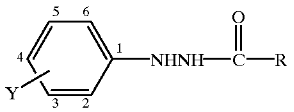
| | Y= | R= —H | —$CH_2OCH_3$ | 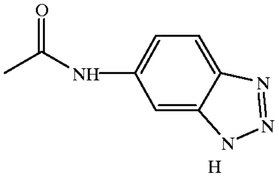 | 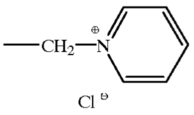 |
|---|---|---|---|---|---|
| 32 | 4-OH<br>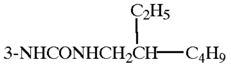 | 32a | 32m | 32n | 32f |
| 33 | 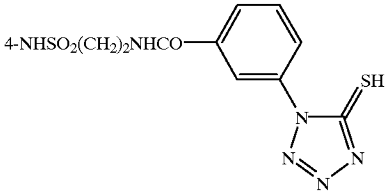 | 33a | 33m | 33n | 33f |
| 34 | 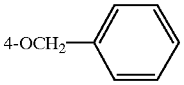 | 34a | 34m | 34n | 34f |
| 35 | 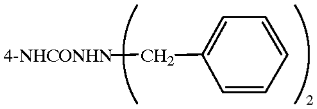 | 35a | 35m | 35n | 35f |
TABLE 6
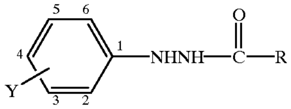
| | Y= | R= —H | —$CF_2SCH_3$ | —$CONHCH_3$ | 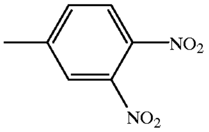 |
|---|---|---|---|---|---|
| 36 | 2-$NHSO_2CH_3$<br>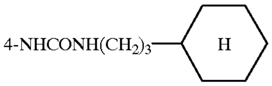 | 36a | 36o | 36p | 36q |
| 37 | 2-$OCH_3$<br>4-$NHSO_2C_{12}H_{25}$ | 37a | 37o | 37p | 37q |
| 38 | 3-$NHCOC_{11}H_{23}$ | 38a | 39o | 38p | 38q |

TABLE 6-continued
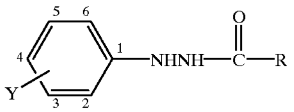
| | | R= | | | |
|---|---|---|---|---|---|
| | Y= | —H | $—CF_2SCH_3$ | $—CONHCH_3$ | 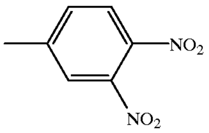 |
| | $4\text{-}NHSO_2CF_3$ | | | | |
| 39 | 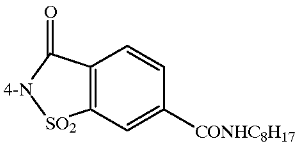 | 39a | 39o | 39p | 39q |
| 40 | $4\text{-}OCO(CH_2)_2COOC_6H_{13}$ | 40a | 40o | 40p | 40q |
| 41 | 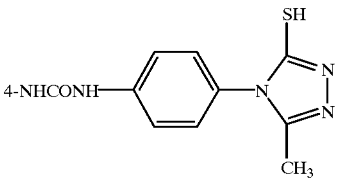 | 41a | 41o | 41p | 41q |
| 42 | 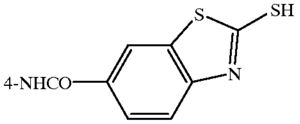 | 42a | 42o | 42p | 42q |
TABLE 7
| | |
|---|---|
| 43 | 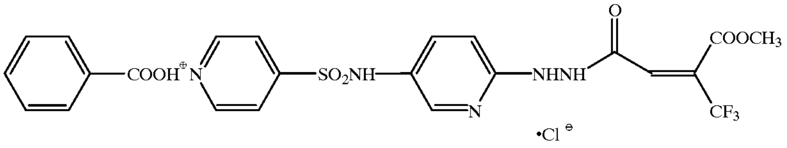 |
| 44 | 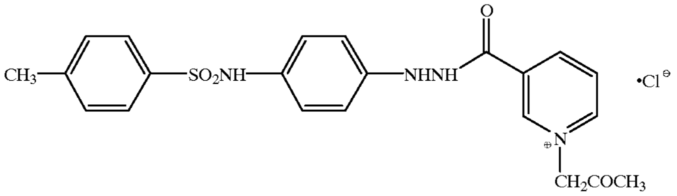 |
| 45 | 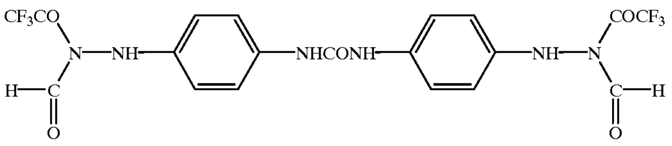 |

TABLE 7-continued
46
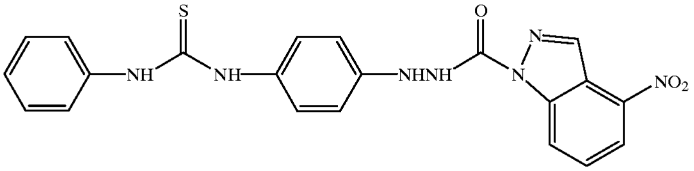
47
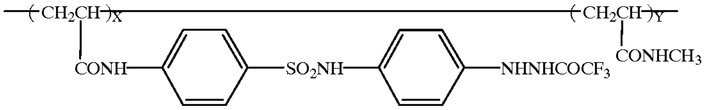
X:Y = 3:97
average molecule weight ≈100,000
48
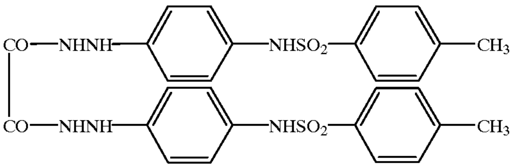
49
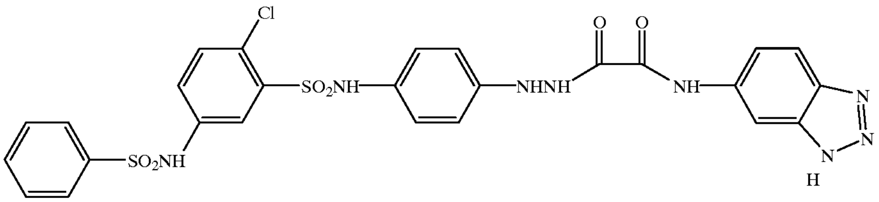
50
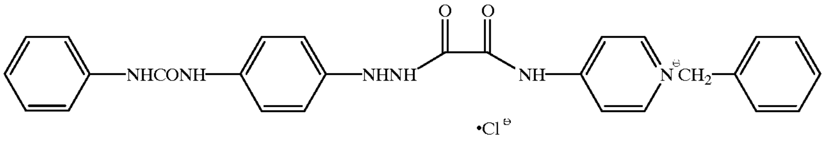
TABLE 8
51
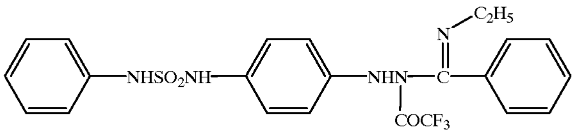
52
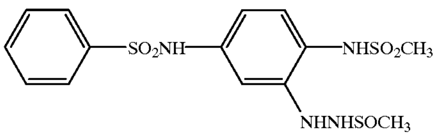
53
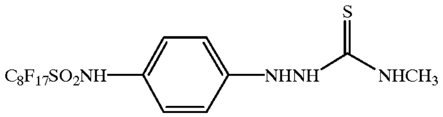

TABLE 9
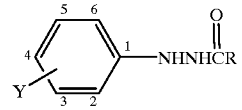
| | R= | | | |
|---|---|---|---|---|
| Y= | —H | $—CH_2OCH_3$ | 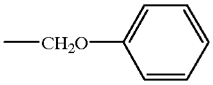 | $—CONHC_3H_7$ |
| 54 2-$OCH_3$ | 54a | 54m | 54r | 54s |
| 55 2-$OCH_3$<br>5-$C_8H_{17}$(t) | 55a | 55m | 55r | 55s |
| 56 4-$NO_2$ | 56a | 56m | 56r | 56s |
| 57 4-$CH_3$ | 57a | 57m | 57r | 57s |
| 58 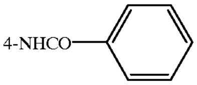 | 58a | 58m | 58r | 58s |
| 59 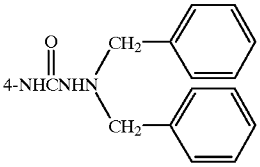 | 59a | 59m | 59r | 59s |
TABLE 10
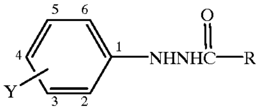
| | R= | | | |
|---|---|---|---|---|
| Y= | —H | 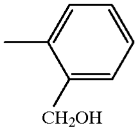 | 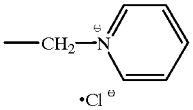 | 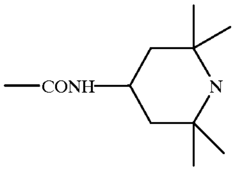 |
| 60 2-$OCH_3$<br>5-$OCH_3$ | 60a | 60c | 60f | 60g |
| 61 4-$C_8H_{17}$(t) | 61a | 61c | 61f | 61g |
| 62 2-$OC_2H_5$ | — | 62c | 62f | 62g |
| 63 3-$NO_2$ | 63a | 63c | 63f | 63g |
| 64 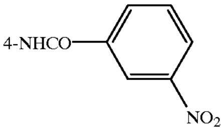 | 64a | 64c | 64f | 64g |

TABLE 10-continued
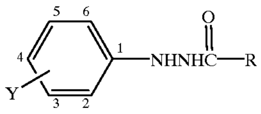
| | | R= | | | |
|---|---|---|---|---|---|
| | Y= | —H | 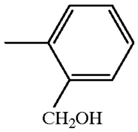 | 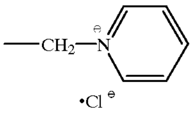 | 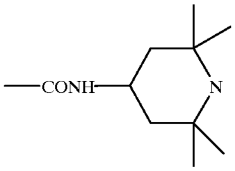 |
| 65 | 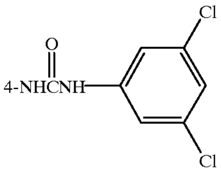 | 65a | 65c | 65f | 65g |
TABLE 11
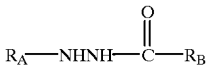
| | | $R_B$= | | | |
|---|---|---|---|---|---|
| | $R_A$= | —H | 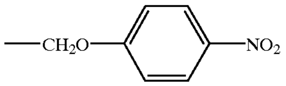 | 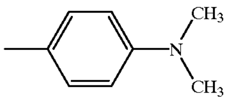 | 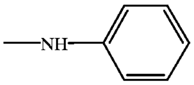 |
| 66 | 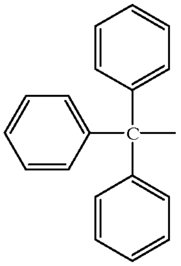 | 66a | 66u | 66v | 66t |

TABLE 11-continued
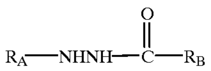
| | $R_B$= | | | |
|---|---|---|---|---|
| $R_A$= | —H | 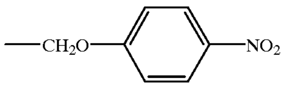 | 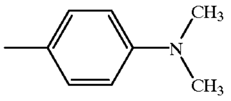 | 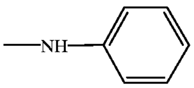 |
| 67 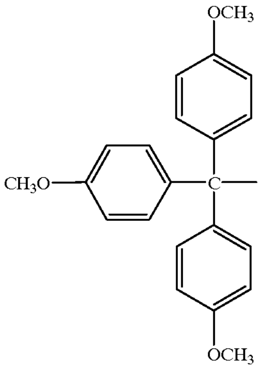 | 67a | 67u | 67v | 67t |
| 68 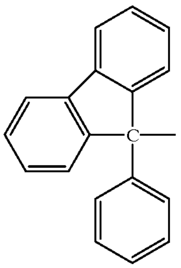 | 68a | 68u | 68v | 68t |
| 69 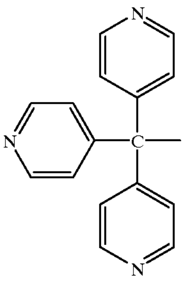 | 69a | 69u | 69v | 69t |
| 70 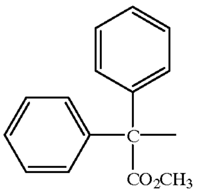 | 70a | 70u | 70v | 70t |

TABLE 11-continued
| | | 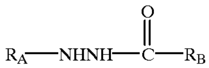 | | | |
|---|---|---|---|---|---|
| | | $R_B$= | | | |
| $R_A$= | | —H | 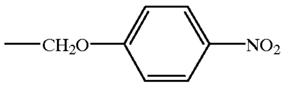 | 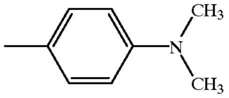 | 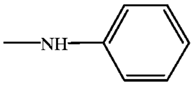 |
| 71 | 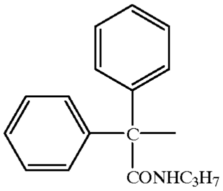 | 71a | 71u | 71v | 71t |
TABLE 12
| | | 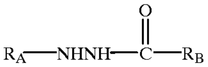 | | | |
|---|---|---|---|---|---|
| | | $R_B$= | | | |
| $R_A$= | | 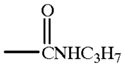 | 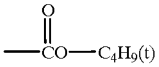 | $—OC_4H_9(t)$ | 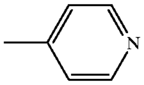 |
| 72 | 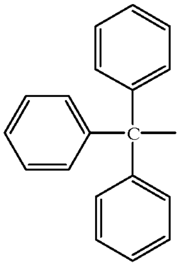 | 72s | 72x | 72y | 72w |
| 73 | 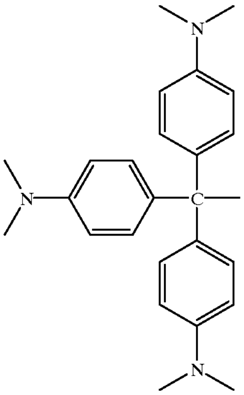 | 73s | 73x | 73y | 73w |

TABLE 12-continued
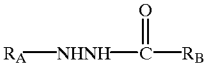
| $R_A$= | $R_B$= 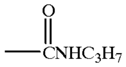 | 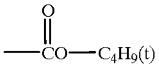 | —$OC_4H_9$(t) | 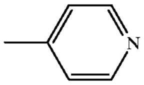 |
|---|---|---|---|---|
| 74 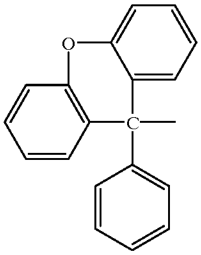 | 74s | 74x | 74y | 74w |
| 75 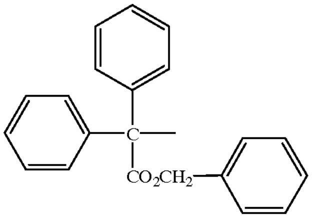 | 75s | 75x | 75y | 75w |
| 76 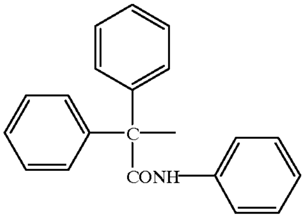 | 76s | 76x | 76y | 76w |
TABLE 13
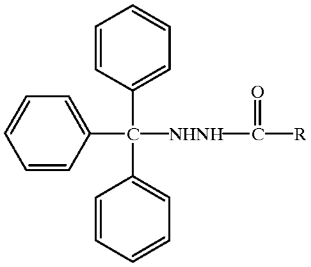
| R= |
|---|
| 77 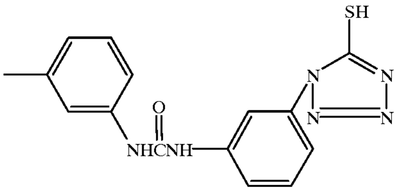 |
TABLE 13-continued
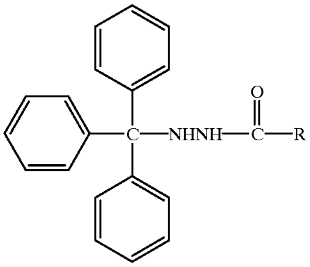
| | R= |
|---|---|
| 78 | 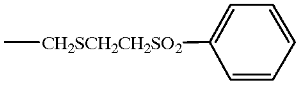 |
| 79 | —$CH_2OCH_2CH_2SCH_2CH_2OCH_3$ |
| 80 | —$CF_2CF_2COOH$ |

TABLE 13-continued
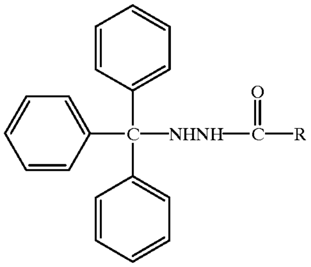
R=
81 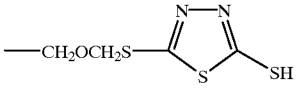
82 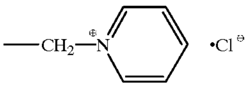
TABLE 14
83 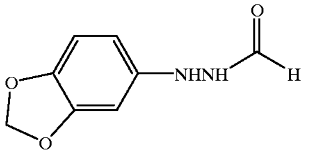
TABLE 14-continued
84 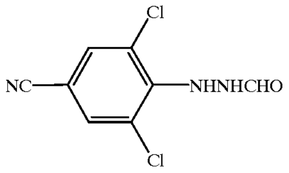
85 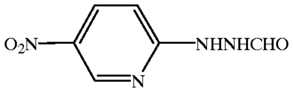
86 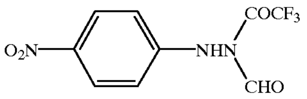
87 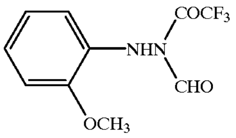
88 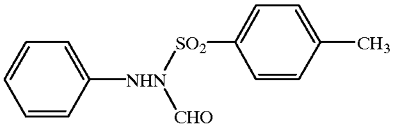
TABLE 15
89 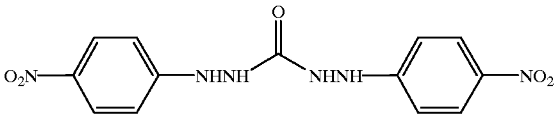
90 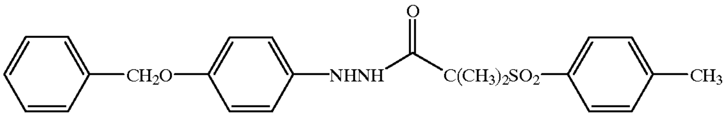
91 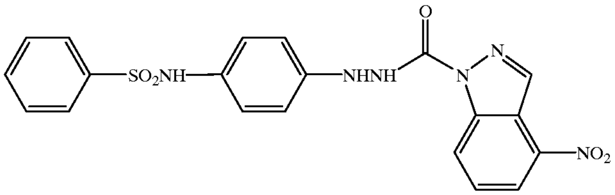

TABLE 15-continued
| | |
|---|---|
| 92 | 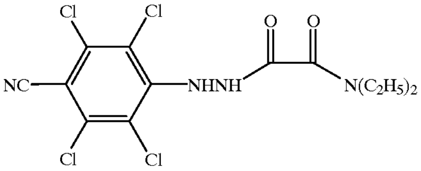 |
| 93 | 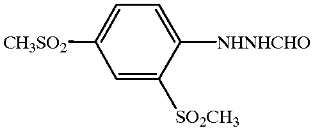 |
| 94 | 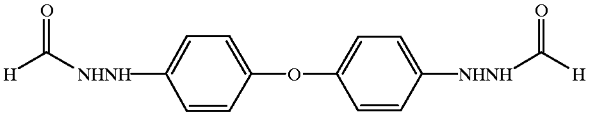 |
TABLE 16
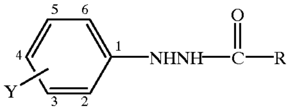
| | Y= | R= | |
|---|---|---|---|
| | | 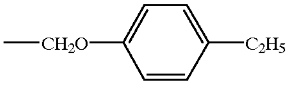 | 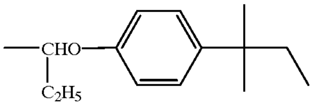 |
| 95 | 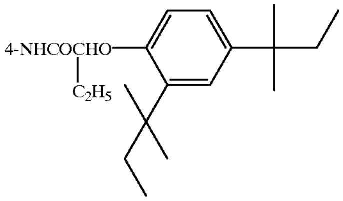 | 95-1 | 95-2 |
| 96 | 4-COOH | 96-1 | 96-2 |
| 97 | 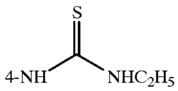 | 97-1 | 97-2 |
| 98 | 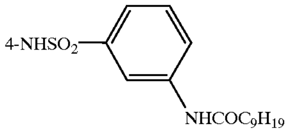 | 98-1 | 98-2 |

TABLE 16-continued
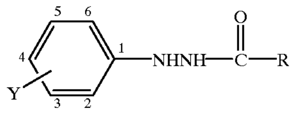
| | | | |
|---|---|---|---|
| 99 | 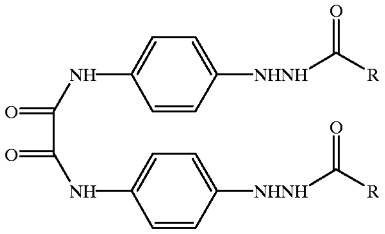 | 99-1 | 99-2 |
| 100 |  | 100-1 | 100-2 |
| | | R= | |
|---|---|---|---|
| | | 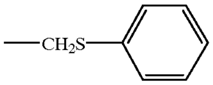 | —$CH_2$—Cl |
| 95 | 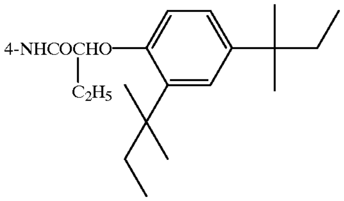 | 95-3 | 95-4 |
| 96 | 4-COOH | 96-3 | 96-4 |
| 97 | 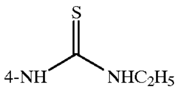 | 97-3 | 97-4 |
| 98 | 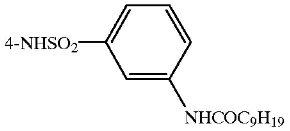 | 98-3 | 98-4 |
| 99 | 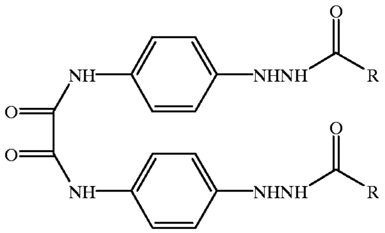 | 99-3 | 99-4 |
| 100 |  | 100-3 | 100-4 |

TABLE 17
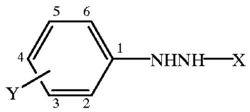
| | Y= | X= | |
|---|---|---|---|
| | | 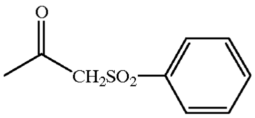 | 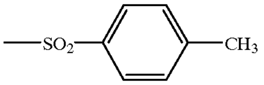 |
| 101 | 4-$NO_2$ | 101-5 | 101-6 |
| 102 | 2,4-$OCH_3$ | 102-5 | 102-6 |
| 103 | 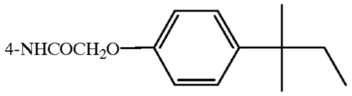 | 103-5 | 103-6 |
| | Y= | X= | |
|---|---|---|---|
| | | 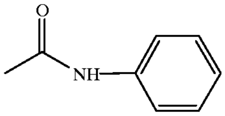 | 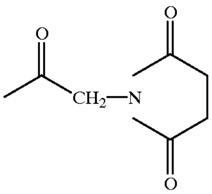 |
| 104 | 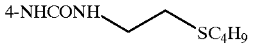 | 104-8 | 104-9 |
| 105 | 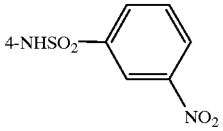 | 105-8 | 105-9 |
| | Y= | X= | |
|---|---|---|---|
| | | 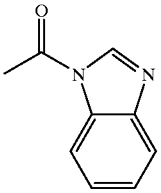 | 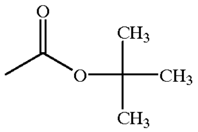 |
| 101 | 4-$NO_2$ | 101-7 | 101y |
| 102 | 2,4-$OCH_3$ | 102-7 | 102y |
| 103 | 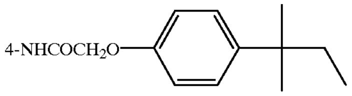 | 103-7 | 103y |
| | X= |
|---|---|

TABLE 17-continued
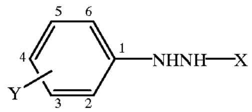
| Y= | | 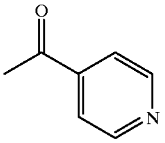 | 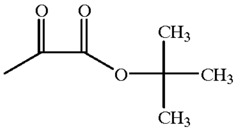 |
|---|---|---|---|
| 104 | 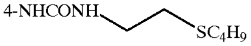 | 104w[I] | 104x |
| 105 | 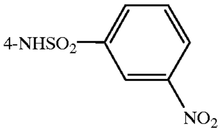 | 105w[I] | 105x |
TABLE 18
Y—NH NH—X
| | Y = | X = 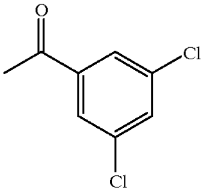 | 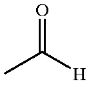 | 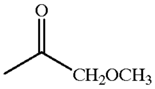 | 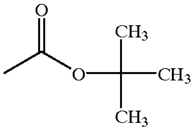 |
|---|---|---|---|---|---|
| 106 | 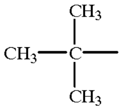 | 106–10 | 106a | 106m | 106y |
| 107 | 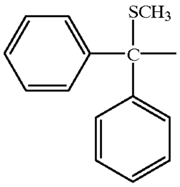 | 107–10 | 107a | 107m | 107y |

TABLE 18-continued
Y—NH NH—X
| | | X = | | | |
|---|---|---|---|---|---|
| | Y = | 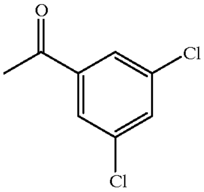 | 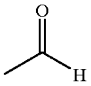 | 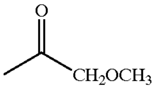 | 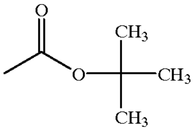 |
| 108 | 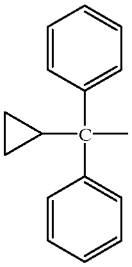 | 108–10 | 108a | 108m | 108y |
| 109 | 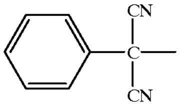 | 109–10 | 109a | 109m | 109y |
| 110 | 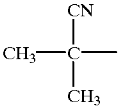 | 110–10 | 110a | 110m | 110y |
| 111 | 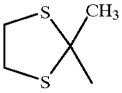 | 111–10 | 111a | 111m | 111y |

TABLE 19
Y—NH NH—X
| | | X = | | | |
|---|---|---|---|---|---|
| | Y = | 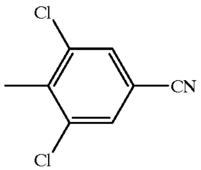 | 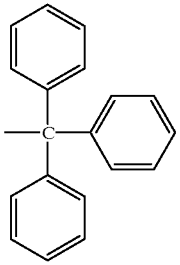 | 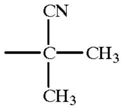 | 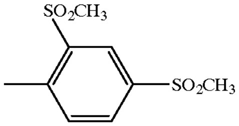 |
| 112 | 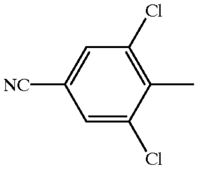 | 112–11 | 112–12 | 112–13 | 112–14 |
| 113 | 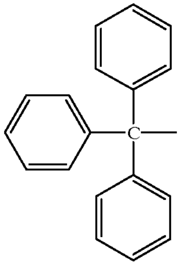 | 113–11 | 113–12 | 113–13 | 113–14 |
| 114 | 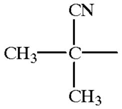 | 114–11 | 114–12 | 114–13 | 114–14 |

TABLE 19-continued
Y—NH NH—X
| | | | | | |
|---|---|---|---|---|---|
| | | X = | | | |
| | Y = | 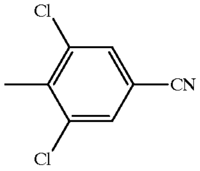 | 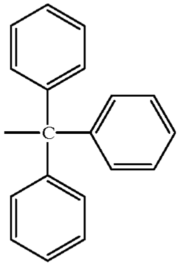 | 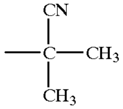 | 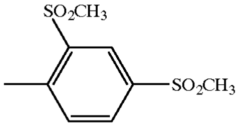 |
| 115 | 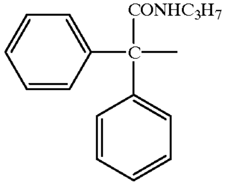 | 115–11 | 115–12 | 115–13 | 115–14 |
| 116 | 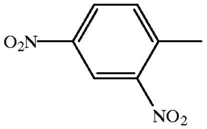 | 116–11 | 116–12 | 116–13 | 116–14 |
| 117 | 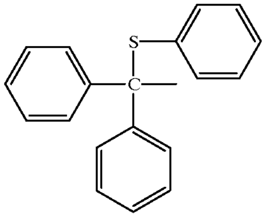 | 117–11 | 117–12 | 117–13 | 117–14 |

TABLE 20
118
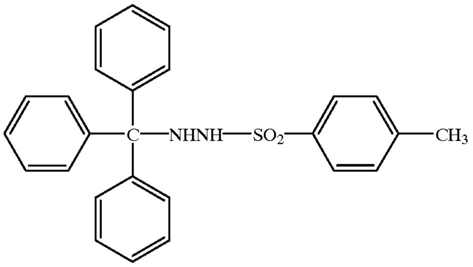
119
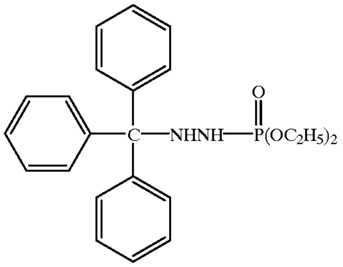
120
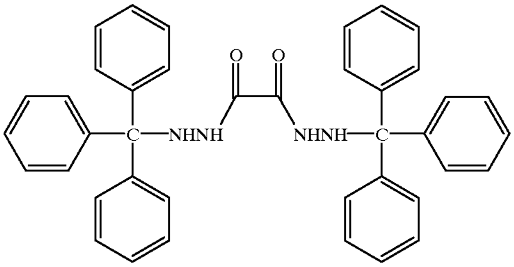
121
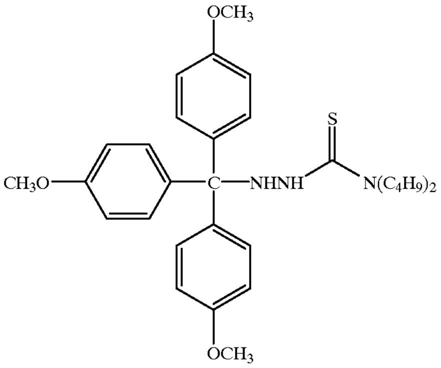
122
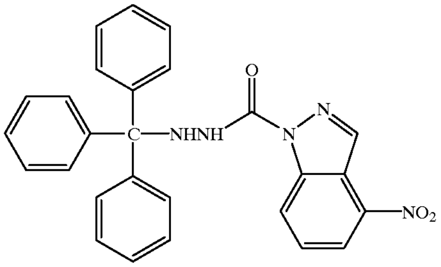

TABLE 20-continued

| | |
|---|---|
| 123 | 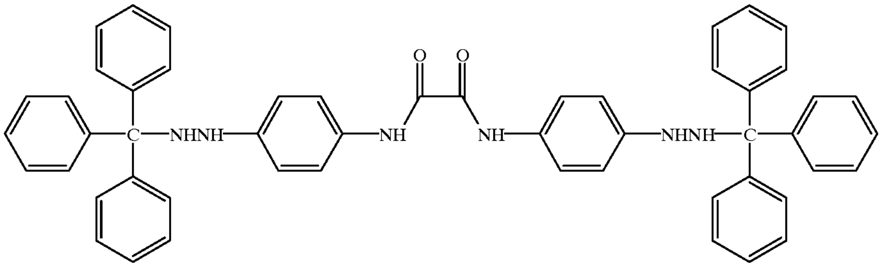 |

The compounds of formula (H) may be used alone or in admixture of two or more.

As the hydrazine derivative used herein, the hydrazine derivatives described in the following patents are also useful. Such another hydrazine derivative is sometimes used in combination with the above-defined hydrazine derivative. Understandably, the hydrazine derivatives used herein can be readily synthesized by any of the methods described in the following patents.

Additional useful hydrazine derivatives include the compounds of the chemical formula [1] in JP-B 77138/1994, more specifically the compounds described on pages 3 and 4 of the same; the compounds of the general formula (1) in JP-B 93082/1994, more specifically compound Nos. 1 to 38 described on pages 8 to 18 of the same; the compounds of the general formulae (4), (5) and (6) in JP-A 230497/1994, more specifically compounds 4-1 to 4-10 described on pages 25 and 26, compounds 5-1 to 5-42 described on pages 28 to 36, and compounds 6-1 to 6-7 described on pages 39 and 40 of the same; the compounds of the general formulae (1) and (2) in JP-A 289520/1994, more specifically compounds 1-1 to 1-17 and 2-1 described on pages 5 to 7 of the same; the compounds of the chemical formulae [2] and [3] in JP-A 313936/1994, more specifically the compounds described on pages 6 to 19 of the same; the compounds of the chemical formula [1] in JP-A 313951/1994, more specifically the compounds described on pages 3 to 5 of the same; the compounds of the general formula (I) in JP-A 5610/1995, more specifically compounds I-1 to I-38 described on pages 5 to 10 of the same; the compounds of the general formula (II) in JP-A 77783/1995, more specifically compounds II-1 to II-102 described on pages 10 to 27 of the same; the compounds of the general formulae (H) and (Ha) in JP-A 104426/1995, more specifically compounds H-1 to H-44 described on pages 8 to 15 of the same; the compounds having an anionic group in proximity to a hydrazine group or a nonionic group forming an intermolecular hydrogen bond with the hydrogen atom of hydrazine in Japanese Patent Application No. 191007/1995, specifically the compounds of general formulae (A), (B), (C), (D), (E) and (F), more specifically compounds N-1 to N-30; and the compounds of the general formula (1) in Japanese Patent Application No. 191007/1995, more specifically compounds D-1 to D-55.

Also useful are various hydrazine derivatives as described in "Known Technology," pages 25–34, Aztek K. K., Mar. 22, 1991, and compounds D-2 and D-39 described in JP-B 86354/1987, pages 6 to 7.

In the practice of the invention, the hydrazine nucleating agent may be used after it is dissolved in a suitable water-miscible organic solvent, for example, alcohols (e.g., methanol, ethanol, propanol and fluorinated alcohols), ketones (e.g., acetone and methyl ethyl ketone), dimethylformamide, dimethyl sulfoxide, and methyl cellosolve.

Also, a well-known emulsifying dispersion method is used for dissolving the hydrazine nucleating agent with the aid of an oil such as dibutyl phthalate, tricresyl phosphate, glyceryl triacetate and diethyl phthalate or an auxiliary solvent such as ethyl acetate and cyclohexanone whereby an emulsified dispersion is mechanically prepared. Alternatively, a method known as a solid dispersion method is used for dispersing the hydrazine derivative in powder form in water in a ball mill, colloidal mill, Manton Gaulin, microfluidizer or ultrasonic mixer.

The hydrazine nucleating agent according to the invention may be added to a silver halide emulsion layer (which is an image forming layer) on a support or another layer on the same side as the emulsion layer, preferably the emulsion layer or a layer disposed adjacent thereto.

The hydrazine nucleating agent is preferably used in an amount of $1\times10^{-6}$ mol to $1\times10^{-2}$ mol, more preferably $1\times10^{-5}$ mol to $5\times10^{-3}$ mol, most preferably $2\times10^{-5}$ to $5\times10^{-3}$ mol per mol of silver halide.

A contrast enhancement accelerator capable of accelerating the nucleating action of the contrast enhancer may be used along with the contrast enhancer for the purpose of forming ultrahigh contrast images.

Exemplary of the contrast enhancement accelerator or nucleation accelerator are amine derivatives, onium salts, disulfide derivatives, hydroxymethyl derivatives, hydroxamic acid derivatives, acylhydrazide derivatives, acrylonitrile derivatives, and hydrogen donors. Exemplary are the compounds described in JP-A 77783/1995, page 48, lines 2–37, specifically compounds A-1 to A-73 on pages 49–58; the compounds of the chemical formulae [21], [22] and [23] described in JP-A 84331/1995, specifically the compounds on pages 6–8; the compounds of the general formulae [Na] and [Nb] described in JP-A 104426/1995, specifically compounds Na-1 to Na-22 and Nb-1 to Nb-12 on pages 16–20; the compounds of the general formulae (1) to (7) described in Japanese Patent Application No. 37817/1995, specifically compounds 1-1 to 1-19, 2-1 to 2-22, 3-1 to 3-36, 4-1 to 4-5, 5-1 to 5-41, 6-1 to 6-58, and 7-1 to 7-38; the amine compounds described in U.S. Pat. No. 5,545,505, specifically AM-1 to AM-5; the hydroxamic acid type compounds described in U.S. Pat. No. 5,545,507, specifically HA-1 to HA-11; the acrylonitriles described in U.S. Pat. No. 5,545,507, specifically CN-1 to CN-13; the compounds described in U.S. Pat. No. 5,545,515, page 12, line 31 to page 14, line 14; the hydrazine compounds described in U.S. Pat. No. 5,558,983, specifically CA-1 to CA-6; the compounds described in WO 97/11407, page 27, line 4 to page 32, line 7; the nucleation accelerators described in Japanese Patent Application No. 70908/1996; and the onium salts described in Japanese Patent Application No. 132836/1996, specifically A-1 to A-42, B-1 to B-27, and C-1 to C-14.

The synthesis methods, addition methods and addition amounts of these nucleation accelerators are in accord with the descriptions of the above-referenced patents.

In the practice of the invention, the nucleation accelerator may be used after it is dissolved in water or a suitable water-miscible organic solvent, for example, alcohols (e.g., methanol, ethanol, propanol and fluorinated alcohols), ketones (e.g., acetone and methyl ethyl ketone), dimethylformamide, dimethyl sulfoxide, and methyl cellosolve.

Also, a well-known emulsifying dispersion method is used for dissolving the nucleation accelerator with the aid of an oil such as dibutyl phthalate, tricresyl phosphate, glyceryl triacetate and diethyl phthalate or an auxiliary solvent such as ethyl acetate and cyclohexanone whereby an emulsified dispersion is mechanically prepared. Alternatively, a method known as a solid dispersion method is used for dispersing the nucleation accelerator in powder form in water in a ball mill, colloidal mill or ultrasonic mixer.

The nucleation accelerator may be added to a silver halide emulsion layer on a support or another layer on the same side as the silver halide emulsion layer, preferably the silver halide emulsion layer or a layer disposed adjacent thereto.

The nucleation accelerator is preferably used in an amount of $1\times10^{-6}$ to $2\times10^{-1}$ mol, more preferably $1\times10^{-5}$ to $2\times10^{-2}$ mol, most preferably $2\times10^{-5}$ to $1\times10^{-2}$ mol per mol of silver.

Silver Halide

The heat developable photographic material of the invention is preferably a photothermographic material containing a photosensitive silver halide as a photocatalyst.

A method for forming the photosensitive silver halide is well known in the art. Any of the methods disclosed in Research Disclosure No. 17029 (June 1978) and U.S. Pat. No. 3,700,458, for example, may be used. Illustrative methods which can be used herein are a method of preforming an organic silver salt and adding a halogen-containing compound to the organic silver salt to convert a part of silver of the organic silver salt into photosensitive silver halide and a method of adding a silver-providing compound and a halogen-providing compound to a solution of gelatin or another polymer to form photosensitive silver halide grains and mixing the grains with an organic silver salt. The latter method is preferred in the practice of the invention.

The photosensitive silver halide should preferably have a smaller grain size for the purpose of minimizing white turbidity after image formation. Specifically, the grain size is preferably up to 0.20 μm, more preferably 0.01 μm to 0.15 μm, most preferably 0.02 μm to 0.12 μm. The term grain size designates the length of an edge of a silver halide grain where silver halide grains are regular grains of cubic or octahedral shape. Where silver halide grains are tabular, the grain size is the diameter of an equivalent circle having the same area as the projected area of a major surface of a tabular grain. Where silver halide grains are not regular, for example, in the case of spherical or rod-shaped grains, the grain size is the diameter of an equivalent sphere having the same volume as a grain.

The shape of silver halide grains may be cubic, octahedral, tabular, spherical, rod-like and potato-like, with cubic and tabular grains being preferred in the practice of the invention. Where tabular silver halide grains are used, they should preferably have an average aspect ratio of from 100:1 to 2:1, more preferably from 50:1 to 3:1. Silver halide grains having rounded corners are also preferably used. No particular limit is imposed on the face indices (Miller indices) of an outer surface of silver halide grains. Preferably silver halide grains have a high proportion of {100} face featuring high spectral sensitization efficiency upon adsorption of a spectral sensitizing dye. The proportion of {100} face is preferably at least 50%, more preferably at least 65%, most preferably at least 80%. Note that the proportion of Miller index {100} face can be determined by the method described in T. Tani, J. Imaging Sci., 29, 165 (1985), utilizing the adsorption dependency of {111} face and {100} face upon adsorption of a sensitizing dye.

The halogen composition of photosensitive silver halide is not critical and may be any of silver chloride, silver chlorobromide, silver bromide, silver iodobromide, silver iodochlorobromide, and silver iodide. Silver bromide or silver iodobromide is preferred in the practice of the invention. Most preferred is silver iodobromide preferably having a silver iodide content of 0.1 to 40 mol %, especially 0.1 to 20 mol %. The halogen composition in grains may have a uniform distribution or a non-uniform distribution wherein the halogen concentration changes in a stepped or continuous manner. Preferred are silver iodobromide grains having a higher silver iodide content in the interior. Silver halide grains of the core/shell structure are also useful. Such core/shell grains preferably have a multilayer structure of 2 to 5 layers, more preferably 2 to 4 layers.

Preferably the photosensitive silver halide grains used herein contain at least one complex of a metal selected from the group consisting of rhodium, rhenium, ruthenium, osmium, iridium, cobalt, and iron. The metal complexes may be used alone or in admixture of two or more complexes of a common metal or different metals. The metal complex is preferably contained in an amount of $1\times10^{-9}$ to $1\times10^{-3}$ mol, more preferably $1\times10^{-8}$ to $1\times10^{-4}$ mol per mol of silver. Illustrative metal complex structures are those described in JP-A 225449/1995. The cobalt and iron compounds are preferably hexacyano metal complexes while illustrative, non-limiting examples include a ferricyanate ion, ferrocyanate ion, and hexacyanocobaltate ion. The distribution of the metal complex in silver halide grains is not critical. That is, the metal complex may be contained in silver halide grains to form a uniform phase or at a high concentration in either the core or the shell.

Photosensitive silver halide grains may be desalted by any of well-known water washing methods such as noodle and flocculation methods although silver halide grains may be either desalted or not according to the invention.

The photosensitive silver halide grains used herein should preferably be chemically sensitized. Preferred chemical sensitization methods are sulfur, selenium, and tellurium sensitization methods which are well known in the art. Also useful are a noble metal sensitization method using compounds of gold, platinum, palladium, and iridium and a reduction sensitization method. In the sulfur, selenium, and tellurium sensitization methods, any of compounds well known for the purpose may be used. For example, the compounds described in JP-A 128768/1995 are useful. Exemplary tellurium sensitizing agents include diacyltellurides, bis(oxycarbonyl)tellurides, bis(carbamoyl) tellurides, bis(oxycarbonyl)ditellurides, bis(carbamoyl) ditellurides, compounds having a P-Te bond, tellurocarboxylic salts, Te-organyltellurocarboxylic esters, di(poly) tellurides, tellurides, telluroles, telluroacetals, tellurosulfonates, compounds having a P-Te bond, Te-containing heterocycles, tellurocarbonyl compounds, inorganic tellurium compounds, and colloidal tellurium. The preferred compounds used in the noble metal sensitization method include chloroauric acid, potassium chloroaurate, potassium aurithiocyanate, gold sulfide, and gold selenide as well as the compounds described in U.S. Pat. No. 2,448,060 and UKP 618,061. Illustrative examples of the compound used in the reduction sensitization method include ascorbic acid, thiourea dioxide, stannous chloride, aminoiminomethanesulfinic acid, hydrazine derivatives, borane compounds, silane compounds, and polyamine compounds. Reduction sensitization may also be accomplished by ripening the emulsion while maintaining it at pH 7 or higher or at pAg 8.3 or lower. Reduction sensitization may also be accomplished by introducing a single addition portion of silver ion during grain formation.

According to the invention, the photosensitive silver halide is preferably used in an amount of 0.01 to 0.5 mol, more preferably 0.02 to 0.3 mol, most preferably 0.03 to 0.25 mol per mol of the organic silver salt. With respect to a method and conditions of admixing the separately prepared photosensitive silver halide and organic silver salt, there may be used a method of admixing the separately prepared photosensitive silver halide and organic silver salt in a high speed agitator, ball mill, sand mill, colloidal mill, vibratory mill or homogenizer or a method of preparing an organic silver salt by adding the already prepared photosensitive silver halide at any timing during preparation of an organic silver salt. Any desired mixing method may be used insofar as the benefits of the invention are fully achievable.

Silver Salt

A reducible silver salt is used in the material of the invention. The reducible silver salt used herein is an organic silver salt which is relatively stable to light, but forms a silver image when heated at 80° C. or higher in the presence of an exposed photocatalyst (as typified by a latent image of photosensitive silver halide) and a reducing agent. The organic silver salt may be of any desired organic compound containing a source capable of reducing silver ion. Preferred are silver salts of organic acids, typically long chain aliphatic carboxylic acids having 10 to 30 carbon atoms, especially 15 to 28 carbon atoms. Also preferred are complexes of organic or inorganic silver salts with ligands having a stability constant in the range of 4.0 to 10.0. A silver-providing substance is preferably used in an amount of about 5 to 30% by weight of an image forming layer. Preferred organic silver salts include silver salts of organic compounds having a carboxyl group. Examples include silver salts of aliphatic carboxylic acids and silver salts of aromatic carboxylic acids though not limited thereto. Preferred examples of the silver salt of aliphatic carboxylic acid include silver behenate, silver stearate, silver oleate, silver laurate, silver caproate, silver myristate, silver palmitate, silver maleate, silver fumarate, silver tartrate, silver linolate, silver butyrate, silver camphorate and mixtures thereof.

Silver salts of compounds having a mercapto or thion group and derivatives thereof are also useful. Preferred examples of these compounds include a silver salt of 3-mercapto-4-phenyl-1,2,4-triazole, a silver salt of 2-mercaptobenzimidazole, a silver salt of 2-mercapto-5-aminothiadiazole, a silver salt of 2-(ethylglycolamido)-benzothiazole, silver salts of thioglycolic acids such as silver salts of S-alkylthioglycolic acids wherein the alkyl group has 12 to 22 carbon atoms, silver salts of dithiocarboxylic acids such as a silver salt of dithioacetic acid, silver salts of thioamides, a silver salt of 5-carboxyl-1-methyl-2-phenyl-4-thiopyridine, silver salts of mercaptotriazines, a silver salt of 2-mercaptobenzoxazole as well as silver salts of 1,2,4-mercaptothiazole derivatives such as a silver salt of 3-amino-5-benzylthio-1,2,4-thiazole as described in U.S. Pat. No. 4,123,274 and silver salts of thion compounds such as a silver salt of 3-(3-carboxyethyl)-4-methyl-4-thiazoline-2-thione as described in U.S. Pat. No. 3,301,678. Compounds containing an imino group may also be used. Preferred examples of these compounds include silver salts of benzotriazole and derivatives thereof, for example, silver salts of benzotriazoles such as silver methylbenzotriazole, silver salts of halogenated benzotriazoles such as silver 5-chlorobenzotriazole as well as silver salts of 1,2,4-triazole and l-H-tetrazole and silver salts of imidazole and imidazole derivatives as described in U.S. Pat. No. 4,220,709. Also useful are various silver acetylide compounds as described, for example, in U.S. Pat. Nos. 4,761,361 and 4,775,613.

The organic silver salt which can be used herein may take any desired shape although needle crystals having a minor axis and a major axis are preferred. The inverse proportional relationship between the size of silver salt crystal grains and their covering power that is well known for photosensitive silver halide materials also applies to the photothermographic material of the present invention. That is, as organic silver salt grains constituting image forming regions of photothermographic material increase in size, the covering power becomes smaller and the image density becomes lower. It is thus necessary to reduce the grain size of the organic silver salt. In the practice of the invention, grains should preferably have a minor axis of 0.01 $\mu$m to 0.20 $\mu$m, more preferably 0.01 $\mu$m to 0.15 $\mu$m and a major axis of 0.10 $\mu$m to 5.0 $\mu$m, more preferably 0.10 $\mu$m to 4.0 $\mu$m. The grain size distribution is desirably monodisperse. The monodisperse distribution means that a standard deviation of the length of minor and major axes divided by the length, respectively, expressed in percent, is preferably up to 100%, more preferably up to 80%, most preferably up to 50%. It can be determined from the measurement of the shape of organic silver salt grains using an image obtained through a transmission electron microscope. Another method for determining a monodisperse distribution is to determine a standard deviation of a volume weighed mean diameter. The standard deviation divided by the volume weighed mean diameter, expressed in percent, which is a coefficient of variation, is preferably up to 100%, more preferably up to 80%, most preferably up to 50%. It may be determined by irradiating laser light, for example, to organic silver salt grains dispersed in liquid and determining the autocorrelation function of the fluctuation of scattering light relative to a time change, and obtaining the grain size (volume weighed mean diameter) therefrom.

Sensitizing Dye

There may be used any of sensitizing dyes which can spectrally sensitize silver halide grains in a desired wavelength region when adsorbed to the silver halide grains. The sensitizing dyes used herein include cyanine dyes, merocyanine dyes, complex cyanine dyes, complex merocyanine dyes, holopolar cyanine dyes, styryl dyes, hemicyanine dyes, oxonol dyes, and hemioxonol dyes. Useful sensitizing dyes which can be used herein are described in Research Disclosure, Item 17643 IV-A (December 1978, page 23), ibid., Item 1831 X (August 1979, page 437) and the references cited therein. It is advantageous to select a sensitizing dye having appropriate spectral sensitivity to the spectral properties of a particular light source of various laser imagers, scanners, image setters and printing plate-forming cameras.

Exemplary dyes for spectral sensitization to red light include compounds I-1 to I-38 described in JP-A 18726/1979, compounds I-1 to I-35 described in JP-A 75322/1994, and compounds I-1 to I-34 described in JP-A 287338/1995 for He-Ne laser light sources, and dyes 1 to 20 described in JP-B 39818/1980, compounds I-1 to I-37 described in JP-A 284343/1987, and compounds I-1 to I-34 described in JP-A 287338/1995 for LED light sources.

Usually the silver halide grains are spectrally sensitized at any wavelength region in the range of 750 to 1,400 nm. More particularly, spectral sensitization may be advantageously done with various known dyes including cyanine, merocyanine, styryl, hemicyanine, oxonol, hemioxonol, and xanthene dyes. Useful cyanine dyes are cyanine dyes having a basic nucleus such as a thiazoline, oxazoline, pyrroline, pyridine, oxazole, thiazole, selenazole and imidazole nucleus. Preferred examples of the useful merocyanine dye contain an acidic nucleus such as a thiohydantoin, rhodanine, oxazolidinedione, thiazolinedione, barbituric acid, thiazolinone, malononitrile, and pyrazolone nucleus in addition to the above-mentioned basic nucleus. Among the above-mentioned cyanine and merocyanine dyes, those having an imino or carboxyl group are especially effective. A suitable choice may be made of well-known dyes as described, for example, in U.S. Pat. Nos. 3,761,279, 3,719, 495, and 3,877,943, UKP 1,466,201, 1,469,117, and 1,422,057, JP-B 10391/1991 and 52387/1994, JP-A 341432/1993, 194781/1994, and 301141/1994. Especially preferred dye structures are cyanine dyes having a thioether bond-containing substituent group, examples of which are the cyanine dyes described in JP-A 58239/1987, 138638/1991, 138642/1991, 255840/1992, 72659/1993, 72661/1993, 222491/1994, 230506/1990, 258757/1994, 317868/1994, and 324425/1994, Publication of International Patent Application No. 500926/1995.

These sensitizing dyes may be used alone or in admixture of two or more. A combination of sensitizing dyes is often used for the purpose of supersensitization. In addition to the sensitizing dye, the emulsion may contain a dye which itself has no spectral sensitization function or a compound which does not substantially absorb visible light, but is capable of supersensitization. Useful sensitizing dyes, combinations of dyes showing supersensitization, and compounds showing supersensitization are described in Research Disclosure, Vol. 176, 17643 (December 1978), page 23, IV J and JP-B 25500/1974 and 4933/1968, JP-A 19032/1984 and 192242/1984.

The sensitizing dye may be added to a silver halide emulsion by directly dispersing the dye in the emulsion or by dissolving the dye in a solvent and adding the solution to the emulsion. The solvent used herein includes water, methanol, ethanol, propanol, acetone, methyl cellosolve, 2,2,3,3-tetrafluoropropanol, 2,2,2-trifluoroethanol, 3-methoxy-l-propanol, 3-methoxy-1-butanol, 1-methoxy-2-propanol, N,N-dimethylformamide and mixtures thereof.

Also useful are a method of dissolving a dye in a volatile organic solvent, dispersing the solution in water or hydrophilic colloid and adding the dispersion to an emulsion as disclosed in U.S. Pat. No. 3,469,987, a method of dissolving a dye in an acid and adding the solution to an emulsion or forming an aqueous solution of a dye with the aid of an acid or base and adding it to an emulsion as disclosed in JP-B 23389/1969, 27555/1969 and 22091/1982, a method of forming an aqueous solution or colloidal dispersion of a dye with the aid of a surfactant and adding it to an emulsion as disclosed in U.S. Pat. Nos. 3,822,135 and 4,006,025, a method of directly dispersing a dye in hydrophilic colloid and adding the dispersion to an emulsion as disclosed in JP-A 102733/1978 and 105141/1983, and a method of dissolving a dye using a compound capable of red shift and adding the solution to an emulsion as disclosed in JP-A 74624/1976. It is also acceptable to apply ultrasonic waves to form a solution.

The time when the sensitizing dye is added to the silver halide emulsion according to the invention is at any step of an emulsion preparing process which has been ascertained effective. The sensitizing dye may be added to the emulsion at any stage or step before the emulsion is coated, for example, at a stage prior to the silver halide grain forming step and/or desalting step, during the desalting step and/or a stage from desalting to the start of chemical ripening as disclosed in U.S. Pat. Nos. 2,735,766, 3,628,960, 4,183,756, and 4,225,666, JP-A 184142/1983 and 196749/1985, and a stage immediately before or during chemical ripening and a stage from chemical ripening to emulsion coating as disclosed in JP-A 113920/1983. Also as disclosed in U.S. Pat. No. 4,225,666 and JP-A 7629/1983, an identical compound may be added alone or in combination with a compound of different structure in divided portions, for example, in divided portions during a grain forming step and during a chemical ripening step or after the completion of chemical ripening, or before or during chemical ripening and after the completion thereof. The type of compound or the combination of compounds to be added in divided portions may be changed.

Reducing Agent

A reducing agent is used in the material of the invention. The reducing agent for the organic silver salt may be any of substances, preferably organic substances, that reduce silver ion into metallic silver. Conventional photographic developing agents such as Phenidone®, hydroquinone and catechol are useful although hindered phenols are preferred reducing agents. The reducing agent should preferably be contained in an amount of 1 to 10% by weight of an image forming layer. In a multilayer embodiment wherein the reducing agent is added to a layer other than an emulsion layer, the reducing agent should preferably be contained in a slightly greater amount of about 2 to 15% by weight of that layer.

For photothermographic materials using organic silver salts, a wide range of reducing agents are disclosed. Exemplary reducing agents include amidoximes such as phenylamidoxime, 2-thienylamidoxime, and p-phenoxyphenylamidoxime; azines such as 4-hydroxy-3,5-dimethoxybenzaldehydeazine; combinations of aliphatic carboxylic acid arylhydrazides with ascorbic acid such as a combination of 2,2'-bis(hydroxymethyl)propionyl-β-phenylhydrazine with ascorbic acid; combinations of polyhydroxybenzenes with hydroxylamine, reductone and/or hydrazine, such as combinations of hydroquinone with bis(ethoxyethyl)hydroxylamine, piperidinohexosereductone or formyl-4-methylphenylhydrazine; hydroxamic acids such as phenylhydroxamic acid, p-hydroxyphenylhydroxamic acid, and β-anilinehydroxamic acid; combinations of azines with sulfonamidophenols such as a combination of phenothiazine with 2,6-dichloro-4-benzenesulfonamidephenol; α-cyanophenyl acetic acid derivatives such as ethyl-α-cyano-2-methylphenyl acetate and ethyl-α-cyanophenyl acetate; bis-β-naphthols such as 2,2'-dihydroxy-1,1'-binaphthyl, 6,6'-dibromo-2,2'-dihydroxy-1,1'-binaphthyl, and bis(2-hydroxy-1-naphthyl)methane; combinations of bis-β-naphthols with 1,3-dihydroxybenzene derivatives such as 2,4-dihydroxybenzophenone and 2',4'-dihydroxyacetophenone; 5-pyrazolones such as 3-methyl-1-phenyl-5-pyrazolone; reductones such as dimethylaminohexosereductone, anhydrodihydroaminohexosereductone and anhydrodihydropiperidonehexosereductone; sulfonamidephenol reducing agents such as 2,6-dichloro-4-benzenesulfonamidophenol and p-benzenesulfonamidophenol; 2-phenylindane-1,3-dione, etc.; chromans such as 2,2-dimethyl-7-t-butyl-6-hydroxychroman; 1,4-dihydropyridines such as 2,6-dimethoxy-3,5-dicarboethoxy-1,4-dihydropyridine; bisphenols such as bis(2-hydroxy-3-t-butyl-5-methylphenyl)methane, 2,2-bis(4-hydroxy-3-methylphenyl)propane, 4,4-ethylidene-bis(2-t-butyl-6-methylphenol), 1,1-bis(2-hydroxy-3,5-dimethylphenyl)-3,5,5-trimethylhexane, and 2,2-bis(3,5-dimethyl-4-hydroxyphenyl)propane; ascorbic acid derivatives such as 1-ascorbyl palmitate and ascorbyl stearate; aldehydes and ketones such as benzil and diacetyl; 3-pyrazolidones and certain indane-1,3-diones.

Especially preferred reducing agents used herein are those compounds of the following formulae (R-I), (R-II), (R-III), and (R-IV).

(R-I)

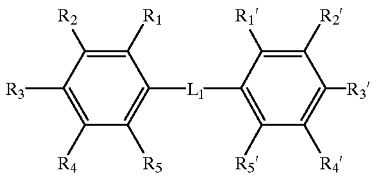

-continued (R-II)

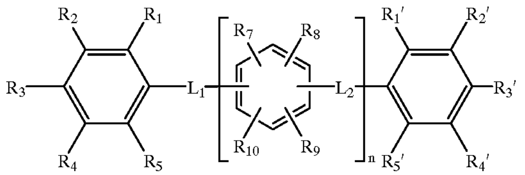

(R-III)

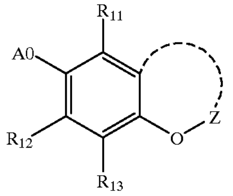

(R-IV)

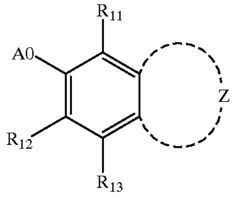

In formula (R-III), Z forms a cyclic structure represented by the following formula (Z-1) or (Z-2).

(Z-1)

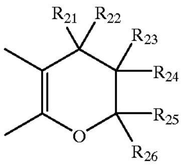

(Z-2)

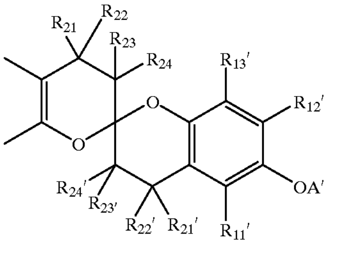

In formula (R-IV), Z forms a cyclic structure represented by the following formula (Z-3) or (Z-4).

(Z-3)

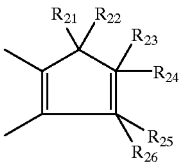

-continued (Z-4)

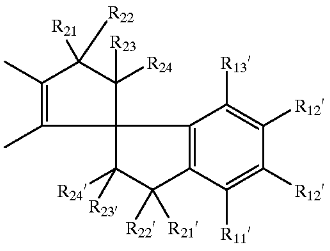

In formulae (R-I) and (R-II), each of $L_1$ and $L_2$ is a group —CH($R_6$)— or —CH($R_6$')— or a sulfur atom, and n is a natural number.

Herein, R is used as a representative of $R_1$ to $R_{10}$, $R_1$' to $R_5$', $R_6$', $R_{11}$ to $R_{13}$, $R_{11}$' to $R_{13}$', $R_{21}$ to $R_{26}$, and $R_{21}$' to $R_{24}$' R is a hydrogen atom, alkyl group having 1 to 30 carbon atoms, aryl group, aralkyl group, halogen atom, amino group or a substituent represented by —O—A, with the proviso that at least one of $R_1$ to $R_5$, at least one of $R_1$' to $R_5$', and at least one of $R_7$ to $R_{10}$ each are a group represented by —O—A. Alternatively, R groups, taken together, may form a ring. A and A' each are a hydrogen atom, alkyl group having 1 to 30 carbon atoms, acyl group having 1 to 30 carbon atoms, aryl group, phosphate group or sulfonyl group. R, A and A' may be substituted groups while typical examples of the substituent include an alkyl group (inclusive of active methylene groups), nitro group, alkenyl group, alkynyl group, aryl group, heterocycle-containing group, group containing a quaternized nitrogen atom-containing heterocycle (e.g., pyridinio group), hydroxyl group, alkoxy group (inclusive of a group containing recurring ethylenoxy or propylenoxy units), aryloxy group, acyloxy group, acyl group, alkoxycarbonyl group, arylcarbonyl group, carbamoyl group, urethane group, carboxyl group, imide group, amino group, carbonamide group, sulfonamide group, ureido group, thioureido group, sulfamoylamino group, semicarbazide group, thiosemicarbazide group, hydrazino-containing group, quaternary ammonio-containing group, mercapto group, (alkyl, aryl or heterocyclic) thio group, (alkyl or aryl)sulfonyl group, (alkyl or aryl)sulfinyl group, sulfo group, sulfamoyl group, acylsulfamoyl group, (alkyl or aryl)sulfonylureido group, (alkyl or aryl)sulfonylcarbamoyl group, halogen atom, cyano group, phosphoramido group, phosphate structure-containing group, acylurea structure-bearing group, selenium or tellurium atom-containing group, and tertiary or quaternary sulfonium structure-bearing group. The substituent on R, A and A' may be further substituted, with preferred examples of the further substituent being those groups exemplified as the substituent on R. The further substituent, in turn, may be further substituted, the still further substituent, in turn, may be further substituted, and so on. In this way, multiple substitution is acceptable while preferred substituents are those groups exemplified as the substituent on R, A and A'.

Illustrative, non-limiting, examples of the compounds represented by formulae (R-I), (R-II), (R-III) and (R-IV) are given below.

TABLE 21

| No. | $R_1$, $R_1$' | $R_2$, $R_2$' | $R_3$, $R_3$' | $R_4$, $R_4$' | $R_5$, $R_5$' | $L_1$ | $R_6$ |
|---|---|---|---|---|---|---|---|
| R-I-1 | —OH | —$CH_3$ | —H | —$CH_3$ | —H | CH—$R_6$ | —H |
| R-I-2 | —OH | —$CH_3$ | —H | —$CH_3$ | —H | CH—$R_6$ | —$CH_3$ |
| R-I-3 | —OH | —$CH_3$ | —H | —$CH_3$ | —H | CH—$R_6$ | —$C_3H_7$ |
| R-I-4 | —OH | —$CH_3$ | —H | —$CH_3$ | —H | CH—$R_6$ | —$C_5H_{11}$ |
| R-I-5 | —OH | —$CH_3$ | —H | —$CH_3$ | —H | CH—$R_6$ | —TMB |
| R-I-6 | —OH | —$CH_3$ | —H | —$CH_3$ | —H | CH—$R_6$ | —$C_9H_{19}$ |
| R-I-7 | —OH | —$CH_3$ | —H | —$CH_3$ | —H | S | — |
| R-I-8 | —OH | —$CH_3$ | —H | —$C_2H_5$ | —H | S | — |
| R-I-9 | —OH | —$CH_3$ | —H | —$C_4H_9$(t) | —H | S | — |
| R-I-10 | —OH | —$C_4H_9$(t) | —H | —$CH_3$ | —H | CH—$R_6$ | —H |
| R-I-11 | —OH | —$C_4H_9$(t) | —H | —$CH_3$ | —H | CH—$R_6$ | —$CH_3$ |
| R-I-12 | —OH | —$C_4H_9$(t) | —H | —$CH_3$ | —H | CH—$R_6$ | —TMB |
| R-I-13 | —OH | —$C_4H_9$(t) | —H | —$C_2H_5$ | —H | CH—$R_6$ | —Ph |
| R-I-14 | —OH | —CHex | —H | —$CH_3$ | —H | S | — |
| R-I-15 | —OH | —$C_4H_9$(t) | —H | —$C_2H_5$ | —H | S | — |
| R-I-16 | —OH | —$C_2H_5$ | —H | —$C_4H_9$(t) | —H | CH—$R_6$ | —H |
| R-I-17 | —OH | —$C_2H_5$ | —H | —$C_4H_9$(t) | —H | CH—$R_6$ | —$CH_3$ |
| R-I-18 | —OH | —$C_2H_5$ | —H | —$C_4H_9$(t) | —H | CH—$R_6$ | —TMB |
| R-I-19 | —OH | —$CH_3$ | —H | —$C_4H_9$(t) | —H | CH—$R_6$ | —Ph |
| R-I-20 | —OH | —$CH_3$ | —Cl | —$C_4H_9$(t) | —H | CH—$R_6$ | —H |
| R-I-21 | —OH | —$CH_3$ | —H | —$C_4H_9$(t) | —$OCH_3$ | CH—$R_6$ | —H |
| R-I-22 | —H | —$C_4H_9$(t) | —OH | —CPen | —H | CH—$R_6$ | —H |
| R-I-23 | —H | —$C_4H_9$(t) | —OH | —$C_4H_9$(t) | —H | CH—$R_6$ | —TMB |
| R-I-24 | —H | —$C_4H_9$(t) | —OH | —H | —H | CH—$R_6$ | —H |
| R-I-25 | —H | —$C_4H_9$(t) | —OH | —H | —H | CH—$R_6$ | —$C_3H_7$ |
| R-I-26 | —H | —$CH_3$ | —OH | —$C_4H_9$(t) | —H | CH—$R_6$ | —TMB |
| R-I-27 | —H | —$C_2H_5$ | —OH | —$C_4H_9$(t) | —H | CH—$R_6$ | —H |
| R-I-28 | —H | —$CH_3$ | —OH | —$C_2H_5$ | —H | CH—$R_6$ | —TMB |
| R-I-29 | —H | —$CH_3$ | —OH | —$CH_3$ | —H | S | — |
| R-I-30 | —H | —$CH_3$ | —OH | —$CH_3$ | —Cl | S | — |
| R-I-31 | —H | —$CH_3$ | —OH | —$C_2H_5$ | —H | S | — |
| R-I-32 | —H | —$C_2H_5$ | —OH | —$C_2H_5$ | —H | S | — |
| R-I-33 | —H | —$C_2H_5$ | —OH | —$CH_3$ | —Cl | S | — |
| R-I-34 | —H | —$CH_3$ | —OH | —$C_4H_9$(t) | —H | S | — |
| R-I-35 | —H | —CHex | —OH | —$C_4H_9$(t) | —H | S | — |

TMB: 1,3,3-trimethylbutyl group —CH(—$CH_3$)—$CH_2$—C(—$CH_3$)$_3$

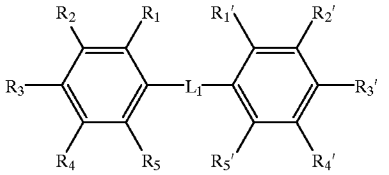

CPen: cyclopentyl group
CHex: cyclohexyl group

TABLE 22

| No. | $R_1$ | $R_2$ | $R_3$ | $R_4$ | $R_5$ | $R_1$' | $R_2$' | $R_3$' | $R_4$' | $R_5$' | $L_1$ | $R_6$ |
|---|---|---|---|---|---|---|---|---|---|---|---|---|
| R-I-36 | —OH | —$CH_3$ | —H | —$CH_3$ | —H | —H | —$CH_3$ | —OH | —$CH_3$ | —H | CH—$R_6$ | —H |
| R-I-37 | —OH | —$C_4H_9$(t) | —H | —$CH_3$ | —H | —H | —$CH_3$ | —OH | —$CH_3$ | —H | CH—$R_6$ | —H |
| R-I-38 | —OH | —$CH_3$ | —H | —$CH_3$ | —H | —H | —CHex | —OH | —$CH_3$ | —H | CH—$R_6$ | —$CH_3$ |
| R-I-39 | —OH | —$C_4H_9$(t) | —H | —$CH_3$ | —H | —H | —$CH_3$ | —OH | —$CH_3$ | —H | CH—$R_6$ | —$CH_3$ |
| R-I-40 | —OH | —$CH_3$ | —H | —$CH_3$ | —H | —H | —$CH_3$ | —OH | —$CH_3$ | —H | CH—$R_6$ | —TMB |
| R-I-41 | —OH | —$C_4H_9$(t) | —H | —$CH_3$ | —H | —H | —$CH_3$ | —OH | —$CH_3$ | —H | CH—$R_6$ | —TMB |
| R-I-42 | —OH | —$CH_3$ | —H | —$CH_3$ | —H | —H | —$CH_3$ | —OH | —$CH_3$ | —H | S | — |
| R-I-43 | —OH | —$C_4H_9$(t) | —H | —$CH_3$ | —H | —H | —$CH_3$ | —OH | —$CH_3$ | —H | S | — |
| R-I-44 | —OH | —$CH_3$ | —H | —$CH_3$ | —H | —H | —CHex | —OH | —$CH_3$ | —H | S | — |

CHex: cyclohexyl group

TABLE 22-continued
| No. | $R_1$ | $R_2$ | $R_3$ | $R_4$ | $R_5$ | $R_1$' | $R_2$' | $R_3$' | $R_4$' | $R_5$' | $L_1$ | $R_6$ |
|---|---|---|---|---|---|---|---|---|---|---|---|---|
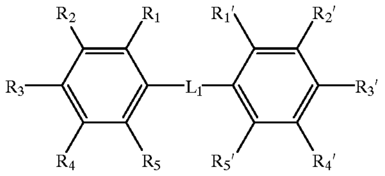
R-I-45
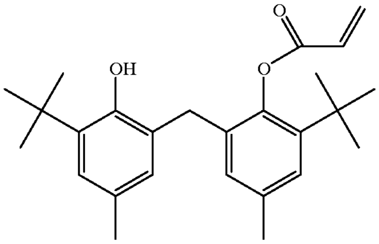
R-I-46
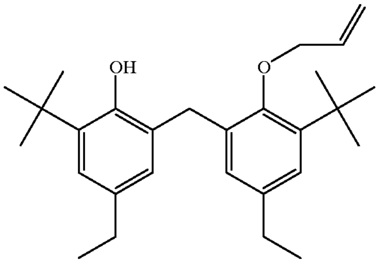
R-I-47
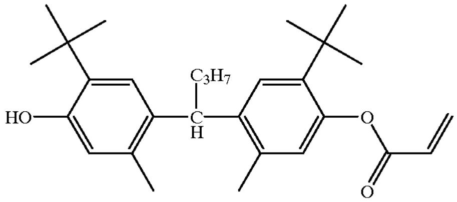
R-I-48
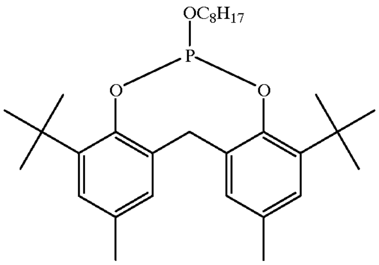

-continued
R-I-49
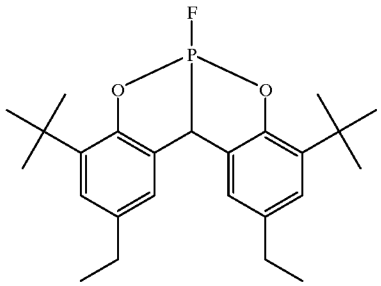
R-I-50
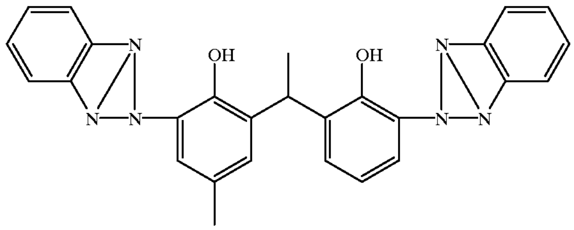
R-I-51
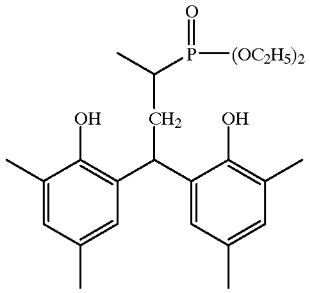
R-I-52
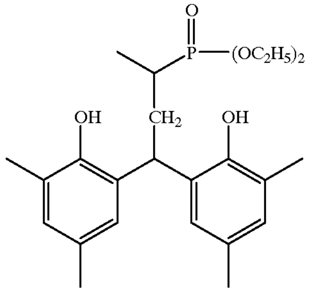
R-I-53
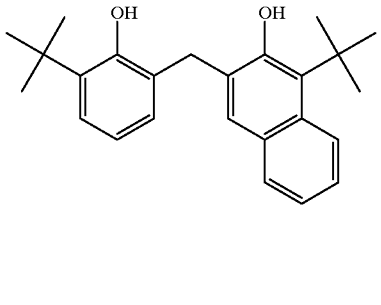

-continued

R-I-54

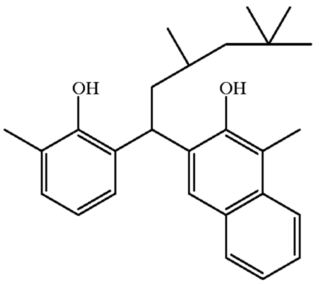

R-I-55

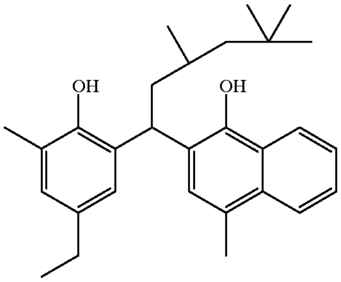

TABLE 23

| No. | $R_1$, $R_1'$ | $R_2$, $R_2'$ | $R_3$, $R_3'$ | $R_4$, $R_4'$ | $R_5$, $R_5'$ | $R_7$ | $R_8$ | $R_9$ | $R_{10}$ | $L_1$ | $R_6$ | $L_2$ | $R_6'$ | n |
|---|---|---|---|---|---|---|---|---|---|---|---|---|---|---|
| R-II-1 | —OH | —$C_4H_9$(t) | —H | —$CH_3$ | —H | —OH | —$CH_3$ | —$CH_3$ | —H | CH—$R_6$ | —H | CH—$R_6'$ | —$CH_3$ | 1 |
| R-II-2 | —OH | —$CH_3$ | —H | —$CH_3$ | —H | —OH | —$C_2H_5$ | —$CH_3$ | —H | CH—$R_6$ | —TMB | CH—$R_6'$ | —$CH_3$ | 1 |
| R-II-3 | —OH | —$C_4H_9$(t) | —H | —$CH_3$ | —H | —OH | —$CH_3$ | —$CH_3$ | —H | CH—$R_6$ | —H | CH—$R_6'$ | —TMB | 3 |
| R-II-4 | —OH | —$CH_3$ | —H | —$CH_3$ | —H | —OH | —$C_2H_5$ | —$CH_3$ | —H | CH—$R_6$ | —TMB | CH—$R_6'$ | —TMB | 2 |
| R-II-5 | —H | —$C_4H_9$(t) | —OH | —$CH_3$ | —H | —OH | —$CH_3$ | —$CH_3$ | —H | S | — | CH—$R_6'$ | —$CH_3$ | 1 |
| R-II-6 | —H | —$CH_3$ | —OH | —$CH_3$ | —H | —OH | —$C_2H_5$ | —$CH_3$ | —H | S | — | S | — | 1 |
| R-II-7 | —H | —$C_4H_9$(t) | —OH | —$CH_3$ | —H | —OH | —$CH_3$ | —$CH_3$ | —H | S | — | S | — | 2 |
| R-II-8 | —H | —$CH_3$ | —OH | —$CH_3$ | —H | —OH | —$C_2H_5$ | —$CH_3$ | —H | S | — | CH—$R_6'$ | —TMB | 3 |

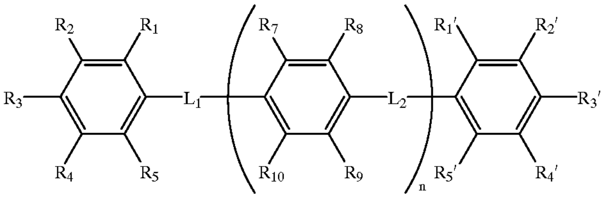

TABLE 24

| No. | Z | $R_{11}$ | $R_{12}$ | $R_{13}$ | $R_{21}$ | $R_{22}$ | $R_{23}$ | $R_{24}$ | $R_{25}$ | $R_{26}$ | A |
|---|---|---|---|---|---|---|---|---|---|---|---|
| R-III-1 | Z-1 | —$CH_3$ | —$CH_3$ | —$CH_3$ | —H | —H | —H | —H | —$CH_3$ | —$C_{16}H_{33}$ | —H |
| R-III-2 | Z-1 | —$CH_3$ | —$CH_3$ | —$CH_3$ | —H | —H | —H | —H | —$CH_3$ | —$C_6H_{13}$ | —H |
| R-III-3 | Z-1 | —$CH_3$ | —$C_8H_{17}$ | —H | —H | —$CH_3$ | —H | —H | —$CH_3$ | —$CH_3$ | —H |
| R-III-4 | Z-1 | —H | —$C_8H_{17}$ | —H | —H | —$CH_3$ | —H | —H | —$CH_3$ | —$CH_3$ | —H |
| R-III-5 | Z-1 | —H | —H | —$CH_3$ | —H | —H | —H | —H | —$CH_3$ | —$C_{16}H_{33}$ | —H |
| R-III-6 | Z-1 | —H | —$CH_3$ | —H | —$CH_3$ | —$CH_3$ | —H | —H | —$CH_3$ | —$CH_3$ | —H |
| R-III-7 | Z-1 | —H | —$CH_3$ | —H | —$CH_3$ | —$CH_3$ | —H | —H | —$CH_3$ | —DHP | —H |

DHP: 2,4-dihydroxyphenyl group

TABLE 24-continued

| No. | Z | $R_{11}$ | $R_{12}$ | $R_{13}$ | $R_{21}$ | $R_{22}$ | $R_{23}$ | $R_{24}$ | $R_{25}$ | $R_{26}$ | A |
|---|---|---|---|---|---|---|---|---|---|---|---|

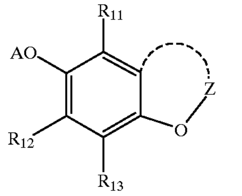

(Z-1)

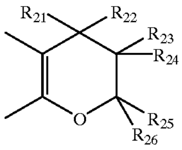

TABLE 25

| No. | Z | $R_{11}$, $R_{11}'$ | $R_{12}$, $R_{12}'$ | $R_{13}$, $R_{13}'$ | $R_{21}$, $R_{22}$ | $R_{21}'$, $R_{22}'$ | $R_{23}$, $R_{24}$ | $R_{23}'$, $R_{24}'$ | A |
|---|---|---|---|---|---|---|---|---|---|
| R-III-8 | Z-2 | —H | $—CH_3$ | —H | $—CH_3$ | $—CH_3$ | —H | —H | —H |
| R-III-9 | Z-2 | $—CH_3$ | $—CH_3$ | $—CH_3$ | —H | —H | $—CH_3$ | $—CH_3$ | —H |
| R-III-10 | Z-2 | $—CH_3$ | $—CH_3$ | $—CH_3$ | —H | —H | —H | —H | —H |
| R-III-11 | Z-2 | $—CH_3$ | —OH | $—CH_3$ | $—CH_3$ | $—CH_3$ | —H | —H | —H |
| R-III-12 | Z-2 | —H | —OH | $—CH_3$ | $—CH_3$ | $—CH_3$ | —H | —H | —H |

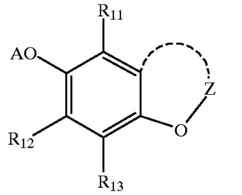

(Z-2)

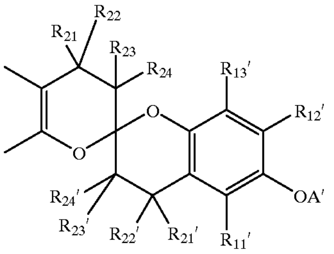

TABLE 26

| No. | Z | $R_{11}$ | $R_{12}$ | $R_{13}$ | $R_{21}$, $R_{22}$ | $R_{23}$, $R_{24}$ | $R_{25}$, $R_{26}$ | A |
|---|---|---|---|---|---|---|---|---|
| R-IV-1 | Z-3 | —H | —OH | $—CH_3$ | $—CH_3$ | —H | —H | —H |
| R-IV-2 | Z-3 | $—CH_3$ | $—CH_3$ | $—CH_3$ | $—CH_3$ | —H | —H | —H |

TABLE 26-continued

| No. | Z | $R_{11}$ | $R_{12}$ | $R_{13}$ | $R_{21}$, $R_{22}$ | $R_{23}$, $R_{24}$ | $R_{25}$, $R_{26}$ | A |
|---|---|---|---|---|---|---|---|---|

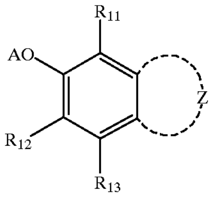

(Z-3)

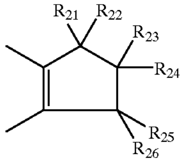

TABLE 27

| No. | Z | $R_{11}$, $R_{11}'$ | $R_{12}$, $R_{12}'$ | $R_{13}$, $R_{13}'$ | $R_{21}$, $R_{21}'$ | $R_{22}$, $R_{22}'$ | $R_{23}$, $R_{24}$ | $R_{23}'$, $R_{24}'$ | A |
|---|---|---|---|---|---|---|---|---|---|
| R-IV-3 | Z-4 | $-CH_3$ | —H | —H | $-CH_3$ | $-CH_3$ | —H | —H | —H |
| R-IV-4 | Z-4 | $-CH_3$ | $-CH_3$ | —H | $-CH_3$ | $-CH_3$ | —H | —H | —H |
| R-IV-5 | Z-4 | $-CH_3$ | —H | —H | $-C_2H_5$ | $-CH_3$ | —H | —H | —H |

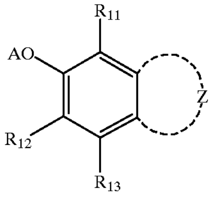

(Z-4)

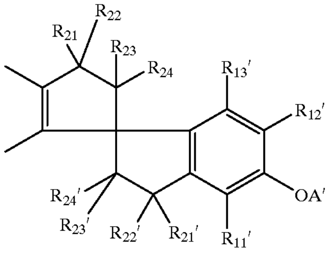

The reducing agent is preferably used in an amount of $1\times10^{-3}$ to 10 mol, more preferably $1\times10^{-2}$ to 1.5 mol per mol of silver.

Other Additives

In the material of the invention, mercapto and thion compounds may be added for the purposes of retarding or accelerating development to control development, improving spectral sensitization efficiency, and improving storage stability before and after development.

Where mercapto compounds are used herein, any structure is acceptable. Preferred is a structure represented by Ar—S—M wherein M is a hydrogen atom or alkali metal atom, and Ar is an aromatic ring or fused aromatic ring group having at least one nitrogen, sulfur, oxygen, selenium or tellurium atom. Preferred hetero-aromatic rings in these groups are benzimidazole, naphthimidazole, benzothiazole, naphthothiazole, benzoxazole, naphthoxazole, benzoselenazole, benzotellurazole, imidazole, oxazole, pyrrazole, triazole, thiadiazole, tetrazole, triazine, pyrimidine, pyridazine, pyrazine, pyridine, purine, quinoline and quinazolinone rings. These hetero-aromatic rings may have a substituent selected from the group consisting of halogen (e.g., Br and Cl), hydroxy, amino, carboxy, alkyl groups (having at least 1 carbon atom, preferably 1 to 4 carbon atoms), and alkoxy groups (having at least 1 carbon atom, preferably 1 to 4 carbon atoms). Illustrative, non-limiting examples of the mercapto-substituted hetero-aromatic compound include 2-mercaptobenzimidazole, 2-mercaptobenzoxazole, 2-mercaptobenzothiazole, 2-mercapto-5-methylbenzimidazole, 6-ethoxy-2-mercaptobenzothiazole, 2,2'-dithiobis(benzothiazole), 3-mercapto-1,2,4-triazole, 4,5-diphenyl-2-imidazolethiol, 2-mercaptoimidazole, 1-ethyl-2-mercaptobenzimidazole, 2-mercaptoquinoline, 8-mercaptopurine, 2-mercapto-4(3H)-quinazolinone, 7-trifluoromethyl-4-quinolinethiol, 2,3,5,6-tetrachloro-4-pyridinethiol, 4-amino-6-hydroxy-2-mercaptopyrimidine monohydrate, 2-amino-5-mercapto-1,3,4-thiadiazole, 3-amino-5-mercapto-1,2,4-triazole, 4-hydroxy-2-mercaptopyrimidine, 2-mercaptopyrimidine, 4,6-diamino-2-mercaptopyrimidine, 2-mercapto-4-methylpyrimidine hydrochloride, 3-mercapto-5-phenyl-1,2,4-triazole, and 2-mercapto-4-phenyloxazole.

These mercapto compounds are preferably added to the emulsion layer in amounts of $1\times10^{-4}$ to 1 mol, more preferably $1\times10^{-3}$ to 0.3 mol per mol of silver.

It is sometimes advantageous to use an additive known as a "toner" for improving images in addition to the above-mentioned components. The toner is used in an amount of 0.1 to 10% by weight of the entire silver-carrying components. The toners are compounds well known in the photographic art as described in U.S. Pat. Nos. 3,080,254, 3,847,612 and 4,123,282.

Exemplary toners include imides such as phthalimide and N-hydroxyphthalimide; cyclic imides such as succinimide, pyrazolin-5-one, quinazolinone, 3-phenyl-2-pyrazolin-5-one, 1-phenylurazol, quinazoline and 2,4-thiazolizinedione; naphthalimides such as N-hydroxy-1,8-naphthalimide; cobalt complexes such as cobalt hexamine trifluoroacetate; mercaptans such as 3-mercapto-1,2,4-triazole, 2,4-dimercaptopyrimidine, 3-mercapto-4,5-diphenyl-1,2,4-triazole and 2,5-dimercapto-1,3,4-thiadiazole; N-(aminomethyl)-aryldicarboxyimides such as N,N-(dimethylaminomethyl)-phthalimide and N,N-(dimethylaminomethyl)naphthalene-2,3-dicarboxyimide; a blocked pyrazole, an isothiuronium derivative and a certain photo-bleaching agent such as N,N'-hexamethylenebis(1-carbamoyl-3,5-dimethylpyrazole), 1,8-(3,6-diazaoctane)bis(isothiuroniumtrifluoroacetate) and 2-tribromomethylsulfonyl-benzothiazole; 3-ethyl-5-[(3-ethyl-2-benzothiazolinylidene)-1-methylethylidene]-2-thio-2,4-oxazolidinedione; phthalazinone, phthalazinone derivatives or metal salts thereof such as 4-(1-naphthyl)phthalazinone, 6-chlorophthalazinone, 5,7-dimethoxyphthalazinone and 2,3-dihydro-1,4-phthalazinedione; combinations of phthalazinones with phthalic acid derivatives (e.g., phthalic acid, 4-methylphthalic acid, 4-nitrophthalic acid and tetrachlorophthalic anhydride); phthalazine, phthalazine derivatives or metal salts such as 4-(1-naphthyl)phthalazine, 6-chlorophthalazine, 5-,7-dimethoxyphthalazine and 2,3-dihydrophthalazine; combinations of phthalazine with phthalic acid derivatives (e.g., phthalic acid, 4-methylphthalic acid, 4-nitrophthalic acid and tetrachlorophthalic anhydride); quinazolinedione, benzoxazine, and naphthoxazine derivatives; rhodium complexes which function not only as a toner, but also a halide ion source for forming silver halide in situ, for example, ammonium hexachlororhodate(III), rhodium bromide, rhodium nitrate and potassium hexachlororhodate(III); inorganic peroxides and persulfates such as ammonium peroxydisulfide and hydrogen peroxide; benzoxazine-2,4-diones such as 1,3-benzoxazine-2,4-dione, 8-methyl-1,3-benzoxazine-2,4-dione and 6-nitro-1,3-benzoxazine-2,4-dione; pyrimidine and asym-triazines such as 2,4-dihydroxypyrimidine and 2-hydroxy-4-aminopyrimidine; azauracil and tetraazapentalene derivatives such as 3,6-dimercapto-1,4-diphenyl-1H,4H-2,3a,5,6a-tetraazapentalene and 1,4-di(o-chlorophenyl)-3,6-dimercapto-1H,4H-2,3a,5,6a-tetraazapentalene.

The emulsion layer used herein is based on a binder. Exemplary binders are naturally occurring polymers and synthetic resins, for example, gelatin, polyvinyl acetal, polyvinyl chloride, polyvinyl acetate, cellulose acetate, polyolefins, polyesters, polystyrene, polyacrylonitrile, and polycarbonate. Of course, copolymers and terpolymers are included. Preferred polymers are polyvinyl butyral, butylethyl cellulose, methacrylate copolymers, maleic anhydride ester copolymers, polystyrene and butadiene-styrene copolymers. These polymers may be used alone or in admixture of two or more as desired. The polymer is used in such a range that it may effectively function as a binder to carry various components. The effective range may be properly determined by those skilled in the art without undue experimentation. Taken at least as a measure for carrying the organic silver salt in the film, the weight ratio of the binder to the organic silver salt is preferably in the range of from 15:1 to 1:2, more preferably from 8:1 to 1:1.

In the image-forming layer or emulsion layer used herein, a polymer latex preferably constitutes more than 50% by weight of the entire binder. This image forming layer is referred to as "inventive image-forming layer" and the polymer latex used as the binder therefor is referred to as "inventive polymer latex," hereinafter. The term "polymer latex" used herein is a dispersion of a microparticulate water-insoluble hydrophobic polymer in a water-soluble dispersing medium. With respect to the dispersed state, a polymer emulsified in a dispersing medium, an emulsion polymerized polymer, a micelle dispersion, and a polymer having a hydrophilic structure in a part of its molecule so that the molecular chain itself is dispersed on a molecular basis are included. With respect to the polymer latex, reference is made to Okuda and Inagaki Ed., "Synthetic Resin Emulsion," Kobunshi Kankokai, 1978; Sugimura, Kataoka, Suzuki and Kasahara Ed., "Application of Synthetic Latex," Kobunshi Kankokai, 1993; and Muroi, "Chemistry of Synthetic Latex," Kobunshi Kankokai, 1970. Dispersed particles should preferably have a mean particle size of about 1 to 50,000 nm, more preferably about 5 to 1,000 nm. No particular limit is imposed on the particle size distribution of dispersed particles, and the dispersion may have either a wide particle size distribution or a monodisperse particle size distribution.

The inventive polymer latex used herein may be either a latex of the conventional uniform structure or a latex of the so-called core/shell type. In the latter case, better results are sometimes obtained when the core and the shell have different glass transition temperatures.

The inventive polymer latex should preferably have a minimum film-forming temperature (MFT) of about –30° C. to 90° C., more preferably about 0° C. to 70° C. A film-forming aid may be added in order to control the minimum film-forming temperature. The film-forming aid is also referred to as a plasticizer and includes organic compounds (typically organic solvents) for lowering the minimum film-forming temperature of a polymer latex. It is described in Muroi, "Chemistry of Synthetic Latex," Kobunshi Kankokai, 1970.

Polymers used in the inventive polymer latex according to the invention include acrylic resins, vinyl acetate resins, polyester resins, polyurethane resins, rubbery resins, vinyl chloride resins, vinylidene chloride resins, polyolefin resins, and copolymers thereof. The polymer may be linear or branched or crosslinked. The polymer may be either a homopolymer or a copolymer having two or more monomers polymerized together. The copolymer may be either a random copolymer or a block copolymer. The polymer preferably has a number average molecule weight Mn of about 5,000 to about 1,000,000, more preferably about 10,000 to about 100,000. Polymers with a too lower molecular weight would generally provide a low film strength after coating whereas polymers with a too higher molecular weight are difficult to form films.

The polymer of the inventive polymer latex should preferably have an equilibrium moisture content at 25° C. and RH 60% of up to 2% by weight, more preferably up to 1% by weight. The lower limit of equilibrium moisture content is not critical although it is preferably 0.01% by weight, especially 0.03% by weight. With respect to the definition and measurement of equilibrium moisture content, reference should be made to "Polymer Engineering Series No. 14, Polymer Material Test Methods," Edited by Japanese Polymer Society, Chijin Shokan Publishing K.K., for example.

Illustrative examples of the polymer latex which can be used as the binder in the image-forming layer of the heat developable photographic material of the invention include latices of methyl methacrylate/ethyl acrylate/methacrylic acid copolymers, latices of methyl methacrylate/2-ethylhexyl acrylate/styrene/acrylic acid copolymers, latices of styrene/butadiene/acrylic acid copolymers, latices of styrene/butadiene/divinyl benzene/methacrylic acid copolymers, latices of methyl methacrylate/vinyl chloride/acrylic acid copolymers, and latices of vinylidene chloride/ethyl acrylate/acrylonitrile/methacrylic acid copolymers.

These polymers or polymer latices are commercially available. Exemplary acrylic resins are Sebian A-4635, 46583 and 4601 (Daicell Chemical Industry K.K.) and Nipol LX811, 814, 820, 821 and 857 (Nippon Zeon K.K.). Exemplary polyester resins are FINETEX ES650, 611, 675, and 850 (Dai-Nihon Ink Chemical K.K.) and WD-size and WMS (Eastman Chemical Products, Inc.). Exemplary polyurethane resins are HYDRAN AP10, 20, 30 and 40 (Dai-Nihon Ink Chemical K.K.). Exemplary rubbery resins are LACSTAR 7310K, 3307B, 4700H and 7132C (Dai-Nihon Ink Chemical K.K.) and Nipol LX416, 410, 438C and 2507 (Nippon Zeon K.K.). Exemplary vinyl chloride resins are G351 and G576 (Nippon Zeon K.K.). Exemplary vinylidene chloride resins are L502 and L513 (Asahi Chemicals K.K.). Exemplary olefin resins are Chemipearl S120 and SA100 (Mitsui Petro-Chemical K.K.). These polymers may be used alone or in admixture of two or more.

In the inventive image-forming layer, the polymer latex described above is preferably used in an amount of at least 50% by weight, especially at least 70% by weight, of the entire binder. In the inventive image-forming layer, a hydrophilic polymer may be added in an amount of less than 50% by weight of the entire binder. Such hydrophilic polymers are gelatin, polyvinyl alcohol, methyl cellulose, hydroxypropyl cellulose, carboxymethyl cellulose, and hydroxypropyl methyl cellulose. The amount of the hydrophilic polymer added is preferably less than 30% by weight of the entire binder in the image-forming layer.

The inventive image-forming layer is preferably formed by applying an aqueous coating solution followed by drying. By the term "aqueous", it is meant that water accounts for at least 30% by weight of the solvent or dispersing medium of the coating solution. The component other than water of the coating solution may be a water-miscible organic solvent such as methyl alcohol, ethyl alcohol, isopropyl alcohol, methyl cellosolve, ethyl cellosolve, dimethylformamide, and ethyl acetate. Exemplary solvent compositions include water, a 90/10 or 70/30 mixture of water/methanol, a 90/10 mixture of water/ethanol, a 90/10 mixture of water/isopropanol, a 95/5 mixture of water/dimethylformamide, a 80/15/5 or 90/5/5 mixture of water/methanol/dimethylformamide, all expressed in a weight ratio.

The method described in U.S. Pat. No. 5,496,695 is also useful.

In the inventive image-forming layer, the total amount of binder is preferably 0.2 to 30 $g/m^2$, more preferably 1 to 15 $g/m^2$ per layer. Crosslinking agents and other additives may be added to the inventive image-forming layer for crosslinking and other purposes.

A surface protective layer may be provided in the heat developable photographic material according to the present invention for the purpose of preventing adhesion of image-forming layers (emulsion layer, photosensitive layer, etc.). The surface protective layer may be formed of any adhesion-preventing material. Examples of the adhesion-preventing material include wax, silica particles, styrene-containing elastomeric block copolymers (e.g., styrene-butadiene-styrene and styrene-isoprene-styrene), cellulose acetate, cellulose acetate butyrate, cellulose propionate and mixtures thereof.

In the emulsion layer or a protective layer therefor according to the invention, there may be used light absorbing substances and filter dyes as described in U.S. Pat. Nos. 3,253,921, 2,274,782, 2,527,583, and 2,956,879. The dyes may be mordanted as described in U.S. Pat. No. 3,282,699.

In the emulsion layer or a protective layer therefor according to the invention, there may be used matte agents, for example, starch, titanium dioxide, zinc oxide, and silica as well as polymer beads including beads of the type described in U.S. Pat. Nos. 2,992,101 and 2,701,245. The emulsion surface may have any degree of matte insofar as no star dust failures occur although a Bekk smoothness of 1,000 to 10,000 seconds, especially 2,000 to 10,000 seconds is preferred.

With antifoggants, stabilizers and stabilizer precursors, the silver halide emulsion and/or organic silver salt according to the invention can be further protected against formation of additional fog and stabilized against lowering of sensitivity during shelf storage. Suitable antifoggants, stabilizers and stabilizer precursors which can be used alone or in combination include thiazonium salts as described in U.S. Pat. Nos. 2,131,038 and 2,694,716, azaindenes as described in U.S. Pat. Nos. 2,886,437 and 2,444,605, mercury salts as described in U.S. Pat. No. 2,728,663, urazoles as described in U.S. Pat. No. 3,287,135, sulfocatechols as described in U.S. Pat. No. 3,235,652, oximes, nitrons and nitroindazoles as described in UKP 623,448, polyvalent metal salts as described in U.S. Pat. No. 2,839,405, thiuronium salts as described in U.S. Pat. No. 3,220,839, palladium, platinum and gold salts as described in U.S. Pat. Nos. 2,566,263 and 2,597,915, halogen-substituted organic compounds as described in U.S. Pat. Nos. 4,108,665 and 4,442,202, triazines as described in U.S. Pat. Nos. 4,128,557, 4,137,079, 4,138,365 and 4,459,350, and phosphorus compounds as described in U.S. Pat. No. 4,411,985.

In the emulsion layer, polyhydric alcohols (e.g., glycerin and diols as described in U.S. Pat. No. 2,960,404), fatty acids and esters thereof as described in U.S. Pat. Nos. 2,588,765 and 3,121,060, and silicone resins as described in UKP 955,061 may be added as a plasticizer and lubricant.

According to the invention, a hardener may be used in various layers including a photosensitive layer, protective layer, and back layer. Examples of the hardener include polyisocyanates as described in U.S. Pat. No. 4,281,060 and JP-A 208193/1994, epoxy compounds as described in U.S. Pat. No. 4,791,042, and vinyl sulfones as described in JP-A 89048/1987.

A surfactant may be used for the purposes of improving coating and electric charging properties. The surfactants used herein may be nonionic, anionic, cationic and fluorinated ones. Examples include fluorinated polymer surfactants as described in JP-A 170950/1987 and U.S. Pat. No. 5,382,504, fluorinated surfactants as described in JP-A 244945/1985 and 188135/1988, polysiloxane surfactants as described in U.S. Pat. No. 3,885,965, and polyalkylene oxide and anionic surfactants as described in JP-A 301140/1994.

According to the invention, the heat developable photographic emulsion may be coated on a variety of supports. Typical supports include polyester film, subbed polyester film, poly(ethylene terephthalate) film, polyethylene naphthalate film, cellulose nitrate film, cellulose ester film, poly(vinyl acetal) film, polycarbonate film and related or resinous materials, as well as glass, paper, metals, etc. Often used are flexible substrates, typically paper supports, specifically baryta paper and paper supports coated with partially acetylated α-olefin polymers, especially polymers of α-olefins having 2 to 10 carbon atoms such as polyethylene, polypropylene, and ethylene-butene copolymers. The supports are either transparent or opaque, preferably transparent.

The photographic material of the invention may have an antistatic or electroconductive layer, for example, a layer containing soluble salts (e.g., chlorides and nitrates), an evaporated metal layer, or a layer containing ionic polymers as described in U.S. Pat. Nos. 2,861,056 and 3,206,312 or insoluble inorganic salts as described in U.S. Pat. No. 3,428,451.

A method for producing color images using the heat developable photographic material of the invention is as described in JP-A 13295/1995, page 10, left column, line 43 to page 11, left column, line 40. Stabilizers for color dye images are exemplified in UKP 1,326,889, U.S. Pat. Nos. 3,432,300, 3,698,909, 3,574,627, 3,573,050, 3,764,337, and 4,042,394.

In the practice of the invention, the heat developable photographic emulsion can be coated by various coating procedures including dip coating, air knife coating, flow coating, and extrusion coating using a hopper of the type described in U.S. Pat. No. 2,681,294. If desired, two or more layers may be concurrently coated by the methods described in U.S. Pat. No. 2,761,791 and UKP 837,095.

In the heat developable photographic material of the invention, there may be contained additional layers, for example, a dye accepting layer for accepting a mobile dye image, an opacifying layer when reflection printing is desired, a protective topcoat layer, and a primer layer well known in the photothermographic art. The photographic material of the invention is preferably such that only a single sheet of the material can form an image. That is, it is preferred that a functional layer necessary to form an image such as an image receiving layer does not constitute a separate member.

Vinylidene chloride polymers are often used in subbing and other layers in the photographic material of the invention. The vinylidene chloride polymers used herein are copolymers containing 50 to 99.9% by weight, preferably 70 to 99% by weight of vinylidene chloride. Examples are the copolymers of vinylidene chloride, an acrylate, and a vinylidene monomer having an alcohol on a side chain described in JP-A 135526/1976, the vinylidene chloride/alkyl acrylate/acrylic acid copolymers described in U.S. Pat. No. 2,852,378, the vinylidene chloride/acrylonitrile/itaconic acid copolymers descried in U.S. Pat. No. 2,698,235, and the vinylidene chloride/alkyl acrylate/itaconic acid copolymers descried in U.S. Pat. No. 3,788,856. Illustrative, non-limiting, examples of the vinylidene chloride copolymer are given below where the ratio of components is by weight.

vinylidene chloride/methyl acrylate/hydroxyethyl acrylate (83/12/5) copolymer vinylidene chloride/hydroxyethyl methacrylate/hydroxypropyl acrylate (82/10/8) copolymer vinylidene chloride/hydroxydiethyl methacrylate (92/8) copolymer vinylidene chloride/butyl acrylate/acrylic acid (94/4/2) copolymer vinylidene chloride/butyl acrylate/itaconic acid (75/20/5) copolymer vinylidene chloride/methyl acrylate/itaconic acid (90/8/2) copolymer vinylidene chloride/itaconic acid monoethyl ester (96/4) copolymer vinylidene chloride/acrylonitrile/acrylic acid (96/3.5/1.5) copolymer vinylidene chloride/methyl acrylate/acrylic acid (92/5/3) copolymer vinylidene chloride/methyl acrylate/3-chloro-2-hydroxypropyl acrylate (84/9/7) copolymer vinylidene chloride/methyl acrylate/N-ethanol acrylamide (85/10/5) copolymer In the practice of the invention, the vinylidene chloride copolymer may be coated, for example, by dissolving the polymer in a suitable organic solvent or dispersing the polymer in water and applying the solution by well-known techniques such as dip coating, air knife coating, curtain coating, roller coating, wire bar coating, and gravure coating. An extrusion coating technique using the hopper described in U.S. Pat. No. 2,681,294 is useful. Also useful are another extrusion coating technique involving casting a molten polymer to a moving support whereby the polymer is joined to the support by cooling and concurrent pressure application, and a laminating technique involving preforming a polymer into a film and joining the film to a support with glue and heat.

In one preferred embodiment, the heat developable photographic material of the invention is a one-side photosensitive material having at least one photosensitive (or emulsion) layer containing a silver halide emulsion as an image-forming layer on one side and a back (or backing) layer on the other side of the support.

In the practice of the invention, a matte agent may be added to the photographic material for improving feed efficiency. The matte agents used herein are generally microparticulate water-insoluble organic or inorganic compounds. There may be used any desired one of matte agents, for example, well-known matte agents including organic matte agents as described in U.S. Pat. Nos. 1,939,213, 2,701,245, 2,322,037, 3,262,782, 3,539,344, and 3,767,448 and inorganic matte agents as described in U.S. Pat. Nos. 1,260,772, 2,192,241, 3,257,206, 3,370,951, 3,523,022, and 3,769,020. Illustrative examples of the organic compound which can be used as the matte agent are given below; exemplary water-dispersible vinyl polymers include polymethyl acrylate, polymethyl methacrylate, polyacrylonitrile, acrylonitrile-α-methylstyrene copolymers, polystyrene, styrene-divinylbenzene copolymers, polyvinyl acetate, polyethylene carbonate, and polytetrafluoroethylene; exemplary cellulose derivatives include methyl cellulose, cellulose acetate, and cellulose acetate propionate; exemplary starch derivatives include carboxystarch, carboxynitrophenyl starch, ureaformaldehyde-starch reaction products, gelatin hardened with well-known curing agents, and hardened gelatin which has been coaceruvation hardened into microcapsulated hollow particles. Preferred examples of the inorganic compound which can be used as the matte agent include silicon dioxide, titanium dioxide, magnesium dioxide, aluminum oxide, barium sulfate, calcium carbonate, silver chloride and silver bromide desensitized by a well-known method, glass, and diatomaceous earth. The aforementioned matte agents may be used as a mixture of substances of different types if necessary. The size and shape of the matte agent are not critical. The matte agent of any particle size may be used although matte agents having a particle size of 0.1 μm to 30 μm are preferably used in the practice of the invention. The particle size distribution of the matte agent may be either narrow or wide. Nevertheless, since the haze and surface luster of coatings are largely affected by the matte agent, it is preferred to adjust the particle size, shape and particle size distribution of a matte agent as desired during preparation of the matte agent or by mixing plural matte agents.

In the practice of the invention, the back layer should preferably have a degree of matte as expressed by a Bekk smoothness of 10 to 250 seconds, more preferably 50 to 180 seconds.

In the photographic material of the invention, the matte agent is preferably contained in an outermost surface layer, a layer functioning as an outermost surface layer, a layer close to the outer surface or a layer functioning as a so-called protective layer.

In the practice of the invention, the binder used in the back layer is preferably transparent or translucent and generally colorless. Exemplary binders are naturally occurring polymers, synthetic resins, polymers and copolymers, and other film-forming media, for example, gelatin, gum arabic, poly(vinyl alcohol), hydroxyethyl cellulose, cellulose acetate, cellulose acetate butyrate, poly(vinyl pyrrolidone), casein, starch, poly(acrylic acid), poly(methyl methacrylate), polyvinyl chloride, poly(methacrylic acid), copoly(styrene-maleic anhydride), copoly(styrene-acrylonitrile), copoly(styrene-butadiene), polyvinyl acetals (e.g., polyvinyl formal and polyvinyl butyral), polyesters, polyurethanes, phenoxy resins, poly(vinylidene chloride), polyepoxides, polycarbonates, poly(vinyl acetate), cellulose esters, and polyamides. The binder may be dispersed in water, organic solvent or emulsion to form a dispersion which is coated to form a layer.

The back layer preferably serves as an antihalation layer which exhibits a maximum absorbance of 0.3 to 2 in the predetermined wavelength range, and more preferably an optical density of 0.5 to 2.

Where anti-halation dyes are used in the practice of the invention, such a dye may be any compound which has desired absorption in the predetermined wavelength range, has sufficiently low absorption outside that range and provides the backing layer with a preferred absorbance spectrum profile. Exemplary anti-halation dyes are the compounds described in JP-A 13295/1995, U.S. Pat. No. 5,380,635, JP-A 68539/1990, page 13, lower-left column to page 14, lower-left column, and JP-A 24539/1991, page 14, lower-left column to page 16, lower-right column though not limited thereto.

A backside resistive heating layer as described in U.S. Pat. Nos. 4,460,681 and 4,374,921 may be used in a thermographic imaging system according to the present invention.

The photothermographic material according to the preferred embodiment of the invention may be developed by any desired method although it is generally developed by heating after imagewise exposure. The preferred developing temperature is about 80 to 250° C., more preferably 100 to 140° C. and the preferred developing time is about 1 to 180 seconds, more preferably about 10 to 90 seconds.

Any desired technique may be used for forming latent images in the thermographic photosensitive material. The preferred light source for exposure is a laser, for example, a gas laser, YAG laser, dye laser, and semiconductor laser. A semiconductor laser combined with a second harmonic generating device is also useful.

Where the heat developable photographic material of the invention does not contain the photosensitive silver halide, latent images can be formed by heating. Heating may be effected by various ways, for example, by direct heating using a thermal head. Indirect heating is also possible if a substance (e.g., a dyestuff or pigment) capable of absorbing radiation of a specific wavelength and converting it into heat is incorporated in the photographic material. The light source used in this embodiment is preferably a laser as mentioned above. A combination of these techniques is possible. Where a latent image is formed by heating, the process may involve two stages, a first stage of heating to form a latent image and a second stage of heating to form an image. A single stage of heating can complete image formation.

EXAMPLE

Examples of the present invention are given below by way of illustration and not by way of limitation.

Various addenda used in Examples have the following structures.

Sensitizing Dye A

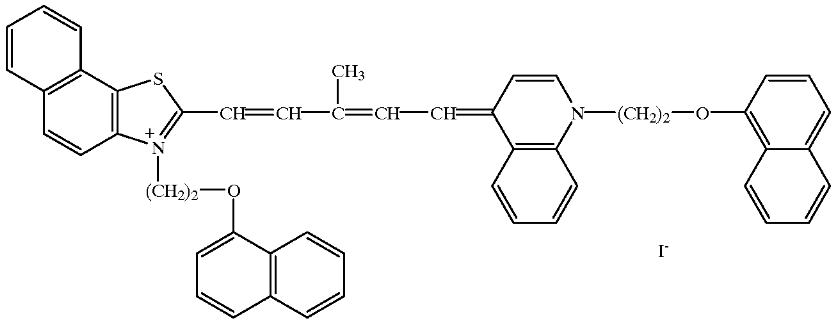

(C-1)

$CaBr_2 \cdot 2H_2O$ (C-2)

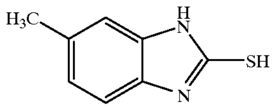

(C-3)

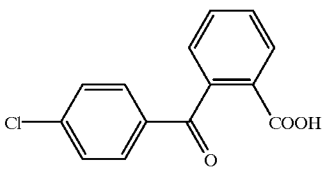

-continued
(C-4)
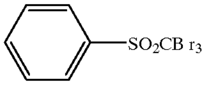
(C-5)
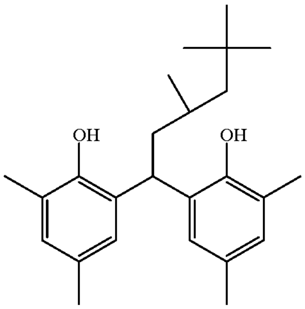
(C-6)
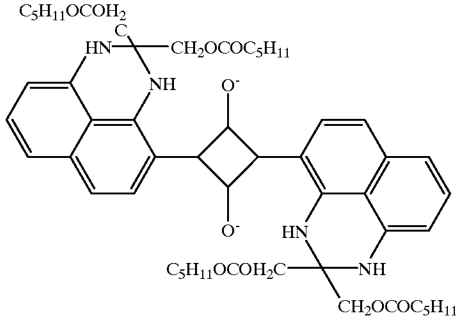
(C-7)
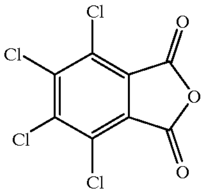
(C-8)
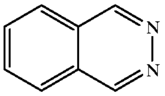
(C-9)
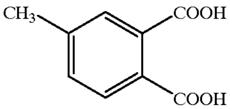
(C-10)
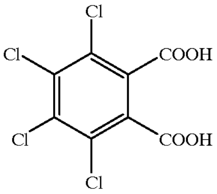

Sensitizing Dye B

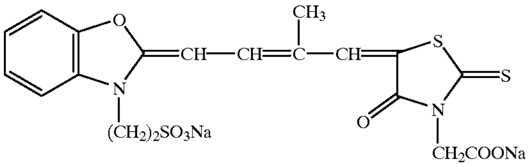

Tellurium Compound 1

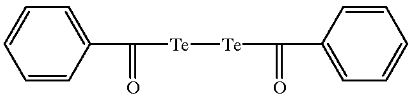

Surfactant A

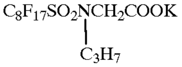

Surfactant B

Compound 1

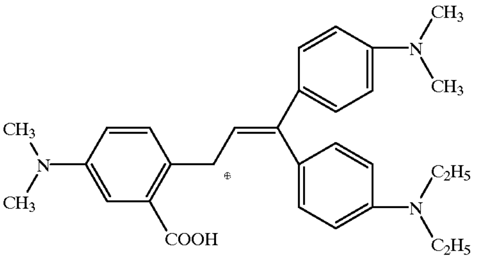

Compound 2

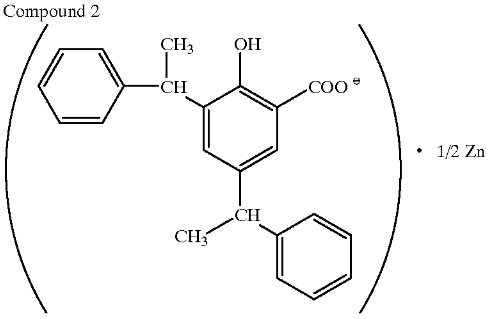

Additive A

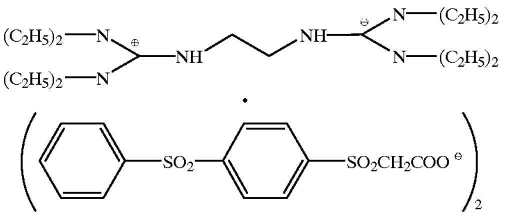

HA-01

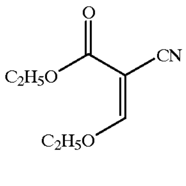

-continued

HA-02

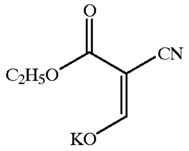

HA-03

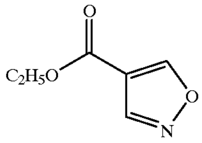

HA-04

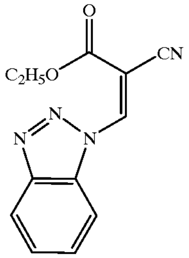

The trade names used in Examples have the following meaning.

BUTVAR B-76: polyvinyl butyral by Monsanto Co.

Denka Butyral: polyvinyl butyral by Denki Kagaku Kogyo K.K.

CAB 171-15S and 381-20: cellulose acetate butyrate by Eastman Chemical Products, Inc.

LACSTAR 3307B: styrene-butadiene copolymer latex

Megafax F-176P: fluorinated surfactant by Dai-Nihon Ink Chemical Industry K.K.

Sildex: spherical silica by Dokai Chemical K.K.

Sumidur N3500: polyisocyanate by Sumitomo-Bayern Urethane K.K.

Example 1

Silver Halide Grains A

In 900 ml of water were dissolved 7.5 grams of inert gelatin and 10 mg of potassium bromide. The solution was adjusted to pH 3.0 at a temperature of 35° C. To the solution, 370 ml of an aqueous solution containing 74 grams of silver nitrate and an aqueous solution containing potassium bromide and potassium iodide in a molar ratio of 94:6 and $K_3[IrCl_6]$ were added over 10 minutes by the controlled double jet method while maintaining the solution at pAg 7.7. Note that $[IrCl_6]^{3-}$ was added in an amount of $3\times10^{-7}$ mol/mol of silver. Thereafter, 0.3 gram of 4-hydroxy-6-methyl-1,3,3a,7-tetraazaindene was added to the solution, which was adjusted to pH 5 with NaOH. There were obtained cubic silver iodobromide grains A having a mean grain size of 0.06 $\mu$m, a coefficient of variation of the projected area of 8%, and a {100} face ratio of 87%. The emulsion was desalted by adding a gelatin flocculant thereto to cause flocculation and sedimentation, and then adjusted to pH 5.9 and pAg 7.5 by adding 0.1 gram of phenoxyethanol.

Organic Acid Silver Emulsion A

A mixture of 10.6 grams of behenic acid and 300 ml of distilled water was mixed for 15 minutes at 90° C. With vigorous stirring, 31.1 ml of 1N sodium hydroxide was added over 15 minutes to the solution, which was allowed to stand at the temperature for one hour. The solution was then cooled to 30° C., 7 ml of 1N phosphoric acid was added thereto, and with more vigorous stirring, 0.13 gram of N-bromosuccinimide was added. Thereafter, with stirring, the above-prepared silver halide grains A were added to the solution in such an amount as to give 1.25 mmol of silver halide. Further, 25 ml of 1N silver nitrate aqueous solution was continuously added over 2 minutes, with stirring continued for a further 90 minutes. With stirring, 37 grams of a 1.2 wt % butyl acetate solution of polyvinyl acetate was slowly added to the aqueous mixture to form flocs in the dispersion. Water was removed, and water washing and water removal were repeated twice. With stirring, 20 grams of a solution of 2.5% by weight polyvinyl butyral (Denka Butyral #3000-K) in a ½ solvent mixture of butyl acetate and isopropyl alcohol was added. To the thus obtained gel-like mixture of organic acid and silver halide, 7.8 grams of polyvinyl butyral (Denka Butyral #4000-2) and 57 grams of 2-butanone were added. The mixture was dispersed by a homogenizer, obtaining a silver behenate emulsion of needle grains having a mean minor diameter of 0.06 μm, a mean major diameter of 1 μm and a coefficient of variation of 30%.

Emulsion Layer Coating Solution A

Various chemicals were added to the above-prepared organic acid silver salt emulsion in amounts per mol of silver. With stirring at 25° C., 25 mg of sodium phenylthiosulfonate, 25 mg of sodium phenylsulfinate, 1.0 gram of (C-1), 0.65 gram of Sensitizing Dye A, 2.1 grams of (C-2), 14.2 grams of (C-3), 580 grams of 2-butanone, 220 grams of dimethylformamide, and 32 grams of methanol were added to the emulsion, which was allowed to stand for 3 hours. With stirring, there were further added 14.1 grams of (C-4), 125 grams of (C-5), 3.0 grams of (C-6), an amount of a hydrazine derivative and an amount of a compound of formula (1), the type and amount (mol/mol Ag) of which are identified in Table 28, 1.1 grams of Megafax F-176P surfactant and 3.7 grams of Sumidur N3500 polyisocyanate.

Emulsion Surface Protective Layer Coating Solution

A coating solution was prepared by dissolving 45 grams of CAB 171-15S cellulose acetate butyrate, 1520 grams of 2-butanone, 10 grams of ethyl acetate, 50 grams of dimethylformamide, 1.4 grams of (C-7), 11.6 grams of (C-8), 5.4 grams of (C-9), 4.0 grams of (C-10), 0.43 gram of Megafax F-176P surfactant, 1.2 grams of Sildex H31 spherical silica (mean particle size 3 μm), and 0.42 gram of Sumidur N3500 polyisocyanate in 4.2 grams of ethyl acetate.

Back Layer Coating Solution

A back layer coating solution was prepared by adding 6 grams of Denka Butyral #4000-2 polyvinyl butyral, 0.2 gram of Sildex H121 spherical silica (mean particle size 12 μm), 0.2 gram of Sildex H51 spherical silica (mean particle size 5 μm), 0.1 gram of Megafax F-176P surfactant to 64 grams of propanol and stirring the mixture for dissolving the components. A solution of 420 mg of (C-6) in a mixture of 10 grams of methanol and 20 grams of acetone and a solution of 0.8 gram of Sumidur N3500 polyisocyanate in 6 grams of ethyl acetate were further added, completing the back layer coating solution.

Coated Sample

Onto one surface of a polyethylene terephthalate film having a moisture-proof subbing layer of vinylidene chloride on each surface, the back layer coating solution prepared above was coated so as to provide an optical density of 0.7 at 780 nm. The emulsion layer coating solution was then coated on the opposite surface of the support so as to provide a coverage of 1.6 $g/m^2$ of silver. Further, the emulsion surface protective layer coating solution was coated onto the emulsion layer to a dry thickness of 1.8 μm.

Photographic Prolerty Test

The photographic material samples prepared above were exposed to xenon flash light for an emission time of $10^{-4}$ sec through an interference filter having a peak at 780 nm and a step wedge and heated for development at 115° C., 117° C. or 120° C. for 25 seconds on a heat drum. The resulting images were determined for density by a densitometer. The following factors were determined.

(1) Dmin: minimum density (2) $S_{1.5}$: $-\log(1/E_{1.5})$ wherein $E_{1.5}$ is an exposure necessary to provide a density of 1.5. It is expressed in a relative value based on 100 for sample No. 103.

(3) $\Delta S_{1.5}$: difference in sensitivity between development at 115° C. and development at 120° C., ΔlogE (4) G0330: $G0330=(3.0-0.3)/(S_{3.0}-S_{0.3})$ wherein $S_{3.0}$ is $-\log(1/E_{3.0})$ wherein $E_{3.0}$ is an exposure necessary to provide a density of 3.0 and $S_{0.3}$ is $-\log(1/E_{0.3})$ wherein $E_{0.3}$ is an exposure necessary to provide a density of 3.0.

The results are shown in Table 28.

TABLE 28

Results of Example 1

| Sample No. | Hydrazine Derivative Type | Hydrazine Derivative Amount | Formula (1) compound Type | Formula (1) compound Amount | Dmin @ 120° C. | $S_{1.5}$ @ 117° C. | G0330 @ 117° C. | $\Delta S_{1.5}$ 120–115° C. |
|---|---|---|---|---|---|---|---|---|
| 101* | 54a | $2.0 \times 10^{-3}$ | — | — | 0.19 | 57 | 13 | 0.81 |
| 102* | 54a | $3.0 \times 10^{-3}$ | — | — | 0.29 | 82 | 16 | 0.83 |
| 103* | 54a | $4.0 \times 10^{-3}$ | — | — | 0.65 | 100 | 16 | 0.97 |
| 104 | 54a | $4.0 \times 10^{-3}$ | 1-2 | $1.3 \times 10^{-2}$ | 0.12 | 95 | 18 | 0.39 |
| 105 | 54a | $4.0 \times 10^{-3}$ | 1-17 | $1.3 \times 10^{-2}$ | 0.10 | 93 | 20 | 0.31 |
| 106 | 54a | $4.0 \times 10^{-3}$ | 1-20 | $1.3 \times 10^{-2}$ | 0.12 | 98 | 19 | 0.36 |
| 107 | 54a | $4.0 \times 10^{-3}$ | 1-43 | $1.3 \times 10^{-2}$ | 0.14 | 100 | 16 | 0.45 |
| 108 | 54a | $4.0 \times 10^{-3}$ | 1-44 | $1.3 \times 10^{-2}$ | 0.16 | 89 | 16 | 0.51 |
| 109* | 56a | $3.2 \times 10^{-3}$ | — | — | 0.54 | 100 | 19 | 0.82 |
| 110 | 56a | $3.2 \times 10^{-3}$ | 1-2 | $1.3 \times 10^{-2}$ | 0.11 | 95 | 18 | 0.43 |
| 111 | 56a | $3.2 \times 10^{-3}$ | 1-5 | $1.3 \times 10^{-2}$ | 0.12 | 95 | 19 | 0.35 |
| 112 | 56a | $3.2 \times 10^{-3}$ | 1-9 | $1.3 \times 10^{-2}$ | 0.11 | 93 | 21 | 0.32 |
| 113 | 56a | $3.2 \times 10^{-3}$ | 1-37 | $1.3 \times 10^{-2}$ | 0.10 | 91 | 19 | 0.32 |
| 114 | 56a | $3.2 \times 10^{-3}$ | 1-42 | $1.3 \times 10^{-2}$ | 0.12 | 98 | 20 | 0.44 |
| 115 | 56a | $3.2 \times 10^{-3}$ | 1-44 | $5.0 \times 10^{-3}$ | 0.10 | 98 | 20 | 0.37 |
| 116 | 56a | $3.2 \times 10^{-3}$ | 1-47 | $1.3 \times 10^{-2}$ | 0.15 | 91 | 19 | 0.53 |
| 117* | 96-1 | $1.2 \times 10^{-2}$ | — | — | 0.73 | 100 | 14 | 0.76 |
| 118 | 96-1 | $1.2 \times 10^{-2}$ | 1-2 | $1.3 \times 10^{-2}$ | 0.13 | 93 | 17 | 0.35 |
| 119 | 96-1 | $1.2 \times 10^{-2}$ | 1-3 | $1.3 \times 10^{-2}$ | 0.11 | 89 | 16 | 0.34 |
| 120 | 96-1 | $1.2 \times 10^{-2}$ | 1-5 | $1.3 \times 10^{-2}$ | 0.10 | 95 | 18 | 0.32 |

TABLE 28-continued

Results of Example 1

| Sample No. | Hydrazine Derivative Type | Hydrazine Derivative Amount | Formula (1) compound Type | Formula (1) compound Amount | Dmin @ 120° C. | $S_{1.5}$ @ 117° C. | G0330 @ 117° C. | $\Delta S_{1.5}$ 120–115° C. |
|---|---|---|---|---|---|---|---|---|
| 121 | 96-1 | $1.2 \times 10^{-2}$ | 1-20 | $1.3 \times 10^{-2}$ | 0.11 | 91 | 17 | 0.36 |
| 122 | 96-1 | $1.2 \times 10^{-2}$ | 1-44 | $1.3 \times 10^{-2}$ | 0.15 | 91 | 16 | 0.42 |
| 123 | 96-1 | $1.2 \times 10^{-2}$ | 1-47 | $1.3 \times 10^{-2}$ | 0.16 | 91 | 17 | 0.50 |

*Comparison
The addition amount is expressed in mol per mol of silver.

It is evident that the comparative samples receive more fog through high temperature development and undergo substantial sensitivity changes by development temperature changes. In contrast, the inventive samples show reduced fog, least affected sensitivity, increased gamma, and minimized sensitivity variation by temperature changes. Inter alia, sample Nos. 104–106, 110–115 and 118–121 are significantly improved in these respects and offer more favorable photographic processed properties.

Example 2

Silver Halide Grains B

In 700 ml of water were dissolved 22 grams of phthalated gelatin and 30 mg of potassium bromide. The solution was adjusted to pH 5.0 at a temperature of 40° C. To the solution, 159 ml of an aqueous solution containing 18.6 grams of silver nitrate and an aqueous solution containing potassium bromide were added over 10 minutes by the controlled double jet method while maintaining the solution at pAg 7.7. Then, an aqueous solution containing $8\times10^{-6}$ mol/liter of $K_3[IrCl_6]$ and 1 mol/liter of potassium bromide was added over 30 minutes by the controlled double jet method while maintaining the solution at pAg 7.7. The solution was then adjusted to pH 5.9 and pAg 8.0. There were obtained cubic grains having a mean grain size of 0.07 μm, a coefficient of variation of the projected area diameter of 8%, and a (100) face proportion of 86%.

The thus obtained silver halide grains B were heated at 60° C., to which $8.5\times10^{-5}$ mol of sodium thiosulfate, $1.1\times10^{-5}$ mol of 2,3,4,5,6-pentafluorophenyldiphenylsulfin selenide, $2\times10^{-6}$ mol of Tellurium Compound 1, $3.3\times10^{-6}$ mol of chloroauric acid, and $2.3\times10^{-4}$ mol of thiocyanic acid were added per mol of silver. The solution was ripened for 120 minutes. After the temperature was lowered to 50° C., with stirring, $8\times10^{-4}$ mol of Sensitizing Dye B was added and $3.5\times10^{-2}$ mol of potassium iodide was then added. After 30 minutes of agitation, the solution was quenched to 30° C., completing the preparation of a silver halide emulsion.

Organic Acid Silver Microcrystalline Dispersion

A mixture of 40 grams of behenic acid, 7.3 grams of stearic acid, and 500 ml of distilled water was stirred for 15 minutes at 90° C. With vigorous stirring, 187 ml of 1N NaOH was added over 15 minutes, and 61 ml of an aqueous solution of 1N nitric acid was added to the solution which was cooled to 50° C. Then 124 ml of an aqueous solution of 1N silver nitrate was added to the solution which was continually agitated for 30 minutes. Thereafter, the solids were separated by suction filtration and washed with water until the water filtrate reached a conductivity of 30 μS/cm. The thus obtained solids were handled as a wet cake without drying. To 34.8 grams as dry solids of the wet cake were added 12 grams of polyvinyl alcohol and 150 ml of water. They were thoroughly mixed to form a slurry. A vessel was charged with the slurry together with 840 grams of zirconia beads having a mean diameter of 0.5 mm. A dispersing machine (1/4G Sand Grinder Mill by Imex K.K.) was operated for 5 hours for dispersion, completing the preparation of a microcrystalline dispersion of organic acid silver grains having a volume weighed mean grain diameter of 1.5 μm as measured by Master Sizer X (Malvern Instruments Ltd.).

Solid Particle Dispersions of Chemical Addenda

Solid particle dispersions of tetrachlorophthalic acid, 4-methylphthalic acid, 1,1-bis(2-hydroxy-3,5-dimethylphenyl)-3,5,5-trimethylhexane, phthalazine, and tribromomethylphenylsulfone were prepared.

To tetrachlorophthalic acid were added 0.81 gram of hydroxypropylmethyl cellulose and 94.2 ml of water. They were thoroughly agitated to form a slurry, which was allowed to stand for 10 hours. A vessel was charged with the slurry together with 100 ml of zirconia beads having a mean diameter of 0.5 mm. A dispersing machine as above was operated for 5 hours for dispersion, obtaining a solid particle dispersion of tetrachlorophthalic acid in which particles with a diameter of up to 1.0 μm accounted for 70% by weight. Solid particle dispersions of the remaining chemical addenda were similarly prepared by properly changing the amount of dispersant and the dispersion time to achieve a desired mean particle size.

Emulsion Layer Coating Solution

An emulsion layer coating solution was prepared by adding the following components to the organic acid silver microcrystalline dispersion.

| | |
|---|---|
| Organic acid silver microcrystalline dispersion | 1 mol |
| Silver halide grains B | 0.05 mol |
| Binder: LACSTAR 3307B SBR latex | 430 g |
| Addenda for development | |
| Tetrachlorophthalic acid | 5 g |
| 1,1-bis(2-hydroxy-3,5-dimethylphenyl)-3,5,5-trimethylhexane | 98 g |
| Phthalazine | 9.2 g |
| Tribromomethylphenylsulfone | 12 g |
| 4-methylphthalic acid | 7 g |
| Hydrazine derivative (type and amount in Table 29) | |
| Formula (1) compound (type and amount in Table 29) | |

It is noted that the amounts of hydrazine derivative and formula (1) compound added are expressed in mol per mol of silver; and that LACSTAR 3307B is a styrene-butadiene rubber (SBR) latex commercially available from Dai-Nihon Ink Chemical Industry K.K. wherein the polymer has an equilibrium moisture content of 0.6 wt % at 25° C. and RH 60% and the dispersed particles have a mean particle diameter of 0.1 to 0.15 μm.

Emulsion Surface Protective Layer Coating Solution

A surface protective layer coating solution was prepared by mixing the following components with inert gelatin.

| | |
|---|---|
| Inert gelatin | 10 g |
| Surfactant A | 0.26 g |
| Surfactant B | 0.09 g |
| Silica particles (mean particle size 2.5 μm) | 0.9 g |
| 1,2-bis(vinylsulfonylacetamido) ethane | 0.3 g |
| Water | 64 g |

Color Developinc Agent Dispersion A

To 35 grams of ethyl acetate were added 2.5 grams of Compound 1 and 7.5 grams of Compound 2. The mixture was agitated for dissolution. The solution was combined with 50 grams of a 10 wt % polyvinyl alcohol solution and agitated for 5 minutes by means of a homogenizer. Thereafter, the ethyl acetate was volatilized off for solvent removal purpose. Dilution with water yielded a color developing agent dispersion.

Back Surface Coating Solution

A back surface coating solution was prepared by adding the following components to polyvinyl alcohol.

| | |
|---|---|
| Polyvinyl alcohol | 30 g |
| Color developing agent dispersion A | 50 g |
| Additive A | 20 g |
| Water | 250 g |
| Sildex H121 silica (mean size 12 μm) | 1.8 g |

Coated Samples

The emulsion layer coating solution prepared above was coated onto a polyethylene terephthalate support so as to give a silver coverage of 1.6 g/m$^2$. The emulsion surface protective layer coating solution was then coated onto the emulsion coating so as to give a gelatin coverage of 1.8 g/m$^2$. After drying, the back surface coating solution was coated onto the surface of the support opposite to the emulsion layer so as to give an optical density of 0.7 at 660 nm.

Photographic Property Test

The photographic material samples prepared above were exposed to xenon flash light for an emission time of $10^{-4}$ sec through an interference filter having a peak at 656 nm and a step wedge before they were heat developed and examined as in Example 1.

The results are shown in Table 29.

TABLE 29

Results of Example 2

| Sample No. | Hydrazine Derivative Type | Hydrazine Derivative Amount | Formula (1) compound Type | Formula (1) compound Amount | Dmin @ 120° C. | $S_{1.5}$ @ 117° C. | G0330 @ 117° C. | $\Delta S_{1.5}$ 120–115° C. |
|---|---|---|---|---|---|---|---|---|
| 201* | 54m | $4.2 \times 10^{-3}$ | — | — | 0.88 | 100 | 12 | 0.81 |
| 202 | 54m | $4.2 \times 10^{-3}$ | 1-3 | $1.7 \times 10^{-2}$ | 0.12 | 93 | 17 | 0.35 |
| 203 | 54m | $4.2 \times 10^{-3}$ | 1-10 | $1.7 \times 10^{-2}$ | 0.10 | 91 | 19 | 0.33 |
| 204 | 54m | $4.2 \times 10^{-3}$ | 1-15 | $8.0 \times 10^{-3}$ | 0.12 | 93 | 19 | 0.35 |
| 205 | 54m | $4.2 \times 10^{-3}$ | 1-20 | $1.7 \times 10^{-2}$ | 0.14 | 95 | 14 | 0.45 |
| 206 | 54m | $4.2 \times 10^{-3}$ | 1-40 | $1.7 \times 10^{-2}$ | 0.16 | 95 | 20 | 0.38 |
| 207* | 56a | $3.5 \times 10^{-3}$ | — | — | 0.67 | 100 | 14 | 0.82 |
| 208 | 56a | $3.5 \times 10^{-3}$ | 1-2 | $1.7 \times 10^{-2}$ | 0.13 | 95 | 17 | 0.38 |
| 209 | 56a | $3.5 \times 10^{-3}$ | 1-10 | $1.7 \times 10^{-2}$ | 0.12 | 95 | 18 | 0.38 |
| 210 | 56a | $3.5 \times 10^{-3}$ | 1-13 | $1.7 \times 10^{-2}$ | 0.11 | 93 | 18 | 0.34 |
| 211 | 56a | $3.5 \times 10^{-3}$ | 1-19 | $1.7 \times 10^{-2}$ | 0.13 | 91 | 19 | 0.38 |
| 212 | 56a | $3.5 \times 10^{-3}$ | 1-23 | $1.7 \times 10^{-2}$ | 0.11 | 91 | 20 | 0.33 |
| 213 | 56a | $3.5 \times 10^{-3}$ | 1-42 | $8.0 \times 10^{-3}$ | 0.12 | 93 | 20 | 0.37 |
| 214 | 56a | $3.5 \times 10^{-3}$ | 1-48 | $1.7 \times 10^{-2}$ | 0.12 | 91 | 19 | 0.35 |
| 215* | 96-1 | $1.6 \times 10^{-2}$ | — | — | 0.78 | 100 | 13 | 0.85 |
| 216 | 96-1 | $1.6 \times 10^{-2}$ | 1-4 | $1.7 \times 10^{-2}$ | 0.12 | 95 | 17 | 0.36 |
| 217 | 96-1 | $1.6 \times 10^{-2}$ | 1-19 | $1.7 \times 10^{-2}$ | 0.13 | 95 | 16 | 0.35 |
| 218 | 96-1 | $1.6 \times 10^{-2}$ | 1-22 | $1.7 \times 10^{-2}$ | 0.11 | 93 | 18 | 0.32 |
| 219 | 96-1 | $1.6 \times 10^{-2}$ | 1-29 | $1.7 \times 10^{-2}$ | 0.13 | 95 | 16 | 0.39 |
| 220 | 96-1 | $1.6 \times 10^{-2}$ | 1-31 | $1.7 \times 10^{-2}$ | 0.19 | 98 | 14 | 0.46 |
| 221 | 96-1 | $1.6 \times 10^{-2}$ | 1-43 | $1.7 \times 10^{-2}$ | 0.22 | 98 | 13 | 0.57 |

*Comparison

The addition amount is expressed in mol per mol of silver.

It is evident that the inventive samples offer favorable photographic processed properties.

Example 3

Several samples selected from the samples prepared in Examples 1 and 2 were exposed under conditions as described in Examples 1 and 2 and complying with the respective color sensitivity so as to give the criteria shown in Table 30, heat developed at 117° C. for 20 or 30 seconds, and measured for density. A differential sensitivity ($\Delta S_{1.5}$) between 20-sec development and 30-sec development was determined. The results are shown in Table 30.

TABLE 30

Results of Example 3

| Sample No. | $\Delta S_{1.5}$ | Remarks |
|---|---|---|
| 104 | 0.61 | Comparison |
| 105 | 0.32 | Invention |
| 109 | 0.55 | Comparison |
| 112 | 0.30 | Invention |
| 115 | 0.35 | Invention |
| 117 | 0.53 | Comparison |
| 120 | 0.25 | Invention |
| 122 | 0.38 | Invention |
| 201 | 0.66 | Comparison |

TABLE 30-continued

Results of Example 3

| Sample No. | $\Delta S_{1.5}$ | Remarks |
|---|---|---|
| 203 | 9.34 | Invention |
| 206 | 0.37 | Invention |
| 215 | 0.71 | Comparison |
| 218 | 0.35 | Invention |

It is evident that as compared with the comparative samples, the inventive samples are reduced in sensitivity change by changes of development time. Inter alia, sample Nos. 105, 112, 120, 203, 206 and 218 are significantly low in sensitivity change and offer more favorable photographic properties.

Example 4

Samples were prepared as in Example 1 except that instead of the hydrazine derivative, Compound HA-01, HA-02, HA-03 or HA-04 was used in an amount of $8\times10^{-3}$ mol per mol of silver. Those samples having the compound of formula (1) added exhibited good results as in Example 1.

Example 5

Samples were prepared as in Example 2 except that instead of the hydrazine derivative, Compound HA-01, HA-02, HA-03 or HA-04 was used in an amount of $1.6\times10^{-2}$ mol per mol of silver. Those samples having the compound of formula (1) added exhibited good results as in Example 2.

Example 6

Silver Halide Drains A

In 900 ml of water were dissolved 7.5 grams of inert gelatin and 10 mg of potassium bromide. The solution was adjusted to pH 3.0 at a temperature of 35° C. To the solution, 370 ml of an aqueous solution containing 74 grams of silver nitrate and an aqueous solution containing potassium bromide and potassium iodide in a molar ratio of 94:6 and $K_3[IrCl_6]$ were added over 10 minutes by the controlled double jet method while maintaining the solution at pAg 7.7. Note that $[IrCl_6]^{3-}$ was added in an amount of $3\times10^{-7}$ mol/mol of silver. Thereafter, 0.3 gram of 4-hydroxy-6-methyl-1,3,3a,7-tetraazaindene was added to the solution, which was adjusted to pH 5 with NaOH. There were obtained cubic silver iodobromide grains A having a mean grain size of 0.06 μm, a coefficient of variation of the projected area of 8%, and a {100} face ratio of 87%. The emulsion was desalted by adding a gelatin flocculent thereto to cause flocculation and sedimentation, and then adjusted to pH 5.9 and pAg 7.5 by adding 0.1 gram of phenoxyethanol.

Organic Acid Silver Emulsion A

A mixture of 10.6 grams of behenic acid and 300 ml of distilled water was mixed for 15 minutes at 90° C. With vigorous stirring, 31.1 ml of 1N sodium hydroxide was added over 15 minutes to the solution, which was allowed to stand at the temperature for one hour. The solution was then cooled to 30° C., 7 ml of 1N phosphoric acid was added thereto, and with more vigorous stirring, 0.13 gram of N-bromosuccinimide was added. Thereafter, with stirring, the above-prepared silver halide grains A were added to the solution in such an amount as to give 1.25 mmol of silver halide. Further, 25 ml of 1N silver nitrate aqueous solution was continuously added over 2 minutes, with stirring continued for a further 90 minutes. With stirring, 37 grams of a 1.2 wt % butyl acetate solution of polyvinyl acetate was slowly added to the aqueous mixture to form flocs in the dispersion. Water was removed, and water washing and water removal were repeated twice. With stirring, 20 grams of a solution of 2.5% by weight polyvinyl butyral (Denka Butyral #3000-K) in a ½ solvent mixture of butyl acetate and isopropyl alcohol was added. To the thus obtained gel-like mixture of organic acid and silver halide, 7.8 grams of polyvinyl butyral (Denka Butyral #4000-2) and 57 grams of 2-butanone were added. The mixture was dispersed by a homogenizer, obtaining a silver behenate emulsion of needle grains having a mean minor diameter of 0.06 μm, a mean major diameter of 1 μm and a coefficient of variation of 30%.

Emulsion Layer Coating Solution A

Various chemicals were added to the above-prepared organic acid silver salt emulsion in amounts per mol of silver. With stirring at 25° C., 1.0 gram of (C-1), 0.65 gram of Sensitizing Dye A, 2.1 grams of (C-2), 14.2 grams of (C-3), 580 grams of 2-butanone, 220 grams of dimethylformamide, and 32 grams of methanol were added to the emulsion, which was allowed to stand for 3 hours. With stirring, there were further added 10.5 grams of (C-4), 125 grams of (C-5), 0.86 gram of a hydrazine derivative (Compound 54a), 0.67 gram of (C-6), an amount of a compound of formula (2), the type and amount (mol/mol Ag) of which are identified in Table 31, 1.1 grams of Megafax F-176P surfactant and 3.7 grams of Sumidur N3500 polyisocyanate.

Emulsion Surface Protective Layer Coating Solution

A coating solution was prepared by dissolving 45 grams of CAB 171-15S cellulose acetate butyrate, 1520 grams of 2-butanone, 10 grams of ethyl acetate, 50 grams of dimethylformamide, 1.4 grams of (C-7), 11.6 grams of (C-8), 5.4 grams of (C-9), 4.0 grams of (C-10), an amount of a compound of formula (2), the type and amount (mol/mol Ag) of which are identified in Table 31, 0.43 gram of Megafax F-176P surfactant, 1.2 grams of Sildex H31 spherical silica (mean particle size 3 μm), and 0.42 gram of Sumidur N3500 polyisocyanate in 4.2 grams of ethyl acetate.

Back Layer Coating Solution

A back layer coating solution was prepared by adding 6 grams of Denka Butyral #4000-2 polyvinyl butyral, 0.2 gram of Sildex H121 spherical silica (mean particle size 12 μm), 0.2 gram of Sildex H 51 spherical silica (mean particle size 5 μm), 0.1 gram of Megafax F-176P surfactant to 64 grams of propanol and stirring the mixture for dissolving the components. A solution of 420 mg of (C-6) in a mixture of 10 grams of methanol and 20 grams of acetone and a solution of 0.8 gram of Sumidur N3500 polyisocyanate in 6 grams of ethyl acetate were further added, completing the back layer coating solution.

Coated Sample

Onto one surface of a polyethylene terephthalate film having a moisture-proof subbing layer of vinylidene chloride on each surface, the back layer coating solution prepared above was coated so as to provide an optical density of 0.7 at 780 nm. The emulsion layer coating solution was then coated on the opposite surface of the support so as to provide a coverage of 1.6 $g/m^2$ of silver. Further, the emulsion surface protective layer coating solution was coated onto the emulsion layer to a dry thickness of 1.8 μm.

Photographic Property Test

The photographic material samples prepared above were exposed to xenon flash light for an emission time of $10^{-4}$ sec through an interference filter having a peak at 780 nm and a step wedge and heated for development at 115° C., 117° C. or 120° C. for 20 seconds on a heat drum. The resulting images were determined for density by a densitometer. The following factors were determined.

(1) Dmin: minimum density (2) $S_{1.5}$: $-\log(1/E_{1.5})$ wherein $E_{1.5}$ is an exposure necessary to provide a density of 1.5. It is expressed in a relative value based on 100 for sample No. 301.

(3) $\Delta S_{1.5}$: difference in sensitivity between development at 115° C. and development at 120° C., ΔlogE (4) G0330 (gradation, γ): G0330=(3.0−0.3)/(S3.0−$S_{0.3}$) wherein, $S_{3.0}$ is −log(1/$E_{3.0}$) wherein $E_{3.0}$ is an exposure necessary to provide a density of 3.0 and $S_{0.3}$ is −log(1/$E_{0.3}$) wherein $E_{0.3}$ is an exposure necessary to provide a density of 3.0.

The results are shown in Table 31.

TABLE 31

Results of Example 6

| Sample No. | Formula (2) compound Layer added | Type | Amount | Dmin @120° C. | S1.5 @117° C. | G0330 @117° C. | ΔS1.5 120–115° C. |
|---|---|---|---|---|---|---|---|
| 301* | — | — | — | 0.75 | 100 | 9 | 1.23 |
| 302* | EM | T-4 | $1.0 \times 10^{-4}$ | 0.55 | 95 | 12 | 0.83 |
| 303 | EM | T-4 | $2.0 \times 10^{-4}$ | 0.15 | 89 | 15 | 0.37 |
| 304 | EM | T-4 | $5.0 \times 10^{-4}$ | 0.12 | 74 | 17 | 0.33 |
| 305 | EM | T-4 | $1.0 \times 10^{-3}$ | 0.10 | 56 | 18 | 0.33 |
| 306* | EM | T-20 | $1.0 \times 10^{-4}$ | 0.36 | 98 | 12 | 0.88 |
| 307 | EM | T-20 | $2.0 \times 10^{-4}$ | 0.12 | 91 | 15 | 0.41 |
| 308 | EM | T-20 | $4.0 \times 10^{-4}$ | 0.10 | 79 | 18 | 0.32 |
| 309 | EM | T-20 | $8.0 \times 10^{-4}$ | 0.10 | 70 | 18 | 0.24 |
| 310* | EM | T-32 | $1.0 \times 10^{-4}$ | 0.56 | 98 | 13 | 1.00 |
| 311 | EM | T-32 | $2.0 \times 10^{-4}$ | 0.11 | 95 | 16 | 0.37 |
| 312 | EM | T-32 | $4.0 \times 10^{-4}$ | 0.10 | 91 | 18 | 0.33 |
| 313 | EM | T-32 | $8.0 \times 10^{-4}$ | 0.10 | 85 | 17 | 0.30 |
| 314* | PC | T-4 | $1.0 \times 10^{-4}$ | 0.65 | 100 | 11 | 1.03 |
| 315 | PC | T-4 | $3.0 \times 10^{-4}$ | 0.13 | 95 | 14 | 0.45 |
| 316 | PC | T-4 | $1.0 \times 10^{-3}$ | 0.10 | 89 | 18 | 0.36 |
| 317 | PC | T-4 | $2.0 \times 10^{-3}$ | 0.10 | 78 | 18 | 0.35 |
| 318* | PC | T-20 | $1.0 \times 10^{-4}$ | 0.68 | 100 | 11 | 0.93 |
| 319 | PC | T-20 | $3.0 \times 10^{-4}$ | 0.10 | 98 | 17 | 0.32 |
| 320 | PC | T-20 | $1.0 \times 10^{-3}$ | 0.10 | 91 | 18 | 0.30 |
| 321* | PC | T-32 | $1.0 \times 10^{-4}$ | 0.59 | 98 | 13 | 0.96 |
| 322 | PC | T-32 | $3.0 \times 10^{-4}$ | 0.10 | 91 | 18 | 0.35 |
| 323 | PC | T-32 | $1.0 \times 10^{-3}$ | 0.10 | 87 | 16 | 0.32 |

*Comparison
Note:
The compound of formula (2) was added to the emulsion layer (EM) or the emulsion protective layer (PC) in an amount expressed in mol per mol of silver.

It is evident that comparative sample No. 301 exhibits more fog, low gamma and substantial sensitivity changes by development temperature changes. Comparative sample Nos. 302, 306 and 310 are still insufficient in fog reduction and show a wide range of sensitivity variation. In contrast, the inventive samples show reduced fog and a narrow range of sensitivity variation by development temperature changes. Those inventive samples having the compound of formula (2) added to the emulsion protective layer show the least influence on sensitivity and provide better properties, as compared with those inventive samples having the compound of formula (2) added to the emulsion layer.

Example 7

Samples were prepared as in Example 6 except that the hydrazine derivative was replaced by the previously exemplified Compounds 54r, 56a, 96-1 and 37p. The inventive samples exhibited good results.

Example 8

Silver Halide Grains B

In 700 ml of water were dissolved 22 grams of iphthalated gelatin and 30 mg of potassium bromide. The solution was adjusted to pH 5.0 at a temperature of 40° C. To the solution, 159 ml of an aqueous solution containing 18.6 grams of silver nitrate and an aqueous solution containing potassium bromide were added over 10 minutes by the controlled double jet method while maintaining the solution at pAg 7.7. Then, an aqueous solution containing $8\times10^{-6}$ mol/liter of $K_3[IrCl_6]$ and 1 mol/liter of potassium bromide was added over 30 minutes by the controlled double jet method while maintaining the solution at pAg 7.7. The solution was then adjusted to pH 5.9 and pAg 8.0. There were obtained cubic grains having a mean grain size of 0.07 μm, a coefficient of variation of the projected area diameter of 8%, and a (100) face proportion of 86%.

The thus obtained silver halide grains B were heated at 60° C., to which $8.5\times10^{-5}$ mol of sodium thiosulfate, $1.1\times10^{-5}$ mol of 2,3,4,5,6-pentafluorophenylphenylsulfin selenide selenide, $2\times10^{-6}$ mol of Tellurium Compound 1, $3.3\times10^{-6}$ mol of chloroauric acid, and $2.3\times10^{-4}$ mol of thiocyanic acid were added per mol of silver. The solution was ripened for 120 minutes. After the temperature was lowered to 50° C., with stirring, $8\times10^{-4}$ mol of Sensitizing Dye B was added and $3.5\times10^{-2}$ mol of potassium iodide was then added. After 30 minutes of agitation, the solution was quenched to 30° C., completing the preparation of a silver halide emulsion.

Organic Acid Silver Microcrystalline Dispersion

A mixture of 40 grams of behenic acid, 7.3 grams of stearic acid, and 500 ml of distilled water was stirred for 15 minutes at 90° C. With vigorous stirring, 187 ml of 1N NaOH was added over 15 minutes, and 61 ml of an aqueous solution of 1N nitric acid was added to the solution which was cooled to 50° C. Then 124 ml of an aqueous solution of 1N silver nitrate was added to the solution which was continually agitated for 30 minutes. Thereafter, the solids were separated by suction filtration and washed with water until the water filtrate reached a conductivity of 30 μS/cm. The thus obtained solids were handled as a wet cake without drying. To 34.8 grams as dry solids of the wet cake were added 12 grams of polyvinyl alcohol and 150 ml of water. They were thoroughly mixed to form a slurry. A vessel was charged with the slurry together with 840 grams of zirconia beads having a mean diameter of 0.5 mm. A dispersing machine (1/4G Sand Grinder Mill by Imex K.K.) was operated for 5 hours for dispersion, completing the preparation of a microcrystalline dispersion of organic acid silver grains having a volume weighed mean grain diameter of 1.5 μm as measured by Master Sizer X (Malvern Instruments Ltd.).

Solid Particle Dispersions of Chemical Addenda

Solid particle dispersions of tetrachlorophthalic acid, 4-methylphthalic acid, 1,1-bis(2-hydroxy-3,5-dimethylphenyl)- 3,5,5-trimethylhexane, phthalazine, and tribromomethylphenylsulfone were prepared.

To tetrachlorophthalic acid were added 0.81 gram of hydroxypropyl cellulose and 94.2 ml of water. They were thoroughly agitated to form a slurry, which was allowed to stand for 10 hours. A vessel was charged with the slurry together with 100 ml of zirconia beads having a mean diameter of 0.5 mm. A dispersing machine as above was operated for 5 hours for dispersion, obtaining a solid particle dispersion of tetrachlorophthalic acid in which particles with a diameter of up to 1.0 μm accounted for 70% by weight. Solid particle dispersions of the remaining chemical addenda were similarly prepared by properly changing the amount of dispersant and the dispersion time to achieve a desired mean particle size.

Emulsion Layer Coating Solution

An emulsion layer coating solution was prepared by adding the following components to the organic acid silver microcrystalline dispersion.

| | | |
|---|---|---|
| Organic acid silver microcrystalline dispersion | 1 | mol |
| Silver halide grains B | 0.05 | mol of Ag |
| Binder: LACSTAR 3307B SBR latex | 430 | g |
| Addenda for development | | |
| Tetrachlorophthalic acid | 5 | g |
| 1,1-bis(2-hydroxy-3,5-dimethylphenyl)-3,5,5-trimethylhexane | 98 | g |
| Phthalazine | 9.2 | g |
| Tribromomethylphenylsulfone | 12 | g |
| 4-methylphthalic acid | 7 | g |
| Hydrazine derivative (Compound 54a) | 1.5 | g |
| Formula (2) compound (type and amount in Table 32) | | |

It is noted that the amount of formula (2) compound added is expressed in mol per mol of silver; and that LACSTAR 3307B is a styrene-butadiene rubber (SBR) latex commercially available from Dai-Nihon Ink Chemical Industry K.K. wherein the polymer has an equilibrium moisture content of 0.6 wt % at 25° C. and RH 60% and the dispersed particles have a mean particle diameter of 0.1 to 0.15 μm.

Emulsion Surface Protective Layer Coating Solution

A surface protective layer coating solution was prepared by mixing the following components with inert gelatin.

| | |
|---|---|
| Inert gelatin | 10 g |
| Surfactant A | 0.26 g |
| Surfactant B | 0.09 g |
| Silica particles (mean particle size 2.5 μm) | 0.9 g |
| 1,2-bis(vinylsulfonylacetamido)ethane | 0.3 g |
| Water | 64 g |
| Formula (2) compound (type and amount in Table 32) | |

Color Developing Agent Disersion A

To 35 grams of ethyl acetate were added 2.5 grams of Compound 1 and 7.5 grams of Compound 2. The mixture was aagitated for dissolution. The solution was combined with 50 grams of a 10 wt% polyvinyl alcohol solution and agitated for 5 minutes by means of a homogenizer. Thereafter, the ethyl acetate was volatilized off for solvent removal purpose. Dilution with water yielded a color developing agent dispersion.

Back Surface Coating Solution

A back surface coating solution was prepared by adding the following components to polyvinyl alcohol.

| | |
|---|---|
| Polyvinyl alcohol | 30 g |
| Color developing agent dispersion | 50 g |
| Additive A | 20 g |
| Water | 250 g |
| Sildex H121 silica (mean size 12 μm) | 1.8 g |

Coated Samples

The emulsion layer coating solution prepared above was coated onto a polyethylene terephthalate support so as to give a silver coverage of 1.6 $g/m^2$. The emulsion surface protective layer coating solution was then coated onto the emulsion coating so as to give a gelatin coverage of 1.8 $g/m^2$. After drying, the back surface coating solution was coated onto the surface of the support opposite to the emulsion layer so as to give an optical density of 0.7 at 660 nm.

Photoaraphic Property Test

The photographic material samples prepared above were exposed to xenon flash light for an emission time of $10^{-4}$ sec through an interference filter having a peak at 656 nm and a step wedge before they were heat developed and examined as in Example 6.

The results are shown in Table 32 together with the temperature condition of heat development.

TABLE 32

Results of Example 8

| Sample No. | Formula (2) compound Layer added | Type | Amount | Dmin @120° C. | S1.5 @117° C. | G0330 @117° C. | ΔS1.5 120–115° C. |
|---|---|---|---|---|---|---|---|
| 401* | — | — | — | 1.27 | 100 | 7 | 1.66 |
| 402* | EM | T-6 | $1.0 \times 10^{-4}$ | 1.06 | 93 | 11 | 1.37 |
| 403 | EM | T-6 | $2.0 \times 10^{-4}$ | 0.23 | 87 | 13 | 0.42 |
| 404 | EM | T-6 | $5.0 \times 10^{-4}$ | 015 | 79 | 14 | 0.36 |
| 405 | EM | T-6 | $1.0 \times 10^{-3}$ | 0.12 | 54 | 17 | 0.34 |
| 406* | EM | T-21 | $1.0 \times 10^{-4}$ | 0.95 | 95 | 10 | 1.11 |
| 407 | EM | T-21 | $2.0 \times 10^{-4}$ | 0.23 | 91 | 13 | 0.39 |
| 408 | EM | T-21 | $4.0 \times 10^{-4}$ | 0.15 | 76 | 16 | 0.33 |
| 409 | EM | T-21 | $8.0 \times 10^{-4}$ | 0.10 | 59 | 16 | 0.31 |

TABLE 32-continued

Results of Example 8

| Sample No. | Formula (2) compound Layer added | Type | Amount | Dmin @120° C. | S1.5 @117° C. | G0330 @117° C. | ΔS1.5 120–115° C. |
|---|---|---|---|---|---|---|---|
| 410 | EM | T-35 | $2.0 \times 10^{-4}$ | 0.25 | 95 | 14 | 0.40 |
| 411 | EM | T-35 | $4.0 \times 10^{-4}$ | 0.12 | 93 | 15 | 0.35 |
| 412 | EM | T-35 | $8.0 \times 10^{-4}$ | 0.10 | 87 | 17 | 0.33 |
| 413* | PC | T-4 | $1.0 \times 10^{-4}$ | 1.05 | 100 | 9 | 1.25 |
| 414 | PC | T-4 | $3.0 \times 10^{-4}$ | 0.44 | 93 | 15 | 0.51 |
| 415 | PC | T-4 | $1.0 \times 10^{-3}$ | 0.16 | 79 | 16 | 0.36 |
| 416 | PC | T-4 | $2.0 \times 10^{-3}$ | 0.13 | 63 | 18 | 0.32 |
| 417* | PC | T-20 | $1.0 \times 10^{-4}$ | 1.02 | 98 | 10 | 1.17 |
| 418 | PC | T-20 | $3.0 \times 10^{-4}$ | 0.38 | 91 | 14 | 0.48 |
| 419 | PC | T-20 | $1.0 \times 10^{-3}$ | 0.12 | 83 | 18 | 0.35 |
| 420* | PC | T-32 | $1.0 \times 10^{-4}$ | 0.96 | 95 | 10 | 1.22 |
| 421 | PC | T-32 | $3.0 \times 10^{-4}$ | 0.36 | 93 | 13 | 0.45 |
| 422 | PC | T-32 | $1.0 \times 10^{-3}$ | 0.14 | 87 | 16 | 0.33 |

*Comparison

Note:

The compound of formula (2) was added to the emulsion layer (EM) or the emulsion protective layer (PC) in an amount expressed in mol per mol of silver.

Like Example 6, the inventive samples of this example offer favorable photographic processed properties.

Example 9

Samples were prepared as in Example 8 except that the hydrazine derivative was replaced by the previously exemplified Compounds 54r, 56a, 96-1 and 37p. The inventive samples exhibited good results.

Example 10

Samples were prepared as in Example 6 except that instead of the hydrazine derivative, Compound HA-01, HA-02, HA-03 or HA-04 was used in an amount twice the molar amount of the hydrazine derivative. Those samples having the compound of formula (2) added exhibited good results as in Example 6.

Example 11

Samples were prepared as in Example 8 except that instead of the hydrazine derivative, Compound HA-01, HA-02, HA-03 or HA-04 was used in an amount twice the molar amount of the hydrazine derivative. Those samples having the compound of formula (2) added exhibited good results as in Example 8.

There has been described a heat developable photographic material, especially a photothermographic material, which has a ultrahigh contrast, undergoes minimal variation of photographic properties against varying development temperatures, can form a stable image, and is thus suitable as printing plates.

Japanese Patent Application No. 84221/1997 is incorporated herein by reference.

Reasonable modifications and variations are possible from the foregoing disclosure without departing from either the spirit or scope of the present invention as defined by the claims.

What is claimed is:

1. A heat developable photographic material comprising a reducible silver salt, a reducing agent, a contrast enhancer, a binder, and at least one compound selected from thiosulfonic acid ester compounds of the following formula (1) and thiosulfonic acid compounds of the following formula (2):

$$R^1—S—SO_2—R^2 \quad (1)$$

wherein each of $R^1$ and $R^2$ is an aliphatic hydrocarbon group, aryl group, alkoxycarbonyl group, aryloxycarbonyl group or heterocyclic group, $$Z^1—SO_2SM^1 \quad (2)$$

wherein $Z^1$ is an aliphatic hydrocarbon group, aryl group or heterocyclic group, and $M^1$ is a cation, with the proviso that the thiosulfonic acid compound of formula (2) is contained in an amount of 0.2 mmol to 200 mmol per mol of silver.

2. The heat developable photographic material of claim 1 containing at least one thiosulfonic acid ester compound of the formula (1).

3. The heat developable photographic material of claim 1 containing at least one thiosulfonic acid compound of the formula (2) in an amount of 0.2 mmol to 200 mmol per mol of silver.

4. The heat developable photographic material of claim 1 wherein in formula (1), at least one of $R^1$ and $R^2$ is a heterocyclic group.

5. The heat developable photographic material of claim 4 wherein in formula (1), $R^1$ is a heterocyclic group.

6. The heat developable photographic material of claim 1 further comprising a photosensitive silver halide as a photocatalyst.

7. The heat developable photographic material of claim 6, wherein the silver halide has a grain size of 0.20 μm or less.

8. The heat developable photographic material of claim 6, wherein the silver halide is selected from the group consisting of silver chloride, silver chlorobromide, silver bromide, silver iodobromide, silver iodochlorobromide, and silver iodide.

9. The heat developable photographic material of claim 1, wherein the contrast enhancer is selected from the group consisting of hydrazine compounds, compounds containing a quaternary nitrogen atom, acrylonitrile compounds, hetero-substituted acrylonitrile compounds, malondialdehyde compounds and isoxazole compounds.

10. The heat developable photographic material of claim 1, wherein the reducible silver salt is a silver salt of an organic acid.

11. The heat developable photograph material of claim 1, wherein the reducible silver salt contains a mercapto, thion or imino group.

12. The heat developable photographic material of claim 1, further comprising mercapto and/or thion compounds.

13. The heat developable photographic material of claim 1, further comprising a toner.

* * * * *